(12) United States Patent
Kawakami et al.

(10) Patent No.: US 8,722,904 B2
(45) Date of Patent: May 13, 2014

(54) ANTHRACENE DERIVATIVE, LIGHT-EMITTING DEVICE AND ELECTRONIC APPLIANCE

(75) Inventors: Sachiko Kawakami, Kanagawa (JP); Tsunenori Suzuki, Kanagawa (JP); Nobuharu Ohsawa, Kanagawa (JP); Satoko Shitagaki, Kanagawa (JP); Satoshi Seo, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 801 days.

(21) Appl. No.: 12/414,801

(22) Filed: Mar. 31, 2009

(65) Prior Publication Data

US 2009/0253916 A1 Oct. 8, 2009

(30) Foreign Application Priority Data

Apr. 2, 2008 (JP) ................................ 2008-095796
May 16, 2008 (JP) ................................ 2008-129410

(51) Int. Cl.
*C07D 209/82* (2006.01)
*B32B 9/00* (2006.01)
*H01J 1/62* (2006.01)

(52) U.S. Cl.
USPC ........... 548/440; 548/427; 428/690; 428/917; 313/504; 313/506; 257/40

(58) Field of Classification Search
USPC .................. 548/416, 427, 440; 428/690, 917; 313/504, 506; 257/40
See application file for complete search history.

(56) References Cited

U.S. PATENT DOCUMENTS

| | | | |
|---|---|---|---|
| 5,811,834 A | 9/1998 | Tamano et al. | |
| 6,143,201 A | 11/2000 | Mano | |
| 6,815,094 B2 | 11/2004 | Lee et al. | |
| 7,674,914 B2 * | 3/2010 | Egawa et al. ................ | 548/427 |
| 7,723,722 B2 | 5/2010 | Kawakami et al. | |
| 7,732,064 B2 * | 6/2010 | Kawakami et al. ........... | 428/690 |
| 7,842,945 B2 * | 11/2010 | Egawa et al. .................... | 257/40 |
| 7,879,464 B2 * | 2/2011 | Kawakami et al. ........... | 428/690 |
| 7,880,019 B2 * | 2/2011 | Egawa et al. ................ | 548/439 |
| 8,039,122 B2 | 10/2011 | Kawakami et al. | |
| 8,231,942 B2 | 7/2012 | Shitagaki et al. | |
| 8,298,683 B2 | 10/2012 | Kim et al. | |
| 2004/0146746 A1 | 7/2004 | Lee et al. | |
| 2004/0161632 A1 | 8/2004 | Seo et al. | |
| 2005/0095455 A1 | 5/2005 | Nomura et al. | |
| 2005/0116633 A1 | 6/2005 | Yamazaki et al. | |
| 2005/0214565 A1 | 9/2005 | Ikeda et al. | |
| 2005/0244670 A1 | 11/2005 | Saitoh et al. | |
| 2006/0068221 A1 | 3/2006 | Saitoh et al. | |
| 2006/0292394 A1 | 12/2006 | Iwaki et al. | |
| 2007/0049778 A1 | 3/2007 | Nomura et al. | |
| 2007/0059556 A1 | 3/2007 | Kim et al. | |
| 2007/0075632 A1 | 4/2007 | Kawakami et al. | |
| 2007/0152572 A1 | 7/2007 | Kawakami et al. | |
| 2007/0205412 A1 | 9/2007 | Bae et al. | |
| 2008/0017853 A1 | 1/2008 | Egawa et al. | |
| 2008/0107918 A1 | 5/2008 | Egawa et al. | |
| 2008/0114178 A1 | 5/2008 | Kawakami et al. | |
| 2008/0122344 A1 | 5/2008 | Shin et al. | |
| 2008/0268284 A1 | 10/2008 | Kawakami et al. | |
| 2008/0286445 A1 | 11/2008 | Suzuki et al. | |
| 2009/0004506 A1 | 1/2009 | Nomura et al. | |
| 2009/0058278 A1 | 3/2009 | Ushikubo et al. | |
| 2009/0085479 A1 | 4/2009 | Ushikubo | |
| 2009/0102366 A1 | 4/2009 | Ushikubo et al. | |
| 2009/0146139 A1 | 6/2009 | Stoessel et al. | |
| 2009/0174321 A1 | 7/2009 | Osaka et al. | |
| 2009/0247795 A1 | 10/2009 | Kawakami | |
| 2009/0267497 A1 | 10/2009 | Kawakami et al. | |
| 2009/0267498 A1 | 10/2009 | Kawakami et al. | |
| 2010/0019663 A1 | 1/2010 | Shin et al. | |
| 2012/0288620 A1 | 11/2012 | Shitagaki et al. | |

FOREIGN PATENT DOCUMENTS

| | | |
|---|---|---|
| EP | 0 786 926 A2 | 7/1997 |
| EP | 1 496 041 A1 | 1/2005 |
| EP | 1 695 952 A1 | 8/2006 |
| EP | 2 031 036 A1 | 3/2009 |
| EP | 2 051 310 A1 | 4/2009 |
| EP | 2 316 905 A1 | 5/2011 |
| EP | 2 316 906 A2 | 5/2011 |
| JP | 61-296085 | 12/1986 |
| JP | 1-204991 | 8/1989 |
| JP | 6-330035 | 11/1994 |
| JP | 11-193378 | 7/1999 |
| JP | 2003-146951 | 5/2003 |
| JP | 2004-95850 | 3/2004 |
| JP | 2006-41103 | 2/2006 |
| JP | 2007-15933 | 1/2007 |
| JP | 2009-76450 | 4/2009 |
| JP | 2009-99966 | 5/2009 |
| JP | 2009-299049 | 12/2009 |
| JP | 2012-522041 | 9/2012 |
| WO | WO 2004/020388 A1 | 3/2004 |

(Continued)

OTHER PUBLICATIONS

Kim et al (2007): STN International HCAPLUS database, (Columbus, Ohio), Accession No. 2007:286997.*
European Search Report re application No. EP 09004366.2, dated Mar. 16, 2010.

*Primary Examiner* — Golam M M Shameem

(74) *Attorney, Agent, or Firm* — Husch Blackwell LLP

(57) ABSTRACT

A novel anthracene derivative with a large energy gap is provided. An anthracene derivative represented by General Formula (G1) below is provided. In the formula, $Ar^1$ and $Ar^2$ independently represent an aryl group with 6 to 13 carbon atoms in a ring, $R^1$ and $R^2$ independently represent any of hydrogen, an alkyl group with 1 to 4 carbon atoms, or an aryl group with 6 to 13 carbon atoms in a ring, and each of $Ar^1$, $Ar^2$, $R^1$, and $R^2$ may have a substituent and the two substituents may be bonded to each other to form a ring.

10 Claims, 41 Drawing Sheets

(56) References Cited

FOREIGN PATENT DOCUMENTS

| WO | WO 2004/020548 A1 | 3/2004 |
| WO | WO 2004/075603 A2 | 9/2004 |
| WO | WO 2004/075604 A2 | 9/2004 |
| WO | WO 2007/061181 A1 | 5/2007 |
| WO | WO 2007/102683 A1 | 9/2007 |
| WO | WO 2007/110129 A1 | 10/2007 |
| WO | WO 2010/114253 A2 | 10/2010 |

* cited by examiner

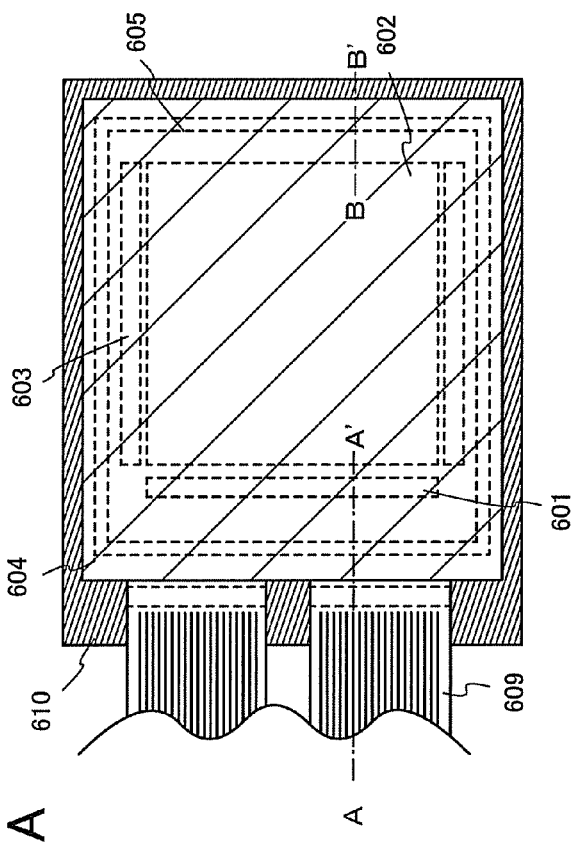
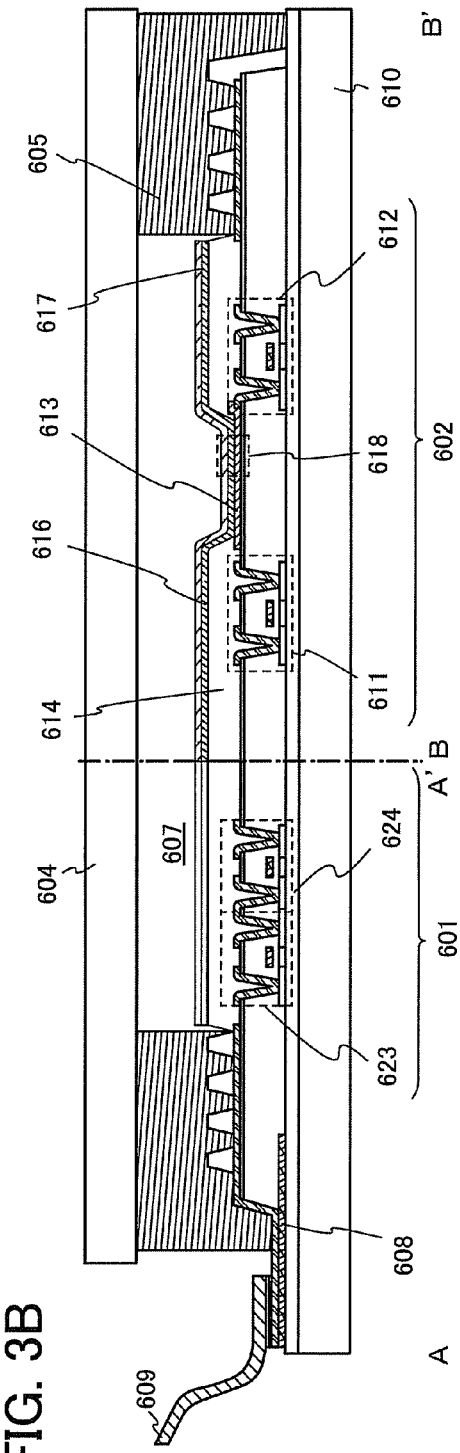
FIG. 3A
FIG. 3B

ANTHRACENE DERIVATIVE, LIGHT-EMITTING DEVICE AND ELECTRONIC APPLIANCE

BACKGROUND OF THE INVENTION

1. Field of the Invention

The present invention relates to an anthracene derivative. Moreover, the present invention relates to a light-emitting material, a material for a light-emitting element, a composition for coating, a light-emitting element, a light-emitting device, and an electronic appliance each of which uses the anthracene derivative.

2. Description of the Related Art

A display device including a light-emitting element (an organic EL element) in which an organic compound is used as a light-emitting substance has been developed rapidly as a next generation display device because it has advantages such as thinness, lightness in weight, high response speed, and low power consumption. Although there have been various obstacles in the development, technique has been improved such that organic EL televisions have become commercially available recently.

In an organic EL element, by voltage applied between a pair of electrodes which have a light-emitting layer interposed therebetween, electrons and holes injected from the electrodes are recombined so that a light-emitting substance is excited, and when the excited state returns to a ground state, light is emitted. The wavelength of light emitted from a light-emitting substance is peculiar to the light-emitting substance; thus, by using different types of organic compounds as light-emitting substances, light-emitting elements which exhibit a variety of wavelengths, i.e., a variety of colors can be obtained.

In the case of a display device which is expected to display images, such as a display panel, at least light of three colors, i.e., red, green, and blue are required in order to reproduce full-color images. To achieve this, for example, there are following methods: a method in which a color filter is used in combination with a light-emitting element that emits light with an emission spectrum in a wide wavelength range, a method in which a color conversion layer is used in combination with a light-emitting element that emits light with the shortest wavelength among the wavelengths of desired colors, and a method in which a light-emitting element that emits light with a desired wavelength is used. Among these three methods, the last one, i.e., a method by which a desired color is directly obtained is preferable because loss in energy is small in this method.

This method is employed in the above-described organic EL televisions which have become commercially available; however, actually, in addition to that method, a color filter is used and a micro cavity structure is further used for a light-emitting element in order to improve color purity. Organic EL televisions having got many advantages are naturally expected to provide high quality images as next generation televisions, and light-emitting elements exhibiting appropriate emission colors are required to live up to the expectation.

Light emitted from a light-emitting substance is peculiar to the substance, as described above. There are many measures to improve the color purity of the organic EL television, which means that it is very difficult to obtain a light-emitting element which exhibits light emission of a favorable color and also satisfies other important requirements of lifetime, power consumption, and the like. In addition, important characteristics of a light-emitting element, such as a lifetime or power consumption, do not necessarily depend on only a substance exhibiting light emission. The characteristics are largely affected also by layers other than a light-emitting layer, an element structure, an affinity between a light-emitting substance and a host, or the like. Therefore, it is true that many kinds of materials are necessary for light-emitting elements in order to further extend this field. In view of this, materials for light-emitting elements which have a variety of molecular structures have been disclosed (for example, Japanese Published Patent Application No. 2007-15933).

SUMMARY OF THE INVENTION

Among light-emitting elements that are currently developed, light-emitting elements that emit blue light are inferior in characteristics to light-emitting elements that emit red light to green light. In order to emit blue light, a light-emitting substance having a large energy gap is necessary and a substance used for a host in which a light-emitting substance is dispersed or a substance used for a transporting layer adjacent to a light-emitting region in a light-emitting layer needs to have a larger energy gap, which is one cause of the above problem.

According to an embodiment of the present invention made in view of the foregoing, a novel anthracene derivative with a large energy gap is provided.

As a result of diligent studies, the present inventors have succeeded in synthesis of an anthracene derivative in which a carbazolyl group is bonded only to the 2-position of 9,10-diarylanthracene, as a substance with a large band gap which can be suitably used as a material for a light-emitting element.

In other words, an anthracene derivative according to an embodiment of the present invention is represented by General Formula (G1) below.

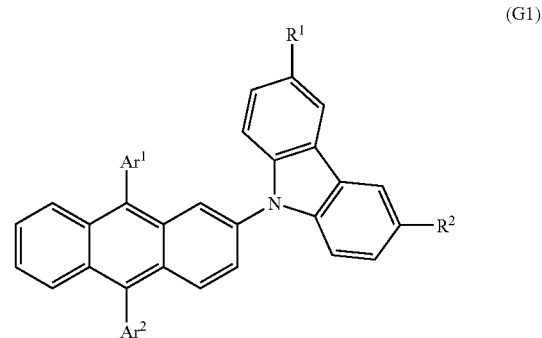

(G1)

In the formula, $Ar^1$ and $Ar^2$ independently represent an aryl group having 6 to 13 carbon atoms in a ring and $R^1$ and $R^2$ independently represent any of hydrogen, an alkyl group with 1 to 4 carbon atoms, or an aryl group with 6 to 13 carbon atoms in a ring. Each of $Ar^1$, $Ar^2$, $R^1$, and $R^2$ may have a substituent and the two substituents may be bonded to each other to form a ring.

Specifically, as $Ar^1$ and $Ar^2$ in the formula, groups represented by Structure Formulae (1-1) to (1-6) below are given. Note that $Ar^1$ and $Ar^2$ may be the same group or different groups from each another.

(1-1)

-continued
(1-2)
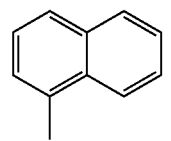
(1-3)
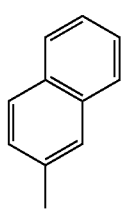
(1-4)
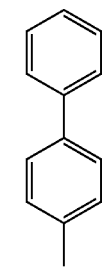
(1-5)
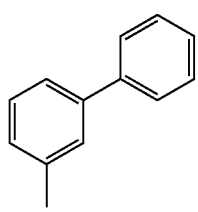
(1-6)
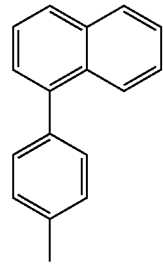
(1-7)
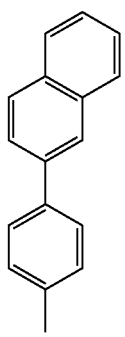
(1-8)
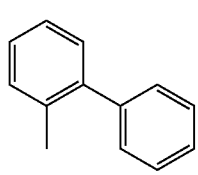
-continued
(1-9)
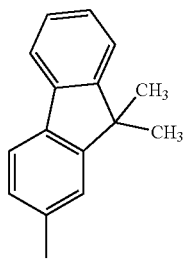
(1-10)
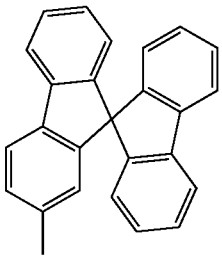
(1-11)
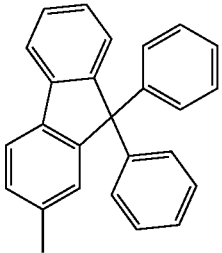
(1-12)
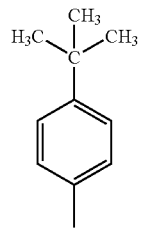
(1-13)
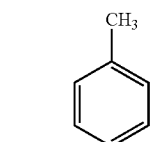
(1-14)
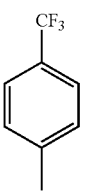
(1-15)
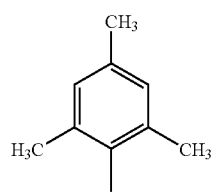

(1-16)
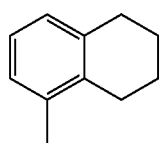
Specifically, as $R^1$ and $R^2$ in the formula, groups represented by Structure Formulae (2-1) to (2-25) below are given. Note that $R^1$ and $R^2$ may be different groups from each another.
(2-1)
H
(2-2)
(2-3)
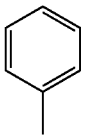
(2-4)
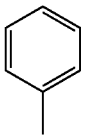
(2-5)
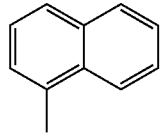
(2-6)
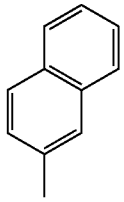
(2-7)
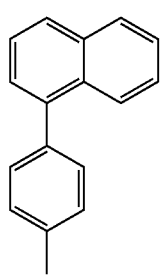
(2-8)
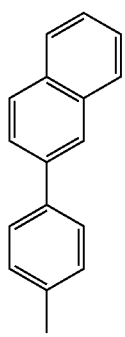
(2-9)
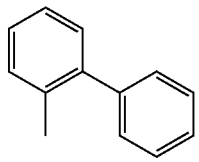
(2-10)
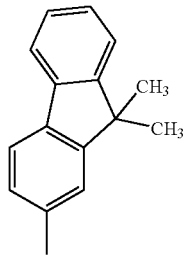
(2-11)
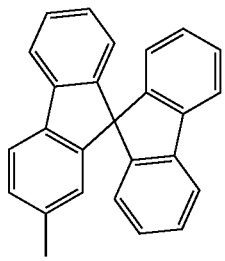
(2-12)
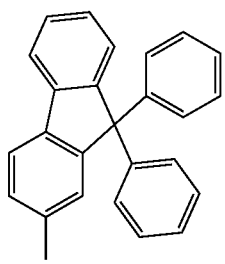
(2-13)
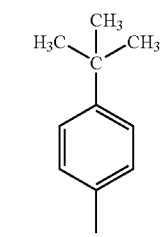

-continued

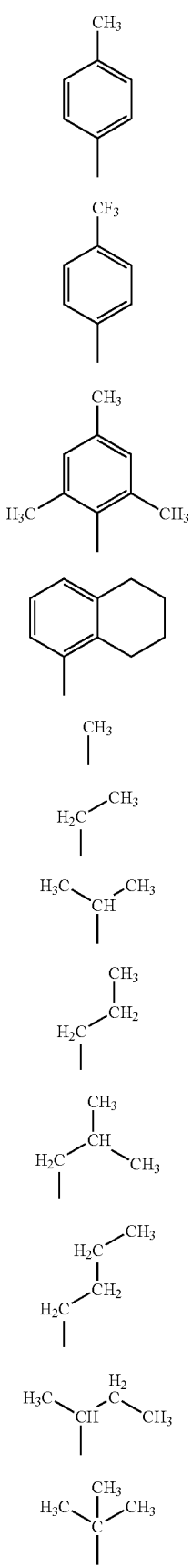

(2-14)

(2-15)

(2-16)

(2-17)

(2-18)

(2-19)

(2-20)

(2-21)

(2-22)

(2-23)

(2-24)

(2-25)

According to one embodiment of the present invention having the above structure, a novel anthracene with a large band gap is provided.

BRIEF DESCRIPTION OF THE DRAWINGS

FIGS. 3A and 3B are conceptual diagrams of an active matrix light-emitting device (Embodiment 12).

DETAILED DESCRIPTION OF THE INVENTION

Figure 1A:
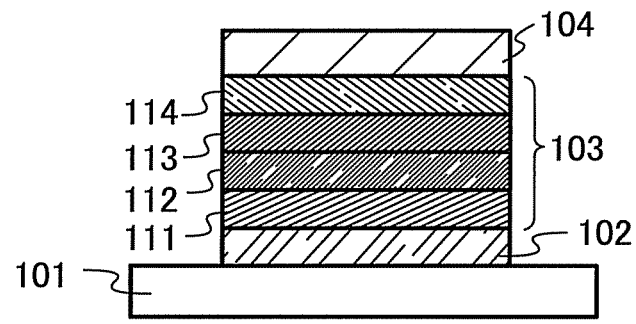
FIGS. 1A and 1B are conceptual diagrams of light-emitting elements (Embodiment 3 to Embodiment 6).

Embodiments of the present invention are described below. Note that the present invention can be carried out in many different modes and it is easily understood by those skilled in the art that the modes and details can be changed variously unless otherwise such changes and modifications depart from the scope of the invention. Accordingly, the present invention is not construed as being limited to the description of the embodiments.

Embodiment 1

An anthracene derivative according to an embodiment of the present invention has a molecular structure in which a carbazolyl group is bonded to the 2-position of 9,10-diarylanthracene. Note that the carbazolyl group may have substituents at the 3-position and the 6-position. The anthracene derivative of Embodiment 1 with such a structure has a large energy gap and can be very suitably used as a material for a light-emitting element that emits blue light.

The anthracene derivative of Embodiment 1 as above can also be represented by General Formula (G1) below.

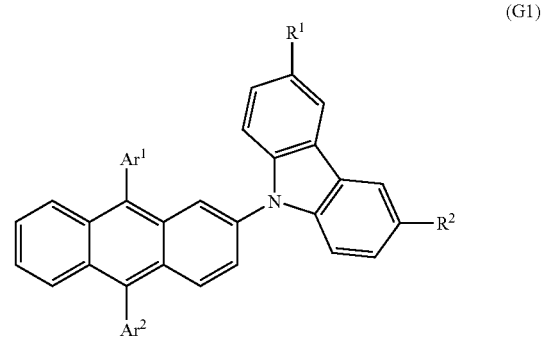

(G1)

In the formula, $Ar^1$ and $Ar^2$ independently represent an aryl group with 6 to 13 carbon atoms in a ring. Specifically, a phenyl group, a naphthyl group, a fluorenyl group, and the like are given. Each of $Ar^1$ and $Ar^2$ may further include a substituent; in this case, an alkyl group with 1 to 4 carbon atoms and an aryl group with 6 to 13 carbon atoms in a ring are given as the substituent. Specifically, a methyl group, an ethyl group, a propyl group, a butyl group, a phenyl group, a naphthyl group, a fluorenyl group, and the like are given. Each of $Ar^1$ and $Ar^2$ may have one or more substituents and the two substituents may be bonded to each other to form a ring. As an example of this case, carbon at the 9-position of a fluorenyl group bonded to anthracene at the 2-position has two phenyl groups and the two phenyl groups are bonded to each other to form a spiro-ring structure.

Specific examples of the group represented by $Ar^1$ or $Ar^2$ are given in Structure Formulae (1-1) to (1-16) below.

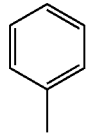

(1-1)

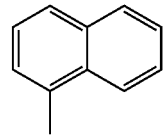

(1-2)

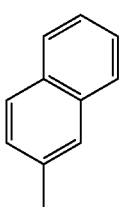

(1-3)

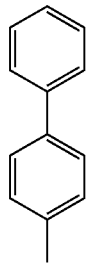

(1-4)

(1-5) 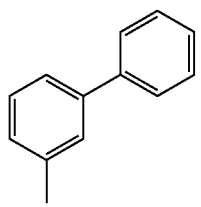

(1-6) 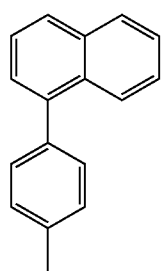

(1-7) 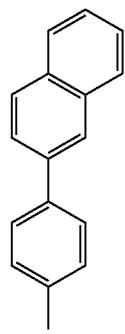

(1-8) 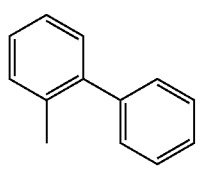

(1-9) 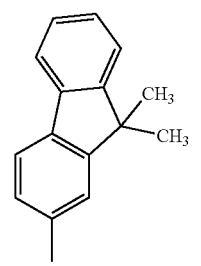

(1-10) 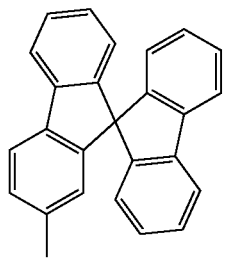

(1-11) 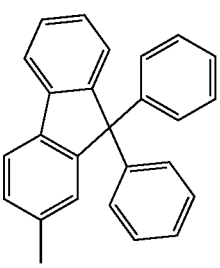

(1-12) 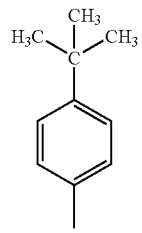

(1-13) 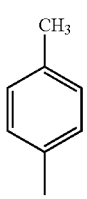

(1-14) 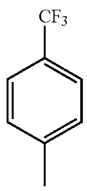

(1-15) 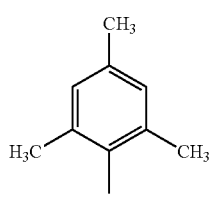

(1-16) 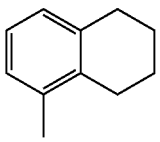

In the formulae, $R^1$ and $R^2$ independently represent any of hydrogen, an alkyl group with 1 to 4 carbon atoms, or an aryl group with 6 to 13 carbon atoms in a ring. Specifically, a methyl group, an ethyl group, a propyl group, a butyl group, a phenyl group, a naphthyl group, a fluorenyl group, and the like are given. Each of $Ar^1$ and $Ar^2$ may have one or more substituents and the two substituents may be bonded to each other to form a ring. Moreover, one carbon may have two or more substituents and these substituents may be bonded to each other. As an example of this case, carbon at the 9-position of a fluorenyl group bonded to anthracene at the 2-position has two phenyl groups and the two phenyl groups are bonded to each other to form a spiro-ring structure.

Specific examples of the group represented by $R^1$ or $R^2$ are given below in Structure Formulae (2-1) to (2-25) below.
(2-1)
(2-2)
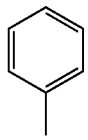
(2-3)
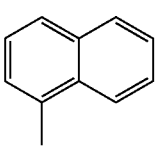
(2-4)
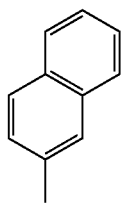
(2-5)
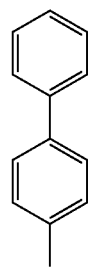
(2-6)
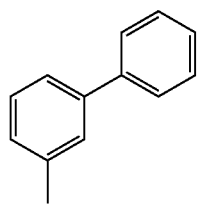
(2-7)
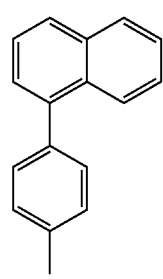
(2-8)
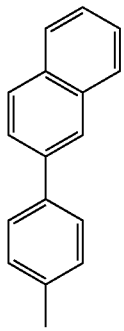
(2-9)
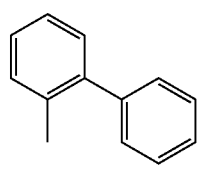
(2-10)
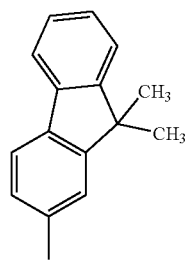
(2-11)
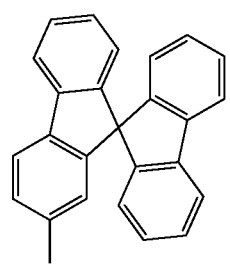
(2-12)
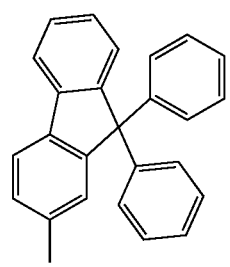
(2-13)
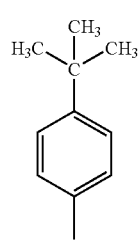

-continued
(2-14)
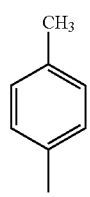
(2-15)
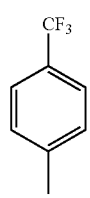
(2-16)
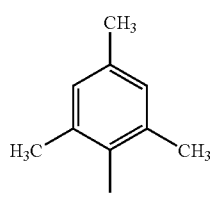
(2-17)
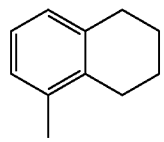
(2-18)
(2-19)
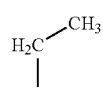
-continued
(2-20)
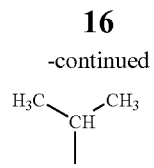
(2-21)
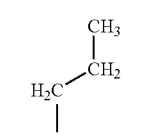
(2-22)
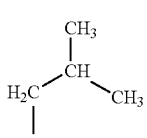
(2-23)
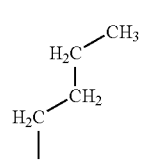
(2-24)
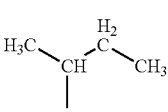
(2-25)
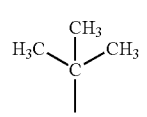
As specific examples of the anthracene derivative represented by General Formula (G1), there are anthracene derivatives represented by Structural Formulae (1) to (40) given below. However, the present invention is not limited to these examples.
(1)
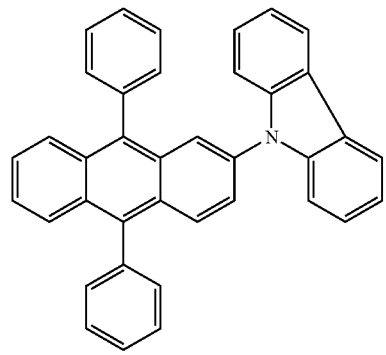
(2)
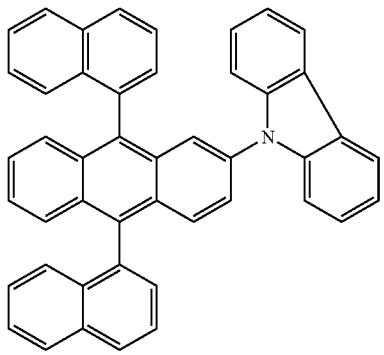

(3)
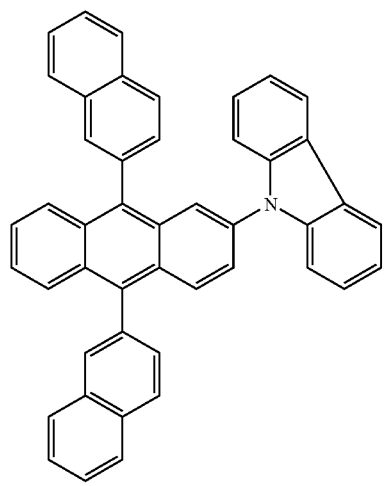
(4)
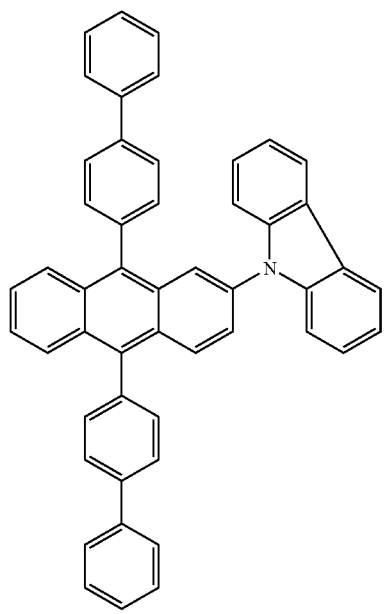
(5)
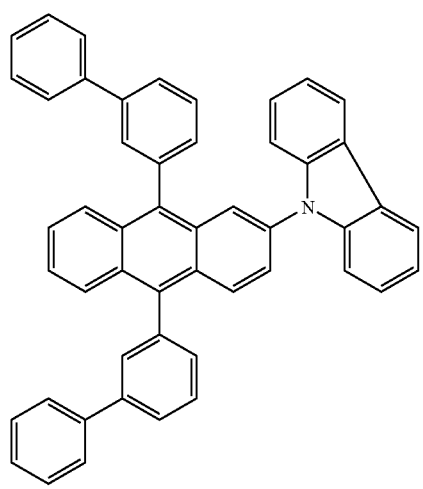
(6)
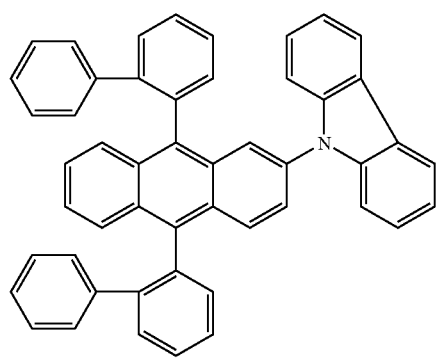
(7)
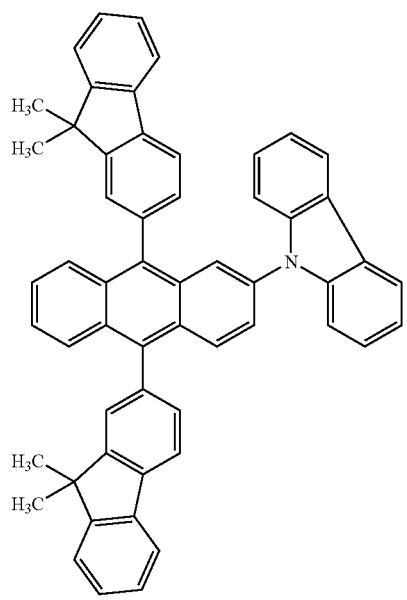
(8)
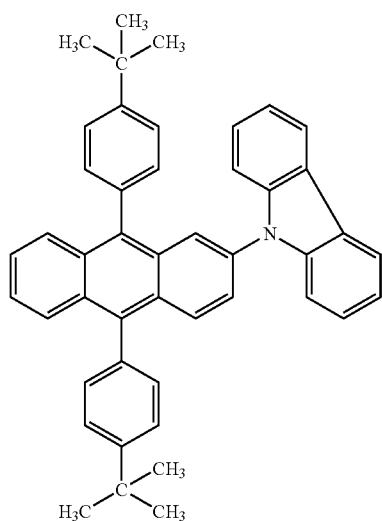

-continued
(9)
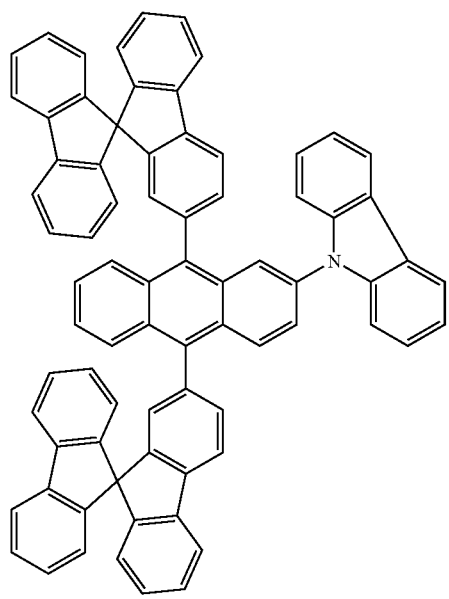
(10)
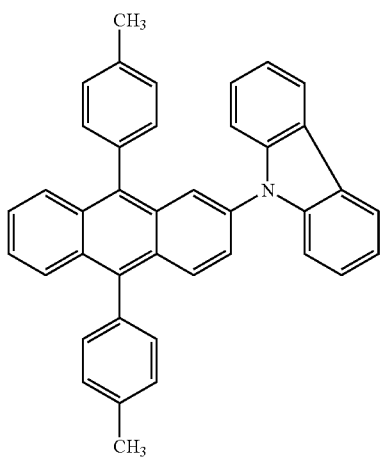
(11)
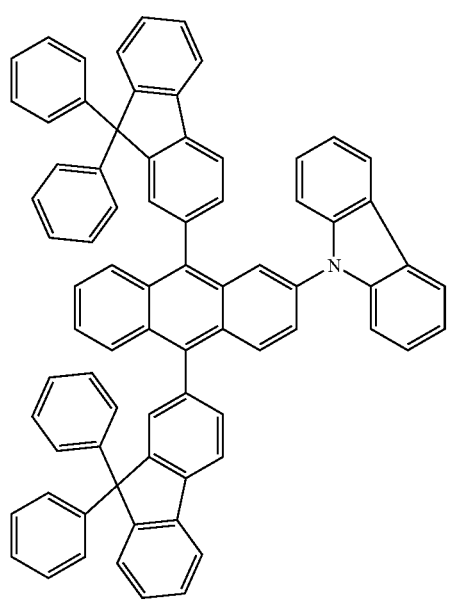
(12)
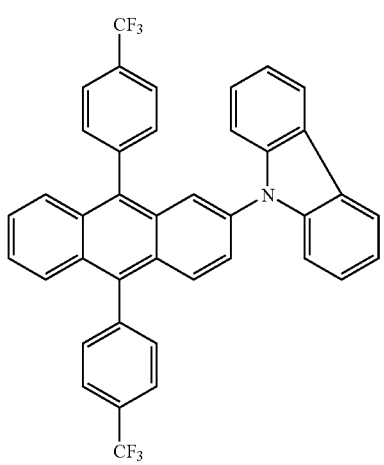
(13)
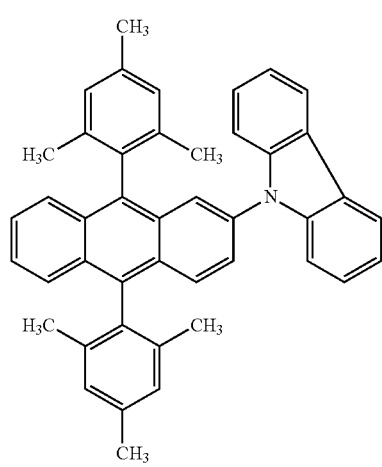
(14)
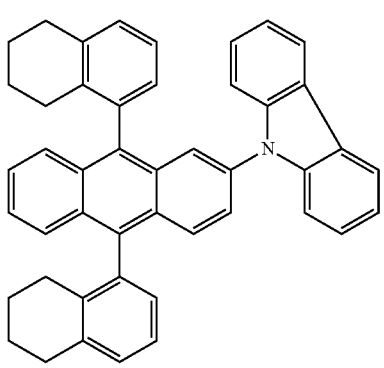

-continued
(15)
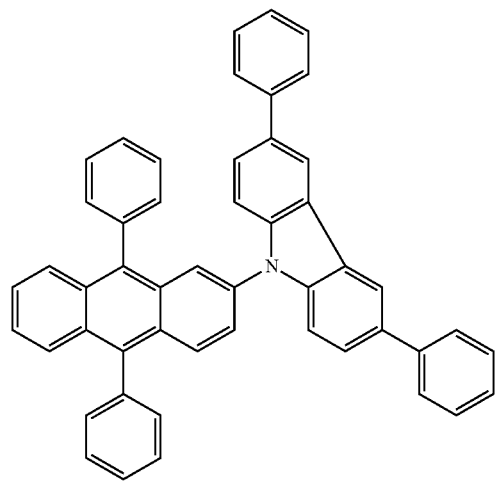
(16)
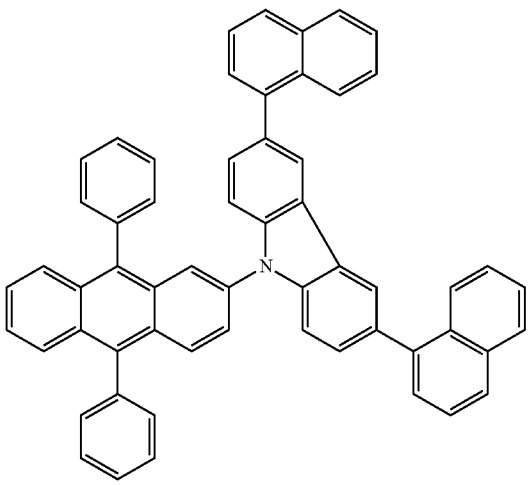
(17)
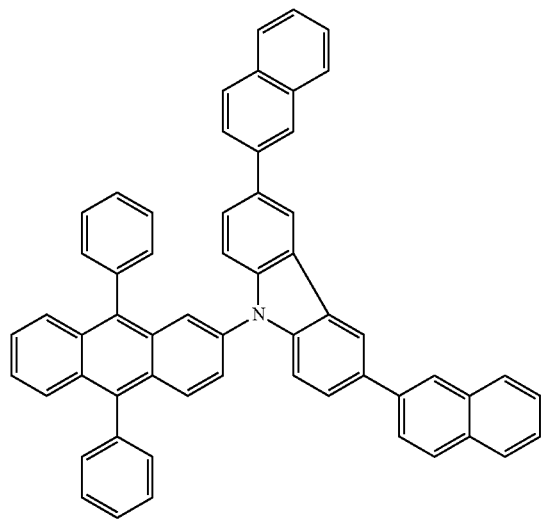
(18)
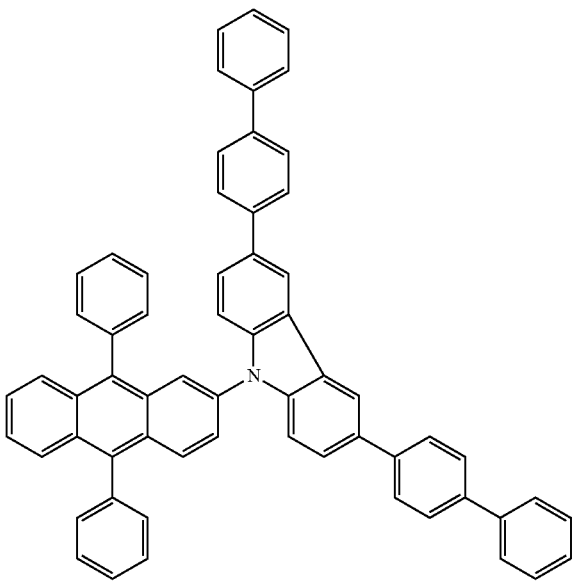
(19)
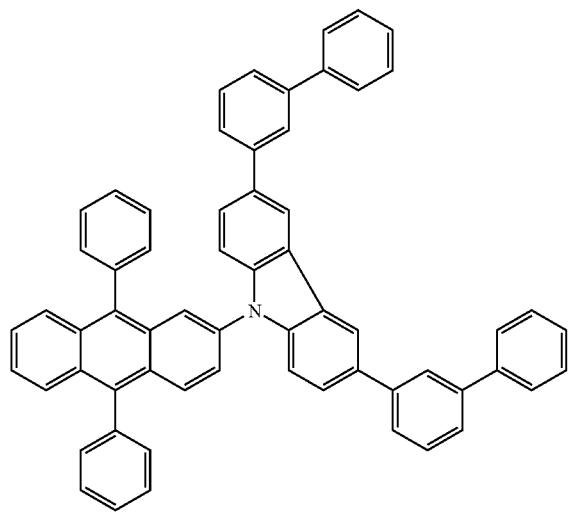
(20)
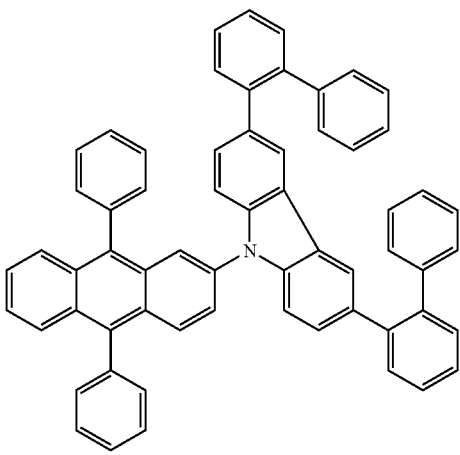

-continued
(21)
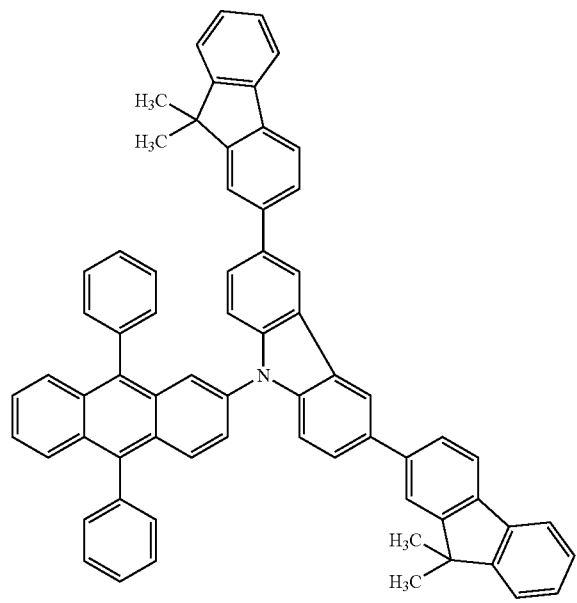
(22)
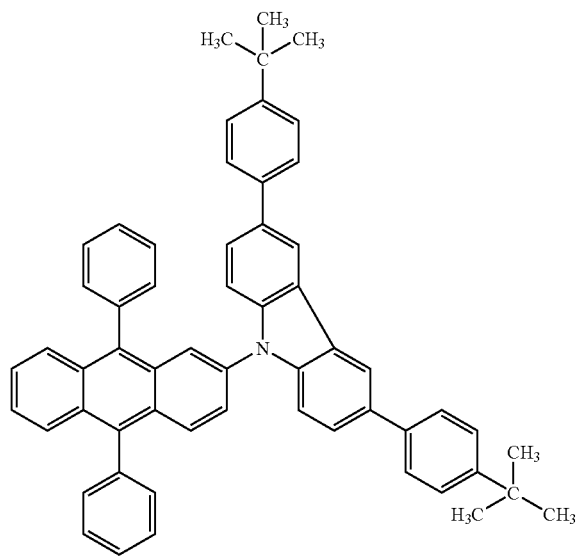
(23)
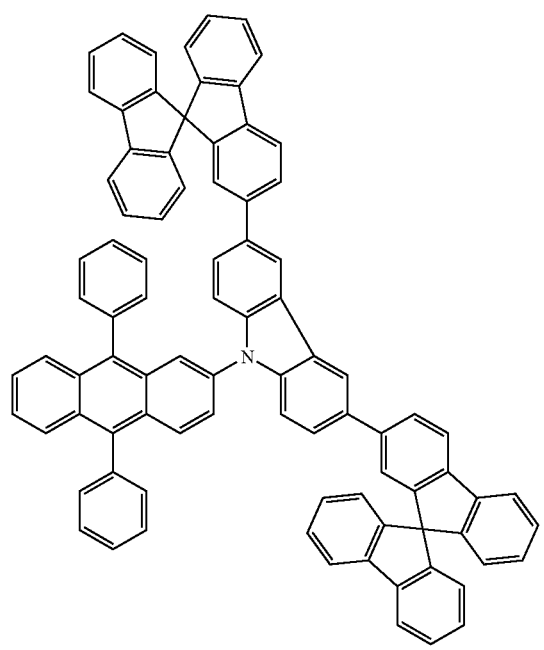
(24)
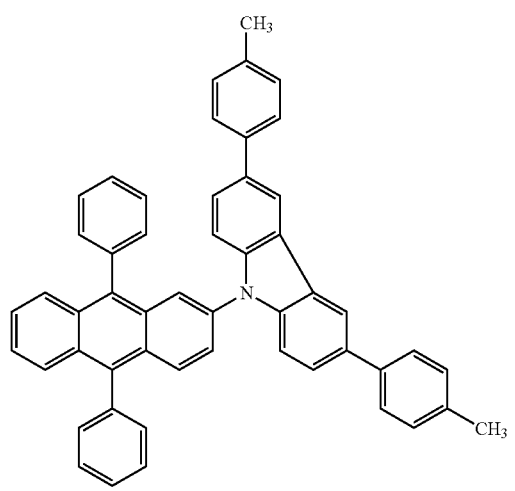

-continued
(25)
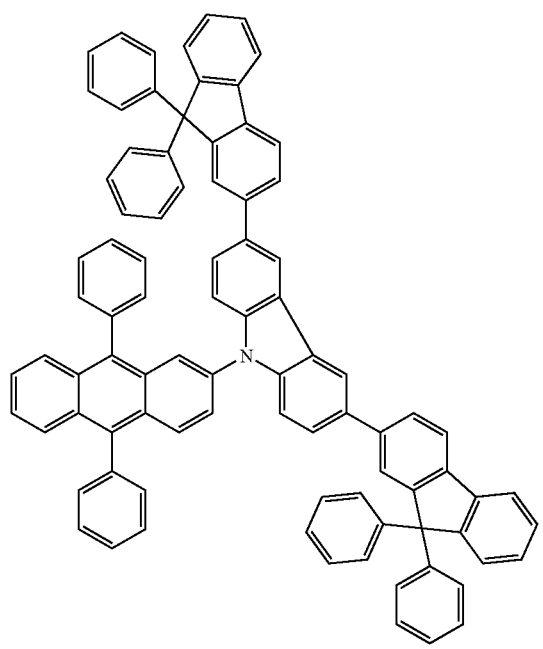
(26)
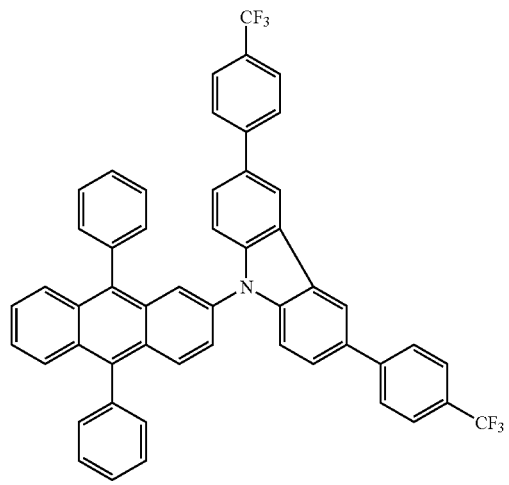
(27)
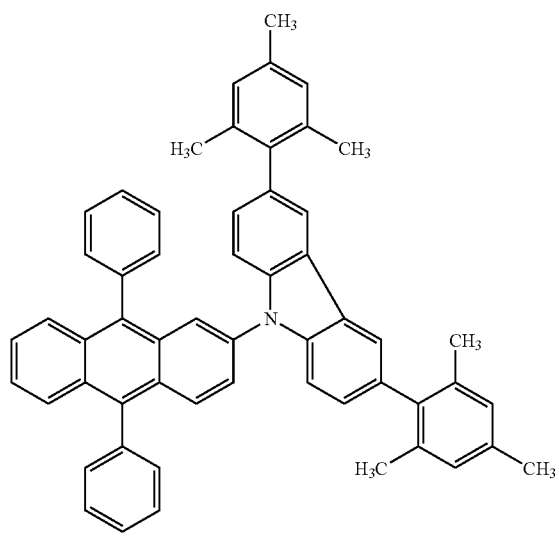
(28)
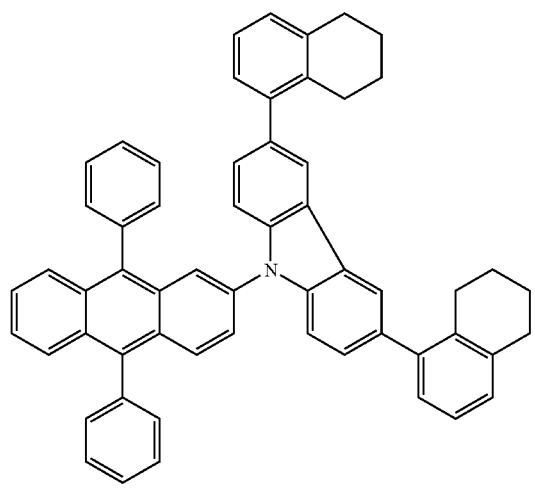
(29)
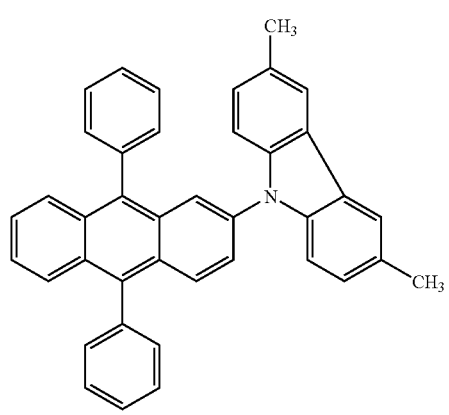
(30)
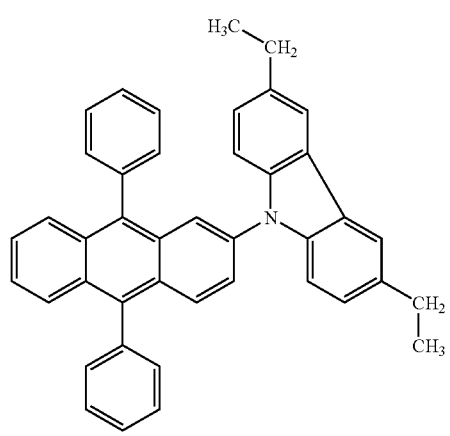

-continued
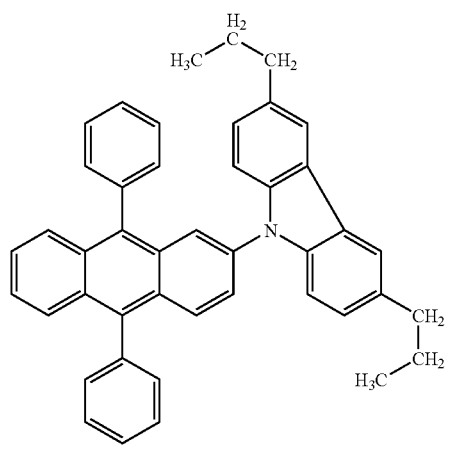 (31)
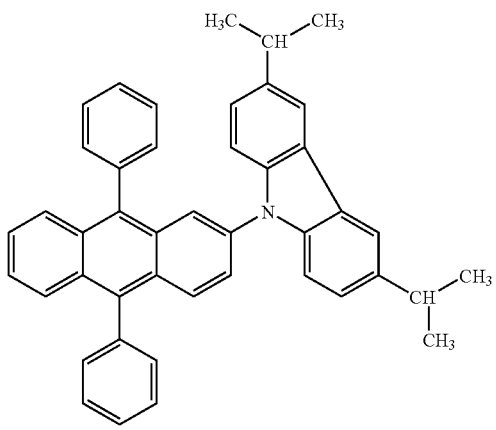 (32)
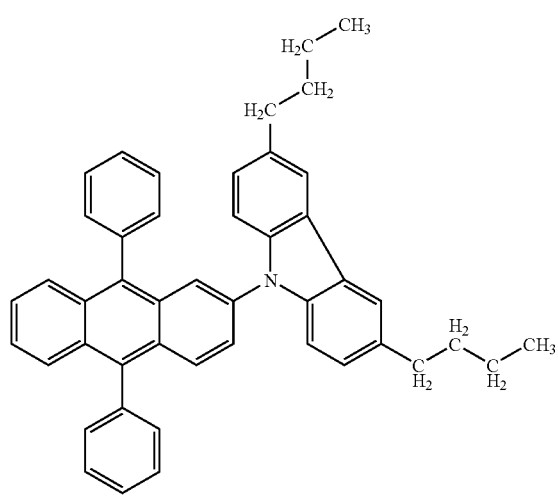 (33)
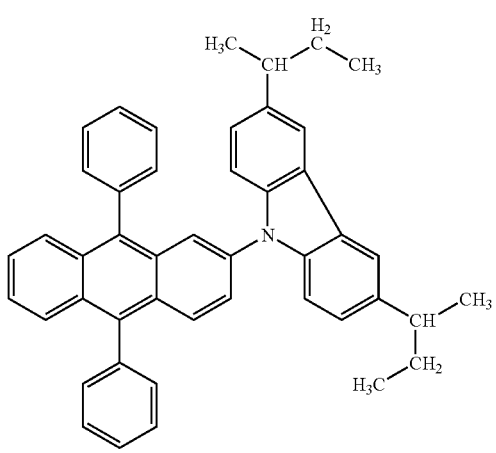 (34)
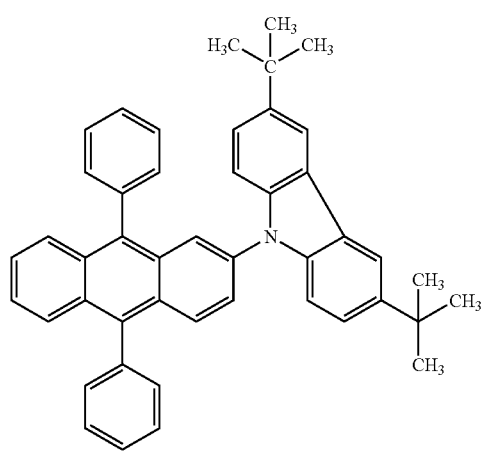 (35)
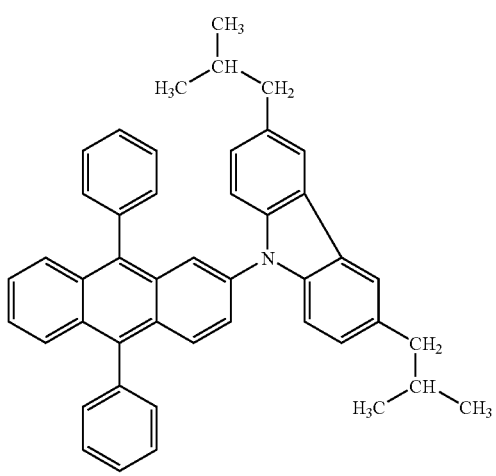 (36)

(37)
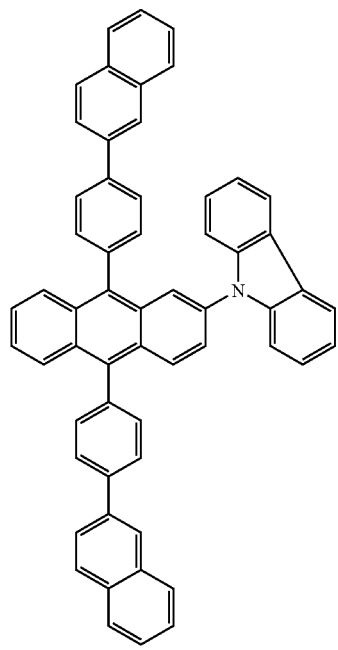
(38)
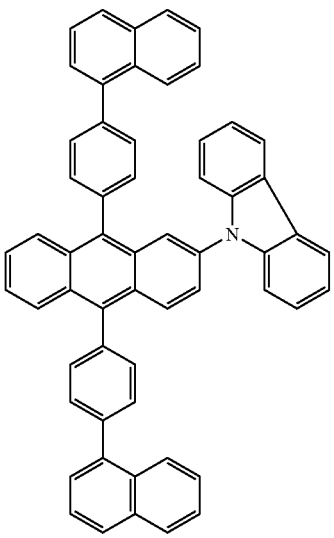
(39)
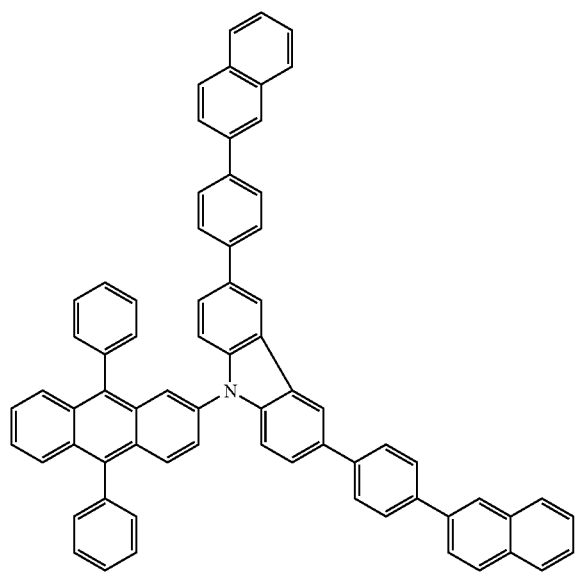
(40)
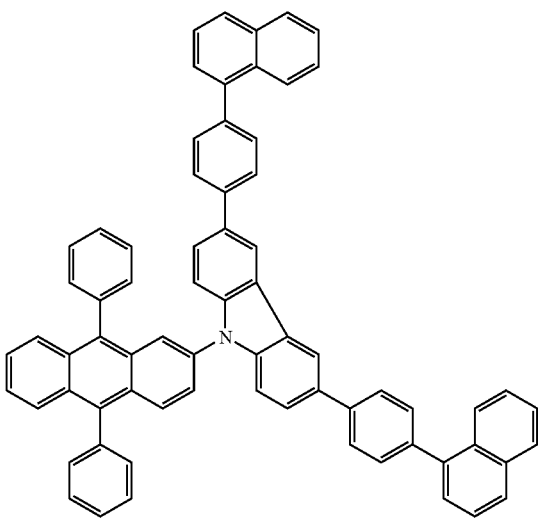

Next, a synthesis method for forming the anthracene derivative of Embodiment 1 is described. A synthesis scheme for forming the anthracene derivative is shown below.

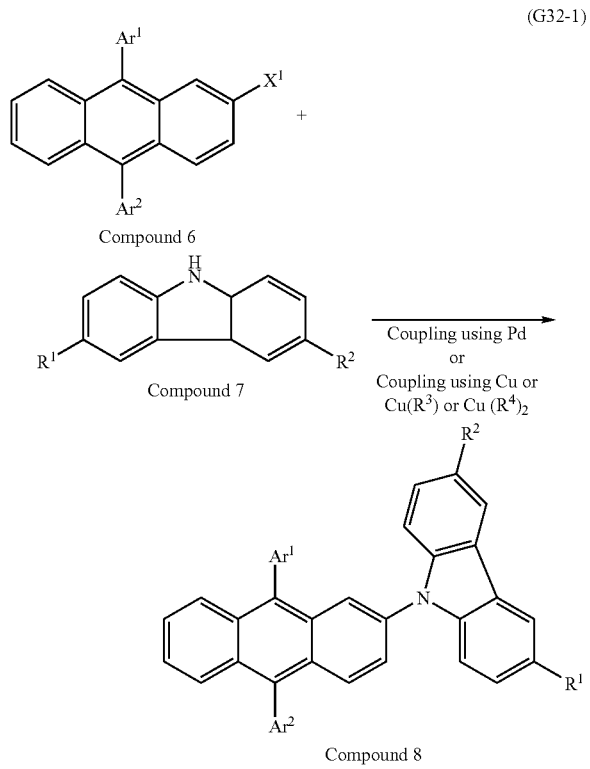

Compound 8

The anthracene derivative of Embodiment 1 which is represented by the above General Formula (G1) can be obtained in such a manner that 2-halogenated-9,10-diarylanthracene (Compound 1) and a 9H-carbazole derivative (Compound 2) are coupled in the presence of a base through a Hartwig-Buchwald reaction using a palladium catalyst or through a Ullmann reaction using copper or a copper compound.

In the above reaction formula, $Ar^1$ and $Ar^2$ independently represent an aryl group with 6 to 13 carbon atoms in a ring and $R^1$ and $R^2$ independently represent any of hydrogen, an alkyl group with 1 to 4 carbon atoms, or an aryl group with 6 to 13 carbons atoms in a ring. Each of $Ar^1$, $Ar^2$, $R^1$, and $R^2$ may have a substituent and the two or more substituents may be bonded to each other to form a ring. Further, one carbon may have two or more substituents, and the two substituents may be bonded to each other to form a spiro-ring structure. $X^1$ represents a halogen group, specifically one of iodine, bromine, and chlorine.

In the case where the Buchwald-Hartwig reaction is performed in accordance with the above reaction formula, a palladium catalyst that can be used may be, but not limited to, bis(dibenzylideneacetone)palladium(0), palladium(II) acetate, or the like. Examples of a ligand of the palladium catalyst that can be used in the reaction formula include, but are not limited to, tri(tert-butyl)phosphine, tri(n-hexyl)phosphine, and tri(cyclohexyl)phosphine.

Examples of the base that can be used in the above reaction formula include, but are not limited to, an organic base such as sodium tert-butoxide and an inorganic base such as potassium carbonate.

Examples of a solvent used in the above reaction formula include, but are not limited to, toluene, xylene, benzene, and tetrahydrofuran.

The case of performing the Ullmann reaction in accordance with the above reaction formula is described. In the above reaction formula, each of $R^3$ and $R^4$ represents halogen, an acetyl group, or the like. As the halogen, chlorine, bromine, iodine, and the like are given. Copper(I) iodide in which $R^3$ is iodine or copper(II) acetate in which $R^4$ is an acetyl group is preferable. The copper compound that is used in the reaction is not limited to these, and copper can be used as an alternative to a copper compound.

The base used in the above formula may be, but not limited to, an inorganic base such as potassium carbonate. A solvent that can be used in the above reaction formula may be, but not limited to, 1,3-dimethyl-3,4,5,6-tetrahydro-2(1H)pyrimidinone (abbreviation: DMPU), toluene, xylene, benzene, or the like. DMPU, xylene, or toluene which has a high boiling point is preferably used because, in the Ullmann reaction, the object of the synthesis can be obtained in a shorter time and at a higher yield when the reaction temperature is greater than or equal to 100° C. In particular, DMPU is more preferable because the reaction temperature is more preferably greater than or equal to 150° C. Alternatively, a solvent may be omitted in the Ullmann reaction; in this case, the reaction temperature is preferably higher than the melting point of a material.

In the aforementioned manner, the anthracene derivative of Embodiment 1 can be synthesized.

The anthracene derivative of Embodiment 1 as above has a large energy gap and can be very suitably used for a light emission center material, a host material, or a carrier transporting material of a light-emitting element that emits blue light.

Embodiment 2

A wet process is a process in which a material for a thin film is dissolved in a solvent, the liquid composition is attached to a region where the film is to be formed, the solvent is removed, and then the resulting material is solidified, whereby the thin film is formed. In view of this, the wet process has many advantages such as high use efficiency of materials and easy application to large substrates and therefore contributes to higher productivity and cost reduction. However, many of low molecular compounds used for light-emitting elements have low quality when they are formed into films by a wet process, and it is difficult to use such films in a manner similar to films formed by a vacuum evaporation method. Moreover, it often happens that the films formed by a wet process are not dissolved or are not easily dissolved in appropriate solvents. For these reasons, at present, films of low molecular compounds are not often formed by a wet process.

However, the anthracene derivative of Embodiment 1 can be formed into a film with high quality by an evaporation method and moreover can be dissolved in an appropriate solvent; therefore, a favorable film of the anthracene derivative of Embodiment 1 can be formed even by a wet process such as spin coating or a droplet discharging method.

Embodiment 2 describes in detail a composition used for coating, which is formed using the anthracene derivative of Embodiment 1, and film formation using the composition by a wet process.

The film formation by a wet process is performed in such a manner that a composition including the anthracene derivative of Embodiment 1 and a solvent is applied.

Any of a variety of solvents can be used as the solvent. For example, the anthracene derivative can be dissolved in a solvent having an aromatic ring (e.g., a benzene ring), such as toluene, xylene, methoxybenzene (anisole), or dodecylbenzene, or in a mixed solvent of plural kinds of solvents such as dodecylbenzene and tetralin. The anthracene derivative of Embodiment 1 can also be dissolved in an organic solvent having no aromatic ring, such as diethyl ether, ethyl acetate, dioxane, methoxyethanol, dimethylsulfoxide (DMSO), dimethylformamide (DMF), or chloroform.

The composition may include another organic material in addition to the anthracene derivative of Embodiment 1. As such an organic material, any of aromatic compounds or heteroaromatic compounds which are solid at room temperature can be used. As the organic material, a low molecular compound or a high molecular compound can be used. In the case of using a low molecular compound as the organic compound in the composition in addition to the anthracene derivative of Embodiment 1, it is preferable to use a low molecular compound having a substituent which increases the solubility of the compound in a solvent (this low molecular compound may be referred to as an intermediate molecular compound).

The composition may include a binder which improves quality of a film when the composition is formed into the film. As the binder, a high molecular compound that is electrically inactive is preferably used. Specifically, polymethylmethacrylate (abbreviation: PMMA), polyimide, or the like can be used.

As a method for forming a film of the composition, any of the following methods can be employed: a spin coating method, a roll coating method, a spray method, a casting method, a dipping method, a droplet discharge (jet) method (an inkjet method), a dispensing method, a variety of printing methods (a method by which a film can be formed in a desired pattern, such as screen printing (mimeographing), offset (planographic) printing, relief printing, or gravure (intaglio) printing), and the like. Note that a film of the composition according to an embodiment of the present invention can be formed by another method as long as the method can form a film using a liquid composition. In this specification, a film formed by a wet process is extremely thin in some cases depending on its formation conditions, and the film does not necessarily maintain the form of a film; for example, it may include a discontinuous island structure or the like.

Further, since film formation by a wet process can be performed at atmospheric pressure, facilities necessary for a vacuum apparatus and the like can be reduced. In addition, since a vacuum apparatus does not have to be used, the size of a substrate that is to be processed is not restricted by the size of a vacuum chamber and the substrate can be therefore increased in size. From the aspect of process temperature, heat treatment is necessary only at temperatures of such a degree that the solvent in the composition is removed. Therefore, even substrates and materials which would be decomposed or change in quality or shape through high-temperature heat treatment can be used.

Furthermore, since a liquid composition having fluidity is used for the film formation, mixture of materials is easy. For example, an emission color that is obtained can be controlled by addition of a plurality of kinds of dopants to the composition. In addition, good coverage with respect to a region where the film is formed can also be achieved.

A thin film can be formed as selected by a droplet discharging method by which a composition can be discharged in a desired pattern, a printing method by which a composition can be transferred in a desired pattern or a desired pattern can be drawn with the composition, or the like. Therefore, less material is wasted, so that a material can be used efficiently; accordingly, a production cost can be reduced. Furthermore, these methods do not require processing of the shape of the thin film through a photolithography process and therefore simplify the process and improve the productivity.

A thin film formed by a wet process with the use of the composition in which the anthracene derivative of Embodiment 1 is dissolved in the solvent has high quality without defects or the like in the film. Thus, with the use of the composition and the thin film as aforementioned, a highly reliable light-emitting element (device) can be manufactured.

Since a wet process is employed in Embodiment 2 for fabrication of the thin film and the light-emitting element, high use efficiency of materials and reduction in expensive facilities such as a large vacuum apparatus can be achieved, resulting in cost reduction and productivity improvement. Accordingly, a light-emitting device and an electronic appliance that are highly reliable can be obtained while cost reduction and productivity improvement are achieved.

Embodiment 3

One embodiment of a light-emitting element using the anthracene derivative of Embodiment 1 is described below with reference to FIG. 1A.

A light-emitting element of Embodiment 3 has a plurality of layers between a pair of electrodes. In Embodiment 3, the light-emitting element includes a first electrode 102, a second electrode 104, and an EL layer 103 provided between the first electrode 102 and the second electrode 104. Note that the first electrode 102 serves as an anode and the second electrode 104 serves as a cathode in Embodiment 3. In other words, when voltage is applied to the first electrode 102 and the second electrode 104 such that the potential of the first electrode 102 is higher than that of the second electrode 104, light emission can be obtained.

A substrate 101 is used as a support of the light-emitting element. The substrate 101 can be formed from, for example, glass, plastic, or the like. Note that any material other than glass or plastic can be used as long as the material can function as a support of a light-emitting element.

The first electrode 102 is preferably formed from metal, alloy, a conductive compound, a mixture thereof, or the like each having a high work function (specifically, 4.0 eV or more). Specifically, for example, indium oxide-tin oxide (ITO: indium tin oxide), indium oxide-tin oxide containing silicon or silicon oxide, indium oxide-zinc oxide (IZO: indium zinc oxide), indium oxide containing tungsten oxide and zinc oxide (IWZO), and the like are given. Films of these conductive metal oxides are generally formed by sputtering; however, the films may be formed by a sol-gel method or the like. For example, a film of indium oxide-zinc oxide (IZO) can be formed by a sputtering method using a target formed by adding zinc oxide of 1 to 20 wt % to indium oxide. A film of indium oxide containing tungsten oxide and zinc oxide (IWZO) can be formed by a sputtering method using a target in which 0.5 to 5 wt % of tungsten oxide and 0.1 to 1 wt % of zinc oxide are mixed with indium oxide. Alternatively, gold (Au), platinum (Pt), nickel (Ni), tungsten (W), chromium (Cr), molybdenum (Mo), iron (Fe), cobalt (Co), copper (Cu), palladium (Pd), a nitride of a metal material (such as titanium nitride), and the like can be given.

There is no particular limitation on a stack structure of the EL layer 103. The EL layer 103 may be formed as appropriate using a layer including the anthracene derivative according to one embodiment of the present invention which is described in Embodiment 1 in combination with any of a layer including a substance with a high electron-transporting property or a high hole-transporting property, a layer including a substance with a high electron-injecting property, a layer including a substance with a high hole-injecting property, a layer including a substance with a bipolar property (a material with a high electron- and hole-transporting property), or the like. For example, the EL layer 103 can be formed using, as appropriate, a hole-injecting layer, a hole-transporting layer, a light-emitting layer, an electron-transporting layer, an electron-injecting layer, and the like in combination. Embodiment 3 describes the EL layer 103 having a structure in which a hole-injecting layer 111, a hole-transporting layer 112, a light-emitting layer 113, and an electron-transporting layer 114 are stacked in that order over the first electrode 102. Specific materials for the layers are given below.

The hole-injecting layer 111 is a layer including a substance with a high hole-injecting property. Molybdenum oxide, vanadium oxide, ruthenium oxide, tungsten oxide, manganese oxide, or the like can be used. Alternatively, the hole-injecting layer 111 can be formed using phthalocyanine (abbreviation: $H_2Pc$); a phthalocyanine-based compound such as copper phthalocyanine (abbreviation: CuPc); an aromatic amine compound such as 4,4'-bis[N-(4-diphenylaminophenyl)-N-phenylamino]biphenyl (abbreviation: DPAB) or 4,4'-bis(N-{4-[N-(3-methylphenyl)-N-phenylamino]phenyl}-N-phenylamino)biphenyl (abbreviation: DNTPD); a high molecular compound such as poly(ethylenedioxythiophene)/poly(styrenesulfonate) (abbreviation: PEDOT/PSS); or the like.

Further alternatively, a composite material formed by mixing a substance with an acceptor property into a substance with a high hole-transporting property can be used for the hole-injecting layer 111. Note that, by the use of the substance with a high hole-transporting property which includes a substance with an acceptor property, a material used for forming an electrode can be selected regardless of its work function. In other words, instead of a material with a high work function, a material with a low work function can be used for the first electrode 102. As the substance with an acceptor property, 7,7,8,8-tetracyano-2,3,5,6-tetrafluoroquinodimethane (abbreviation: $F_4$-TCNQ), chloranil, and the like can be given. In addition, a transition metal oxide can be given. In addition, an oxide of a metal belonging to any of Group 4 to Group 8 of the periodic table can be given. Specifically, vanadium oxide, niobium oxide, tantalum oxide, chromium oxide, molybdenum oxide, tungsten oxide, manganese oxide, and rhenium oxide are preferable because of a high electron-accepting property. Among these, molybdenum oxide is especially preferable since it is stable in the air and its hygroscopic property is low so that it can be easily treated.

As the substance with a high hole-transporting property used for the composite material, a variety of compounds such as an aromatic amine compound, a carbazole derivative, aromatic hydrocarbon, and a high molecular compound (such as oligomer, dendrimer, or polymer) can be given. The organic compound used for the composite material is preferably an organic compound having a high hole-transporting property. Specifically, a substance having a hole mobility of greater than or equal to $10^{-6}$ cm$^2$/Vs is preferably used. Note that any substance other than those above may be used as long as the hole-transporting property is higher than the electron-transporting property. The organic compound that can be used for the composite material is specifically shown below.

For example, the aromatic amine compound may be N,N'-di(p-tolyl)-N,N'-diphenyl-p-phenylenediamine (abbreviation: DTDPPA); 4,4'-bis[N-(4-diphenylaminophenyl)-N-phenylamino]biphenyl (abbreviation: DPAB); 4,4'-bis(N-{4-[N-(3-methylphenyl)-N-phenylamino]phenyl}-N-phenylamino)biphenyl (abbreviation: DNTPD); 1,3,5-tris[N-(4-diphenylaminophenyl)-N-phenylamino]benzene (abbreviation: DPA3B); or the like.

The carbazole derivative that can be used for the composite material may be 3-[N-(9-phenylcarbazol-3-yl)-N-phenylamino]-9-phenylcarbazole (abbreviation: PCzPCA1); 3,6-bis[N-(9-phenylcarbazol-3-yl)-N-phenylamino]-9-phenylcarbazole (abbreviation: PCzPCA2); 3-[N-(1-naphtyl)-N-(9-phenylcarbazol-3-yl)amino]-9-phenylcarbazole (abbreviation: PCzPCN1); or the like.

Moreover, the carbazole derivative that can be used for the composite material may be 4,4'-di(N-carbazolyl)biphenyl (abbreviation: CBP); 1,3,5-tris[4-(N-carbazolyl)phenyl]benzene (abbreviation: TCPB); 9-[4-(10-phenyl-9-anthryl)phenyl]-9H-carbazole (abbreviation: CZPA); 1,4-bis[4-(N-carbazolyl)phenyl]-2,3,5,6-tetraphenylbenzene; or the like.

The aromatic hydrocarbon that can be used for the composite material may be, for example, 2-tert-butyl-9,10-di(2-naphthyl)anthracene (abbreviation: t-BuDNA); 2-tert-butyl-9,10-di(1-naphthyl)anthracene; 9,10-bis(3,5-diphenylphenyl)anthracene (abbreviation: DPPA); 2-tert-butyl-9,10-bis(4-phenylphenyl)anthracene (abbreviation: t-BuDBA); 9,10-di(2-naphthyl)anthracene (abbreviation: DNA); 9,10-diphenylanthracene (abbreviation: DPAnth); 2-tert-butylanthracene (abbreviation: t-BuAnth); 9,10-bis(4-methyl-1-naphthyl)anthracene (abbreviation: DMNA); 2-tert-butyl-9,10-bis[2-(1-naphthyl)phenyl]anthracene; 9,10-bis[2-(1-naphthyl)phenyl]anthracene; 2,3,6,7-tetramethyl-9,10-di(1-naphthyl)anthracene; 2,3,6,7-tetramethyl-9,10-di(2-naphthyl)anthracene; 9,9'-bianthryl; 10,10'-diphenyl-9,9'-bianthryl; 10,10'-bis(2-phenylphenyl)-9,9'-bianthryl; 10,10'-bis[(2,3,4,5,6-pentaphenyl)phenyl]-9,9'-bianthryl; anthracene; tetracene; rubrene; perylene; 2,5,8,11-tetra(tert-butyl)perylene; or the like. Alternatively, pentacene, coronene, or the like can be used. The aromatic hydrocarbon having a hole mobility of greater than or equal to $1 \times 10^{-6}$ cm$^2$/Vs and having 14 to 42 carbon atoms is more preferable.

The aromatic hydrocarbon that can be used for the composite material may have a vinyl skeleton. As the aromatic hydrocarbon having a vinyl group, for example, 4,4'-bis(2,2-diphenylvinyl)biphenyl (abbreviation: DPVBi), 9,10-bis[4-(2,2-diphenylvinyl)phenyl]anthracene (abbreviation: DPVPA), and the like are given.

Moreover, a high molecular compound such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N-phenylamino}phenyl)methacrylamide] (abbreviation: PTPDMA), or poly[N,N'-bis(4-butylphenyl)-N,N-bis(phenyl)benzidine (abbreviation: poly-TPD) can be used.

The hole-transporting layer 112 is a layer including a substance with a high hole-transporting property. As the substance with a high hole-transporting property, for example, an aromatic amine compound such as 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), or 4,4'-bis[N-(spiro-9,9'-bifluoren-2-yl)-N-phenylamino]biphenyl (abbreviation: BSPB) can be used. The substances described here are mainly substances having a hole mobility of greater than or equal to $10^{-6}$ cm$^2$/Vs. Note that any substance other than those above may be used as long as the hole-transporting property is higher than the electron-transporting property. Note that the layer including a substance with a high hole-transporting property is not limited to a single layer but two or more layers each including the aforementioned substance may be stacked.

Further, a high molecular compound such as poly(N-vinylcarbazole) (abbreviation: PVK) or poly(4-vinyltriphenylamine) (abbreviation: PVTPA) can also be used for the hole-transporting layer 112.

Note that the anthracene derivative of Embodiment 1 may be used for the hole-transporting layer.

The light-emitting layer 113 is a layer including a substance with a light-emitting property. In Embodiment 3, the light-emitting layer 113 is a layer including the anthracene derivative of Embodiment 1 as the main component. The anthracene derivative according to an embodiment of the present invention can favorably be applied to a light-emitting element as a substance with a light-emitting property, because the anthracene derivative according to an embodiment of the present invention emits blue light.

The electron-transporting layer 114 is a layer including a substance with a high electron-transporting property. For example, a layer containing a metal complex having a quinoline skeleton or a benzoquinoline skeleton, such as tris(8-quinolinolato)aluminum (abbreviation: Alq), tris(4-methyl-8-quinolinolato)aluminum (abbreviation: Almq$_3$), bis(10-hydroxybenzo[h]-quinolinato)beryllium (abbreviation: BeBq$_2$), or bis(2-methyl-8-quinolinolato)(4-phenylphenolato)aluminum (abbreviation: BAlq) can be used. Alternatively, a metal complex having an oxazole-based or thiazole-based ligand, such as bis[2-(2-hydroxyphenyl)benzoxazolato]zinc (abbreviation: Zn(BOX)$_2$) or bis[2-(2-hydroxyphenyl)-benzothiazolato]zinc (abbreviation: Zn(BTZ)$_2$) can be used. As an alternative to the metal complexes, 2-(4-biphenylyl)-5-(4-tert-butylphenyl)-1,3,4-oxadiazole (abbreviation: PBD), 1,3-bis[5-(p-tert-butylphenyl)-1,3,4-oxadiazole-2-yl]benzene (abbreviation: OXD-7), 3-(4-biphenylyl)-4-phenyl-5-(4-tert-butylphenyl)-1,2,4-triazole (abbreviation: TAZ), bathophenanthroline (abbreviation: BPhen), bathocuproine (abbreviation: BCP), or the like can be used. The substances described here are mainly substances having an electron mobility of greater than or equal to $10^{-6}$ cm$^2$/Vs. Note that any substance other than those above may be used for the electron-transporting layer as long as the electron-transporting property is higher than the hole-transporting property.

Note that the anthracene derivative of Embodiment 1 may be used as a material for the electron-transporting layer.

Further, the electron-transporting layer may be formed as not only a single layer but also stacked layers in which two or more layers each made from the above mentioned substance are stacked.

Further, a layer for controlling transport of electron carriers may be provided between the electron-transporting layer 114 and the light-emitting layer 113. Specifically, the layer for controlling transport of electron carriers is a layer formed by adding a small amount of substance with a high electron-trapping property to the material with a high electron-transporting property as aforementioned, so that carrier balance can be adjusted. Such a structure is very effective in suppressing a problem (such as shortening of element lifetime) caused when electrons pass through the light-emitting layer.

Further, an electron-injecting layer 115 may be provided in contact with the second electrode 104. For the electron-injecting layer, an alkali metal, an alkaline-earth metal, or a compound thereof such as lithium fluoride (LiF), cesium fluoride (CsF), or calcium fluoride (CaF$_2$) may be used. For example, a layer including a substance with an electron-transporting property, which further includes an alkali metal, an alkaline-earth metal, or a compound thereof, such as Alq which includes magnesium (Mg), may be used. It is preferable to use a layer including a substance with an electron-transporting property, which further includes an alkali metal or an alkaline-earth metal, as the electron-injecting layer because electron injection from the second electrode 104 can be performed efficiently.

The second electrode 104 can be formed from metal, alloy, an electrically conductive compound, a mixture thereof, or the like each having a low work function (specifically, 3.8 eV or less). As specific examples of such a cathode material, an element belonging to Group 1 or Group 2 in the periodic table, that is, an alkali metal such as lithium (Li) or cesium (Cs); an alkaline-earth metal such as magnesium (Mg), calcium (Ca), or strontium (Sr); an alloy containing the element belonging to Group 1 or Group 2 (MgAg, AlLi); a rare-earth metal such as europium (Eu) or ytterbium (Yb); an alloy thereof; and the like can be given. However, when an electron-injecting layer is provided between the second electrode 104 and the electron-transporting layer, the second electrode 104 can be formed from any of a variety of conductive materials such as Al, Ag, ITO, or indium oxide-tin oxide including silicon or silicon oxide regardless of its work function. Films of these conductive materials can be formed by a sputtering method, an inkjet method, a spin coating method, or the like.

A variety of methods can be used for forming the EL layer 103, regardless of a dry process or a wet process. For example, a vacuum evaporation method, an inkjet method, a spin coat method, or the like may be used. Further, a different method may be employed for each electrode or each layer.

In particular, since the anthracene derivative of Embodiment 1 can be formed into a favorable film as the light-emitting layer 113 even by a wet process, it is also preferable to employ a wet process. In the case of employing a wet process, a composition including at least the anthracene derivative of Embodiment 1 and a solvent is applied to form a film by the method as described in Embodiment 2. By the use of a wet process in the film formation, use efficiency of materials and the like can be improved, so that the production cost can be reduced. In the case of employing a wet process, a solvent is used; therefore, it is preferable to employ a combination of materials so that the solvent does not easily dissolve a thin film on which the film is to be formed.

The electrode may be formed by a wet process using a sol-gel method, or by a wet process using a paste of a metal material. Further, the electrode may be formed by a dry process such as a sputtering method or a vacuum evaporation method.

In the light-emitting element according to an embodiment of the present invention having the structure as described above, the difference in potential generated between the first electrode 102 and the second electrode 104 makes a current flow, whereby holes and electrons are recombined in the light-emitting layer 113, which is a layer including a substance with a high light-emitting property, and thus light is emitted. That is, a light-emitting region is formed in the light-emitting layer 113 in this structure. The emitted light is extracted to the outside through one of or both the first electrode 102 and the second electrode 104. Therefore, one of or both the first electrode 102 and the second electrode 104 have a light transmitting property. When only the first electrode 102 has a light-transmitting property, the emitted light is extracted from the substrate side through the first electrode 102. Meanwhile, when only the second electrode 104 has a light-transmitting property, the emitted light is extracted from the side opposite to the substrate side through the second electrode 104. In the case where both the first electrode 102 and the second electrode 104 have a light transmitting property, light emission is extracted from both the substrate side and the side opposite to the substrate side through the first electrode 102 and the second electrode 104.

The structure of the layers provided between the first electrode 102 and the second electrode 104 is not limited to the aforementioned one. However, it is preferable to use a structure in which a light-emitting region where holes and electrons are recombined is positioned away from the first electrode 102 and the second electrode 104 so as to prevent quenching due to the proximity of the light-emitting region and a metal used for the electrode or the carrier-injecting layer. The order of stacking the layers is not limited to the above, and the following order, which is opposite to the layers in FIGS. 1A and 1B, may be employed: the second electrode, the electron-injecting layer, the electron-transporting layer, the light-emitting layer, the hole-transporting layer, the hole-injecting layer, and the first electrode from the substrate side.

Further, the hole-transporting layer or electron-transporting layer which is in direct contact with the light-emitting layer, especially the carrier-transporting layer which is in contact with part of the light-emitting layer 113 which is closer to the light-emitting region is preferably formed from a substance having a larger energy gap than the anthracene derivative according to an embodiment of the present invention included in the light-emitting layer.

In Embodiment 3, the light-emitting element is fabricated over a substrate of glass, plastic, or the like. By the fabrication of a plurality of such light-emitting elements over one substrate, a passive matrix light-emitting device can be obtained. In addition, for example, a thin film transistor (TFT) may be formed over a substrate of glass, plastic, or the like and a light-emitting element may be fabricated over an electrode electrically connected to the TFT. Thus, an active matrix light-emitting device which controls the driving of the light-emitting element by a TFT can be fabricated. There is no particular limitation on a structure of the TFT. Either a staggered TFT or an inverted staggered TFT may be employed. In addition, there is no particular limitation on the crystallinity of a semiconductor used for the TFT, and an amorphous semiconductor may be used or a crystalline semiconductor may be used. In addition, a driver circuit formed over a TFT substrate may include both N-channel TFTs and P-channel TFTs, or include either N-channel TFTs or P-channel TFTs.

The anthracene derivative according to an embodiment of the present invention has a large energy gap; therefore, a light-emitting element with sufficiently short wavelengths for blue light emission and with high color purity can be obtained.

Embodiment 4

In Embodiment 4, description is made of a light-emitting element having a different structure from that described in Embodiment 2.

The light-emitting layer 113 shown in Embodiment 2 has a structure in which an anthracene derivative according to an embodiment of the present invention is dispersed into another substance (also referred to as a host material), whereby light emission can be obtained from the anthracene derivative according to an embodiment of the present invention. Since the anthracene derivative according to an embodiment of the present invention emits blue light, a light-emitting element that emits blue light can be obtained.

Here, any of a variety of materials can be used as the host material in which the anthracene derivative according to an embodiment of the present invention is dispersed. The substances having high hole-transporting properties and the substances having high electron-transporting properties which are described in Embodiment 2 can be used. Alternatively, 4,4'-di(N-carbazolyl)-biphenyl (abbreviation: CBP), 2,2',2"-(1,3,5-benzenetri-yl)-tris[1-phenyl-1H-benzimidazole] (abbreviation: TPBI), 9,10-di(2-naphthyl)anthracene (abbreviation: DNA), 2-tert-butyl-9,10-di(2-naphthyl)anthracene (abbreviation: t-BuDNA), or the like can be used. Note that the host material is preferably formed from a substance with a larger energy gap than that of the anthracene derivative according to an embodiment of the present invention which is used.

The light-emitting layer 113 may be a stack of two or more layers. For example, in the case where the light-emitting layer 113 is formed by stacking a first light-emitting layer and a light-emitting second layer in that order from the hole-transporting layer side, for example, the first light-emitting layer is formed using a substance with a hole-transporting property as the host material and the second light-emitting layer is formed using a substance with an electron-transporting property as the host material.

Since the anthracene derivative according to an embodiment of the present invention has a large energy gap, the light-emitting element which has sufficiently short wavelengths for blue light emission and emits favorable blue light can be obtained.

As for the structure other than the light-emitting layer 113, the structure shown in Embodiment 2 can be used as appropriate.

Embodiment 5

In Embodiment 5, a light-emitting element having a different structure from that shown in Embodiment 3 or Embodiment 4 is described.

A structure is described in which light emission is obtained from a substance with a light-emitting property by forming the light-emitting layer 113 of Embodiment 3 in such a manner that a substance with a light-emitting property is dispersed into the anthracene derivative of Embodiment 1; that is, a structure in which the anthracene derivative according to an embodiment of the present invention is used as the host material of the light-emitting layer 113.

The anthracene derivative of Embodiment 1 has a large energy gap, it can effectively excite the light-emitting substance to achieve light emission; therefore, the anthracene derivative of Embodiment 1 can be favorably used as the host material and light emission resulted from the light-emitting substance can be obtained.

In the case where the anthracene derivative according to an embodiment of the present invention is used in a light-emitting layer as a host material in which a substance with a light-emitting property is dispersed, an emission color resulted from the substance with a light-emitting property can be obtained. Therefore, a light-emitting element can be formed which can easily provide light emission of a desired color. Accordingly, a light-emitting element which emits light with high color purity can be easily obtained.

Further, a mixed color of a color resulted from the anthracene derivative according to an embodiment of the present invention and a color resulted from the substance with a light-emitting property dispersed in the anthracene derivative can be emitted.

The light-emitting element can be formed by a vacuum evaporation method; however, since the anthracene derivative of Embodiment 1 can be formed into a favorable film even by a wet process, it is also preferable to use a wet process. In the case of using a wet process to form a film, the composition described in Embodiment 2 is applied to form the film. By the use of a wet process, there are advantages such as improvement in use efficiency of materials; therefore, the production cost can be reduced. Further, since the composition is liquid, it is easy to disperse another substance (here, the substance with a light-emitting property which serves as a light emission center) in the composition; moreover it is also easy to disperse a plurality of kinds of substances with light-emitting properties. In the case of employing a wet process, a solvent is used; therefore, it is preferable to employ a combination of materials so that the solvent does not easily dissolve a thin film on which the film is to be formed.

Here, any of a variety of materials can be used as the substance with a light-emitting property which is dispersed in the anthracene derivative of Embodiment 1 or in the composition including at least the anthracene derivative and the solvent. Specifically, a substance with a fluorescence emitting property that emits fluorescent light such as 4-(dicyanomethylene)-2-methyl-6-(p-dimethylaminostyryl)-4H-pyran (abbreviation: DCM1); 4-(dicyanomethylene)-2-methyl-6-(julolidine-4-yl-vinyl)-4H-pyran (abbreviation: DCM2); N,N-dimethylquinacridone (abbreviation: DMQd); 9,10-diphenylanthracene (abbreviation: DPA); 5,12-diphenyltetracene (abbreviation: DPT); coumarin 6; perylene; or rubrene can be used. Alternatively, a substance with a phosphorescence emitting property that emits phosphorescent light such as bis(2-phenylbenzothiazolato-N,$C^{2'}$)iridium(III) acetylacetonate (abbreviation: Ir(bt)$_2$(acac)); tris(2-phenylquinolinato-N,$C^{2'}$)iridium(III) (abbreviation: Ir(pq)$_3$); bis(2-phenylquinolinato-N,$C^{2'}$)iridium(III) acetylacetonate (abbreviation: Ir(pq)$_2$(acac)); bis[2-(2'-benzo[4,5-α]thienyl)pyridinato-N,$C^{3'}$]iridium(III) acetylacetonate (abbreviation: Ir(btp)$_2$(acac)); bis(1-phenylisoquinolinato-N,$C^{2'}$)iridium(III) acetylacetonate (abbreviation: Ir(piq)$_2$(acac)); (acetylacetonato)bis[2,3-bis(4-fluorophenyl)quinoxalinato]iridium(III) (abbreviation: Ir(Fdpq)$_2$(acac)); or 2,3,7,8,12,13,17,18-octaethyl-21H,23H-porphyrinplatinum(II) (abbreviation: PtOEP) can be used. In the case of using a substance with a phosphorescence emitting property as the substance with a light-emitting property which is dispersed, the emission spectrum of the substance with a phosphorescence emitting property preferably has a peak at greater than or equal to 560 nm and less than or equal to 700 nm. Further, when a substance with a fluorescence emitting property is used, the emission spectrum of the substance with a fluorescence emitting property preferably has a peak at greater than or equal to 450 nm and less than or equal to 700 nm.

As for the structure other than the light-emitting layer 113, the structure shown in Embodiment 3 can be used as appropriate.

Embodiment 6

In Embodiment 6, an embodiment of a light-emitting element with a structure in which a plurality of light-emitting units is stacked (hereinafter this type of light-emitting element is also referred to as a stacked element) is described with reference to FIG. 1B. This light-emitting element has a plurality of light-emitting units between a first electrode and a second electrode. The light-emitting unit may have a structure similar to that of the EL layer 103 described in Embodiment 3 to Embodiment 5. That is, any of Embodiments 3 to 5 describes the light-emitting element having a single light-emitting unit; Embodiment 6 describes a light-emitting element having a plurality of light-emitting units.

Figure 1B:
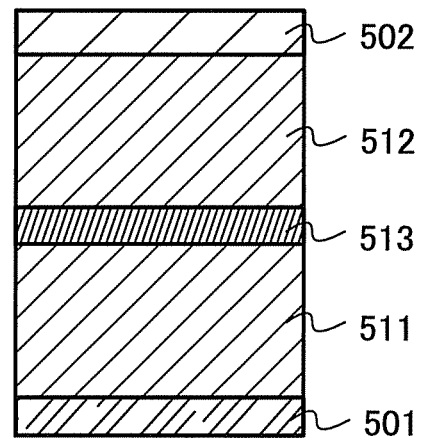

In FIG. 1B, a first light-emitting unit 511 and a second light-emitting unit 512 are stacked between a first electrode 501 and a second electrode 502. A charge generation layer 513 is provided between the first light-emitting unit 511 and the second light-emitting unit 512. The first electrode 501 and the second electrode 502 correspond to the first electrode 102 and the second electrode 104 in Embodiment 3, respectively, and electrodes similar to those described in Embodiment 3 can be used as the first electrode 501 and the second electrode 502. Further, the first light-emitting unit 511 and the second light-emitting unit 512 may have the same structure or different structures.

The charge generation layer 513 includes a composite material of an organic compound and a metal oxide. This composite material of an organic compound and a metal oxide is the composite material described in Embodiment 3 and includes an organic compound and a metal oxide such as vanadium oxide, molybdenum oxide, or tungsten oxide. As the organic compound, a variety of compounds such as an aromatic amine compound, a carbazole derivative, aromatic hydrocarbon, and a high molecular compound (oligomer, dendrimer, polymer, or the like) can be given. An organic compound having a hole mobility of greater than or equal to $10^{-6}$ cm$^2$/Vs is preferably used as a hole-transporting organic compound. Note that any organic compound other than those above may be used as long as the hole-transporting property is higher than the electron-transporting property. The composite material of an organic compound and a metal oxide is superior in a carrier-injecting property and a carrier-transporting property, so that it can achieve low-voltage driving and low-current driving.

Alternatively, the charge generation layer 513 may be formed using a layer including the composite material of an organic compound and a metal oxide in combination with a layer including another material. For example, a layer including the composite material of an organic compound and a metal oxide may be used in combination with a layer including a compound of a substance selected from substances with electron-donating properties and a compound with a high electron-transporting property. Moreover, a layer including the composite material of an organic compound and a metal oxide may be used in combination with a transparent conductive film.

In any case, any layer can be employed as the charge generation layer 513 interposed between the first light-emitting unit 511 and the second light-emitting unit 512 as long as the layer injects electrons into one of these light-emitting units and holes into the other when voltage is applied to the first electrode 501 and the second electrode 502. For example, in FIG. 1B, any layer can be employed as the charge generation layer 513 as long as the layer injects electrons into the first light-emitting unit 511 and holes into the second light-emitting unit 512 when voltage is applied so that the potential of the first electrode is higher than that of the second electrode.

Although the light-emitting element having two light-emitting units is described in Embodiment 6, a light-emitting element in which three or more light-emitting units are stacked can be employed in a similar way. When the charge generation layer is provided between the pair of electrodes so as to partition the plural light-emitting units like in the light-emitting element of Embodiment 6, the element can have long lifetime in a high luminance region while the current density is kept low. In the case where the light-emitting element is applied to lighting, voltage drop due to resistance of an electrode material can be reduced. Accordingly, light can be uniformly emitted with a large area. Moreover, a light-emitting device of low power consumption, which can be driven at low voltage, can be achieved.

When light-emitting units have different emission colors from each other, light emission of a desired color can be obtained as a whole light-emitting element. For example, in the light-emitting element having two light-emitting units, when the emission color of the first light-emitting unit and the emission color of the second light-emitting unit are complementary colors, a light-emitting element emitting white light as a whole can be obtained. Note that "complementary color" means a relation between colors which becomes an achromatic color when they are mixed. That is, white light emission can be obtained by mixture of light obtained from materials which emit the light of complementary colors. In a similar manner, in a light-emitting element including three light-emitting units, white light emission can be obtained as a whole in the case where the emission color of the first light-emitting unit is red, the emission color of the second light-emitting unit is green, and the emission color of the third light-emitting unit is blue, for example.

The light-emitting element of Embodiment 6 includes the anthracene derivative of Embodiment 1; therefore, the light-emitting unit including the anthracene derivative can provide favorable blue light or light with high color purity resulted from the light emission center substance. Thus, it is easy to adjust the color emitted from the light-emitting element as a whole.

Note that Embodiment 6 can be implemented in combination with another embodiment as appropriate.

Embodiment 7

Embodiment 7 shows an example in which the anthracene derivative of Embodiment 1 is used for an active layer of a vertical transistor (SIT), which is a kind of an organic semiconductor element.

Figure 2:
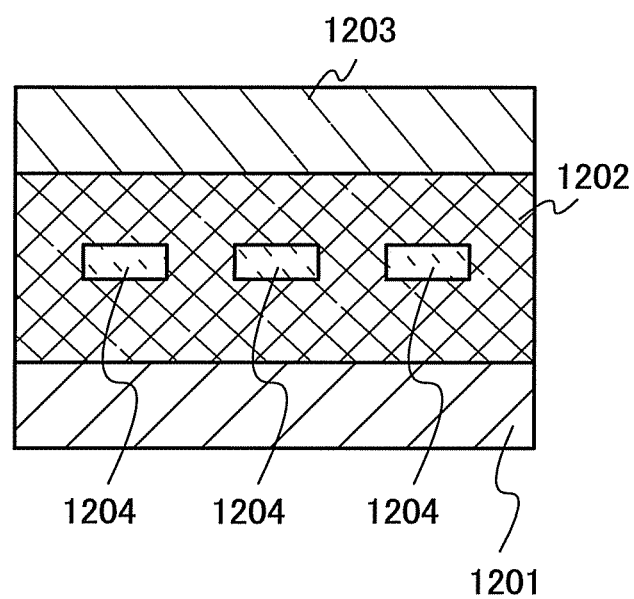
FIG. 2 is a conceptual diagram of an organic semiconductor element (Embodiment 11).

The element has a structure in which a thin active layer 1202 including an anthracene derivative according to an embodiment of the invention is interposed between a source electrode 1201 and a drain electrode 1203, and a gate electrode 1204 is embedded in the active layer 1202, as shown in FIG. 2. The gate electrode 1204 is electrically connected to a means for applying a gate voltage, and the source electrode 1201 and the drain electrode 1203 are electrically connected to a means for controlling a source-drain voltage.

In such an element structure, current flows (becomes ON state) when voltage is applied between the source and the drain under the condition where a gate voltage is not applied. When a gate voltage is applied in this state, a depletion layer is generated around the gate electrode 1204, whereby a current does not flow (becomes OFF state). With the aforementioned mechanism, the element operates as a transistor.

In a vertical transistor, a material which has both a carrier transporting property and favorable film quality is required for an active layer like in a light-emitting element. The anthracene derivative according to an embodiment of the present invention is useful since it sufficiently meets these requirements.

Embodiment 8

In Embodiment 8, a light-emitting device manufactured using an anthracene derivative according to an embodiment of the present invention is described.

In Embodiment 8, a light-emitting device manufactured using an anthracene derivative according to an embodiment of the present invention is described with reference to FIGS. 3A and 3B. FIG. 3A is a top view of the light-emitting device, and FIG. 3B is a cross sectional view taken along A-A' and B-B' of FIG. 3A. This light-emitting device includes a driver circuit portion (a source side driver circuit) 601, a pixel portion 602, and a driver circuit portion (a gate side driver circuit) 603, which are illustrated with dotted lines, to control the light emission of a light-emitting element. Further, reference numeral 604 denotes a sealing substrate and reference numeral 605 denotes a sealing material. A space 607 is provided at a portion surrounded by the sealing material 605.

Reference numeral 608 denotes a wiring for transmitting signals to be input into the driver circuit portion 601 and the driver circuit portion 603 and for receiving signals such as a video signal, a clock signal, a start signal, and a reset signal from an FPC (flexible printed circuit) 609 serving as an external input terminal. Although only the FPC is illustrated here, this FPC may be provided with a printed wiring board (PWB). The light-emitting device in this specification refers to not just a light-emitting device body but a light-emitting device provided with an FPC or a PWB.

Next, a sectional structure is described with reference to FIG. 3B. Among the driver circuit portions and the pixel portion formed over an element substrate 610, the driver circuit portion 601 and one pixel in the pixel portion 602 are illustrated here.

Note that a CMOS circuit in which an n-channel TFT 623 and a p-channel TFT 624 are used in combination is formed in the driver circuit portion 601. The driver circuit may be formed by a variety of CMOS circuits, PMOS circuits, or NMOS circuits. The driver integrated device having the driver circuit formed over the substrate is described in Embodiment 8; however, it is also possible to form the driver circuit not over the substrate but outside the substrate.

Moreover, the pixel portion 602 includes a plurality of pixels including a switching TFT 611, a current control TFT 612, and a first electrode 613 electrically connected to a drain of the current control TFT 612. Note that an insulator 614 is formed covering an end of the first electrode 613. Here, a positive photosensitive acrylic resin film is used.

In order to improve the coverage, the insulator 614 is formed to have a curved surface with curvature at its upper or lower end portion. For example, in the case of using positive photosensitive acrylic for the insulator 614, only the upper end portion of the insulator 614 preferably has a curved surface with a radius of curvature (of 0.2 μm to 3 μm). Further, the insulator 614 can be formed using either negative type that becomes insoluble in an etchant due to light irradiation, or positive type that becomes soluble in an etchant due to light irradiation.

An EL layer 616 and a second electrode 617 are formed over the first electrode 613. The first electrode 613 serving as an anode is preferably formed from a material with a high work function. For example, a single-layer film of an ITO film, an indium tin oxide film including silicon, an indium oxide film including 2 to 20 wt % of zinc oxide, a titanium nitride film, a chromium film, a tungsten film, a Zn film, a Pt film, or the like can be used. Alternatively, a stack of a titanium nitride film and a film containing aluminum as its main component, a stack of three layers of a titanium nitride film, a film containing aluminum as its main component, and a titanium nitride film, or the like can be used. Furthermore, when the first electrode 613 is formed using a stack of layers, the resistance can be reduced as a wiring and a good ohmic contact can be obtained. In addition, this first electrode can serve as the anode.

The EL layer 616 is formed by any of a variety of methods such as an evaporation method using an evaporation mask, an inkjet method, and a spin coating method. The EL layer 616 includes the anthracene derivative according to the present invention described in Embodiment 1. As another material included in the EL layer 616, a low molecular compound or a high molecular compound (including oligomer or dendrimer) may be used.

As a material used for the second electrode 617, which is formed over the EL layer 616 and serves as a cathode, a material having a low work function (Al, Mg, Li, Ca, or an alloy or a compound thereof such as MgAg, MgIn, AlLi, LiF, or $CaF_2$) is preferably used. In the case where light generated in the EL layer 616 passes through the second electrode 617, the second electrode 617 is preferably formed using a stack of a thin metal film and a transparent conductive film (ITO, indium oxide including 2 wt % to 20 wt % of zinc oxide, indium tin oxide including silicon, zinc oxide (ZnO), or the like).

Note that the light-emitting element is formed by the first electrode 613, the EL layer 616, and the second electrode 617. The light-emitting element has any of the structures shown in Embodiment 3 to Embodiment 6. The pixel portion, which includes a plurality of light-emitting elements, in the light-emitting device of Embodiment 8 may include both the light-emitting element with any of the structures described in Embodiment 3 to Embodiment 6 and the light-emitting element with a structure other than those.

By attaching the sealing substrate 604 to the element substrate 610 using the sealing material 605, a light emitting element 618 is provided in the space 607 which is surrounded by the element substrate 610, the sealing substrate 604 and the sealing material 605. Further, the space 607 is filled with filler. The space is sometimes filled with an inert gas (such as nitrogen or argon) or the sealing material 605.

An epoxy based resin is preferably used for the sealing material 605. In addition, it is desirable to use a material that allows permeation of moisture or oxygen as little as possible. As the sealing substrate 604, a plastic substrate formed from FRP (fiberglass-reinforced plastics), PVF (polyvinyl fluoride), polyester, acrylic, or the like can be used besides a glass substrate or a quartz substrate.

In this manner, the light-emitting device manufactured using the anthracene derivative of Embodiment 1 can be obtained.

Since the anthracene derivative described in Embodiment 1 is used for the light-emitting device of the present invention, the light-emitting device can have favorable characteristics. Specifically, the anthracene derivative of Embodiment 1 has a large energy gap and can provide light emission with high color purity, especially favorable blue light emission; therefore, a light-emitting device with excellent color reproducibility and high display quality can be obtained.

Figure 4A:
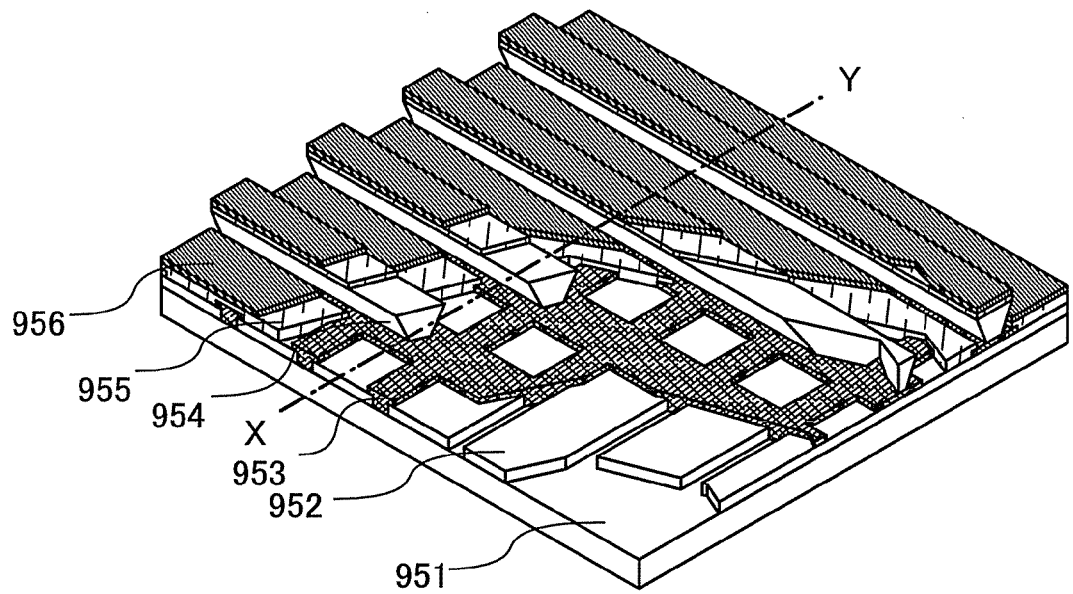
FIGS. 4A and 4B are conceptual diagrams of a passive matrix light-emitting device (Embodiment 13).
Figure 4B:
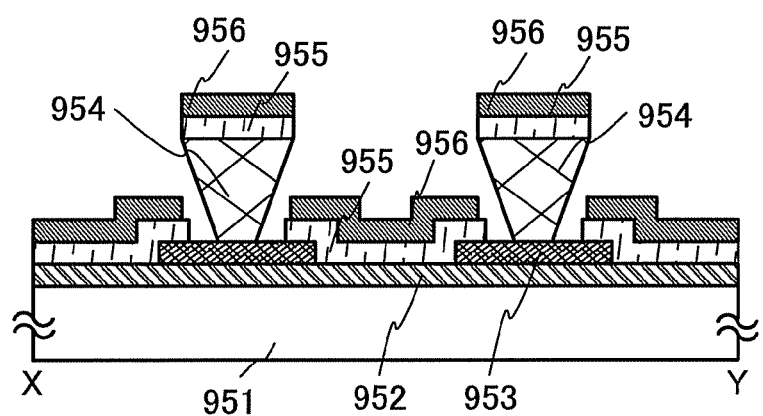

Although an active matrix light-emitting device is described in Embodiment 8, a passive matrix light-emitting device may alternatively be manufactured. FIGS. 4A and 4B illustrate a passive matrix type light-emitting device manufactured according to the present invention. FIG. 4A is a perspective view and FIG. 4B is a cross-sectional view along X-Y of FIG. 4A. In FIGS. 4A and 4B, an EL layer 955 is provided over a substrate 951 and between an electrode 952 and an electrode 956. An edge portion of the electrode 952 is covered with an insulating layer 953. A partition wall layer 954 is provided over the insulating layer 953. The sidewalls of the partition wall layer 954 are aslope so that a distance between the both sidewalls is gradually narrowed toward the surface of the substrate. That is, a cross section in a short-side direction of the partition layer 954 is a trapezoidal shape, and a bottom side (the side which faces a direction similar to a plane direction of the insulating layer 953 and is in contact with the insulating layer 953) is shorter than a top side (the side which faces a direction similar to the plane direction of the insulating layer 953 and is not in contact with the insulating layer 953). By the provision of the partition wall layer 954 in this manner, defects of the light-emitting element due to static charge or the like can be prevented. In the passive matrix light-emitting device also, low-power-consumption drive can be achieved by the provision of the light-emitting element of the present invention which can operate at low drive voltage.

Embodiment 9

Embodiment 9 describes an example in which an EL layer of a light-emitting element is formed by a method that is used for forming a film including the anthracene derivative of Embodiment 1 in accordance with a droplet discharging method, which is a wet process. Note that a method for forming a film in Embodiment 9 can be applied not just as the method for forming the EL layer of the light-emitting element but to forming of all the films that use the composition described in Embodiment 2 (the composition including at least the anthracene derivative of Embodiment 1 and a solvent).

FIGS. 5A to 5D and FIG. 6 are used in the description. FIGS. 5A to 5D illustrate steps for manufacturing a light-emitting element portion of the light-emitting device illustrated in FIGS. 3A and 3B or FIGS. 4A and 4B.

Figure 5A:
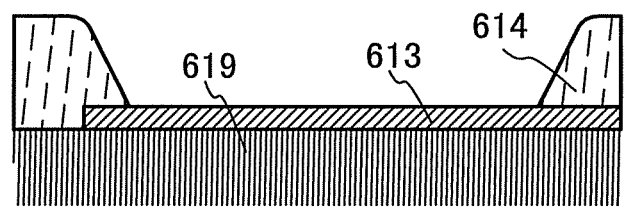
FIGS. 5A to 5D illustrate a method for manufacturing a light-emitting element using a wet process (Embodiment 14).
Figure 5B:
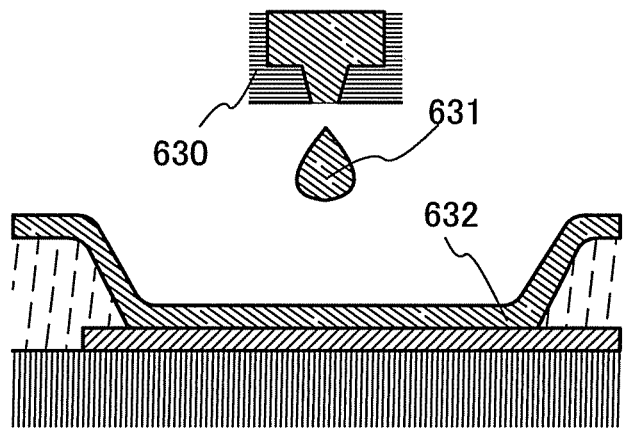
Figure 5C:
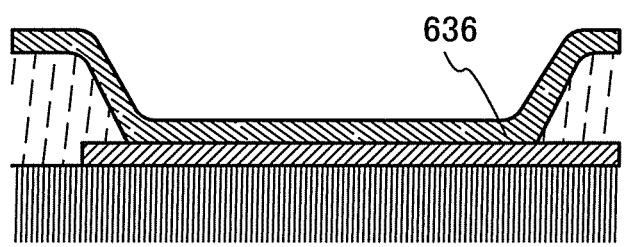
Figure 5D:
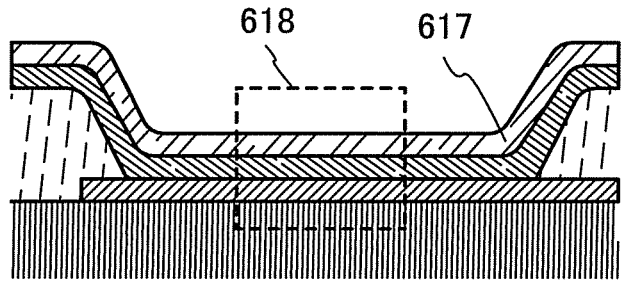

In FIG. 5A, the first electrode 613 is formed over an insulating layer 619, and the insulator 614 is formed so as to cover part of the first electrode 613. In a portion where the first electrode 613 is exposed, which is an opening of the insulating layer 614, a droplet 631 is discharged from a droplet discharge apparatus 630 to form a layer 632 including a composition. The droplet 631 is a composition including a solvent and the anthracene derivative of Embodiment 1, and dropped onto the first electrode 613 (see FIG. 5B). The solvent is removed from the layer 632 including the composition so that the layer 632 is solidified. Thus, a layer 636 including the anthracene derivative of Embodiment 1 is formed (see FIG. 5C). The solvent may be removed by drying or a heating step. In addition, the step of discharging the composition may be performed under reduced pressure. The second electrode 617 is formed over the layer 636 including the anthracene derivative of Embodiment 1, whereby a light-emitting element 618 is completed (see FIG. 5D). When the layer 636 including the anthracene derivative of Embodiment 1 is formed by a droplet discharging method as described above, the composition can be discharged as selected into a region where the layer is to be formed, and accordingly waste of material can be reduced. Furthermore, a photolithography process or the like for shaping is not needed, and thus, the process can be simplified and cost reduction can be achieved. Note that a functional layer may be provided by a droplet discharging method, an evaporation method, or the like between the first layer 613 and the layer 636 including the anthracene derivative of Embodiment 1, and/or between the layer 636 including the anthracene derivative of Embodiment 1 and the second electrode 617.

A droplet discharging means used in Embodiment 9 is generally a means which discharges liquid droplets, such as a nozzle having a composition discharge port, a head equipped with one or a plurality of nozzles.

Figure 6:
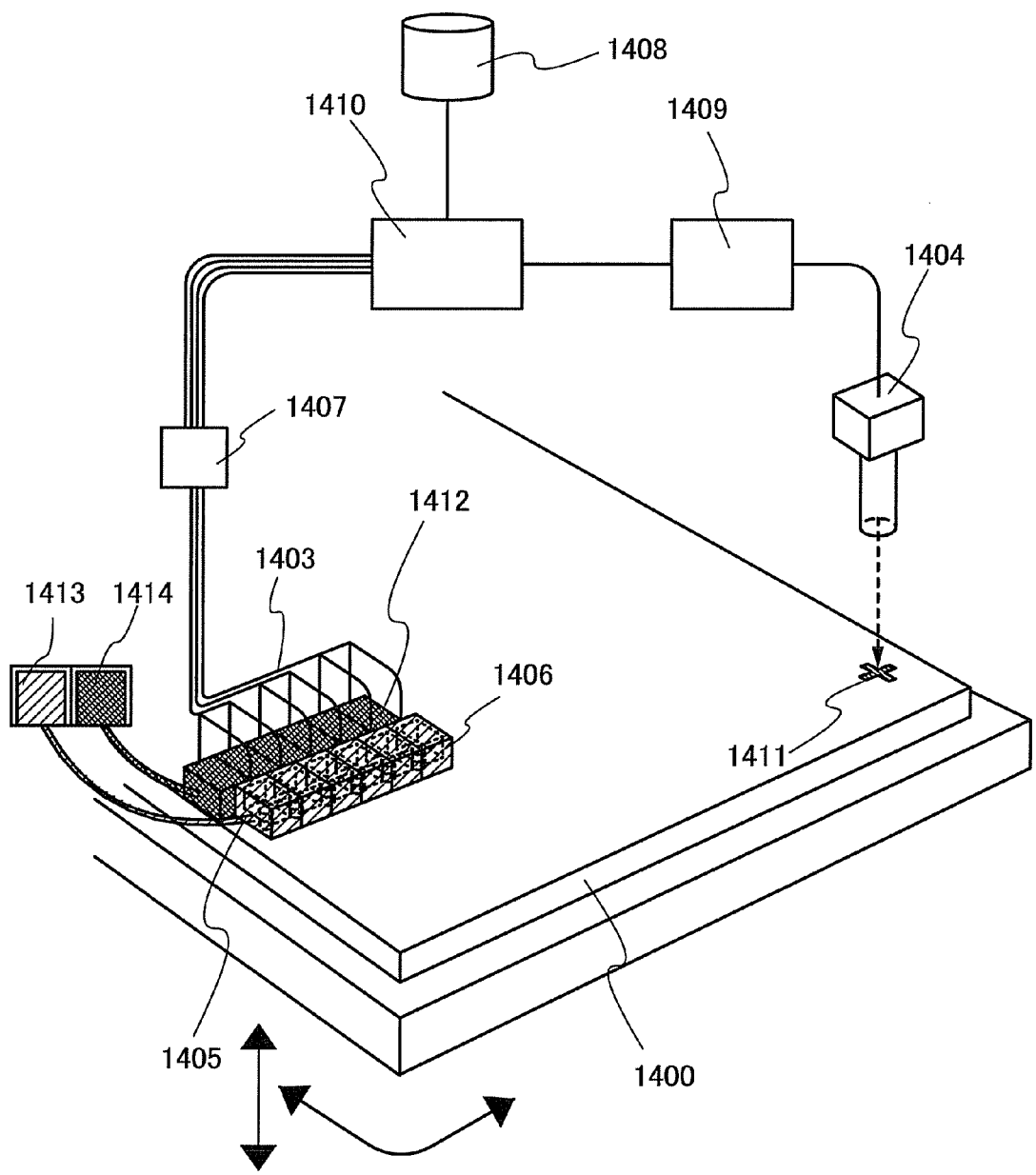
FIG. 6 illustrates an example of a droplet discharge apparatus (Embodiment 15).

One example of a droplet discharge apparatus used for a droplet discharging method is illustrated in FIG. 6. Each of heads 1405 and 1412 of a droplet discharging means 1403 is connected to a controlling means 1407. By controlling the heads using a computer 1410, a pattern that has been programmed by the computer can be written. The drawing position may be determined, for example, with reference to a mark 1411 that is formed over a substrate 1400. Alternatively, a reference point may be determined based on the edge of the substrate 1400. The reference point is detected by an imaging means 1404 and converted into a digital signal by an image processing means 1409. The digital signal is then recognized by the computer 1410, and a control signal is generated and sent to the controlling means 1407. An image sensor or the like using a charge coupled device (CCD) or a complementary metal oxide semiconductor (CMOS) can be used as the imaging means 1404. Data on a pattern to be formed over the substrate 1400 is stored in a storage medium 1408, and a control signal is transmitted to the controlling means 1407 based on the data, whereby each of the heads 1405 and 1412 of the droplet discharge means 1403 can be individually controlled. The material to be discharged is supplied to each of the heads 1405 and the heads 1412 through piping from a material supply source 1413 and a material supply source 1414.

The head 1405 includes a space which is filled with a liquid material as depicted by dashed lines 1406 and a nozzle which is a discharge port. The head 1412 has an internal structure, which is not illustrated, similar to that of the head 1405. When the nozzles of the head 1405 and the head 1412 are different in size, patterns with different widths can simultaneously be written using different materials. Each head can discharge a plurality of kinds of light-emitting materials or the like to draw a pattern. In the case of drawing a pattern over a large area, the same material can be simultaneously discharged from a plurality of nozzles in order to improve throughput. In the case of using a large size substrate, the heads 1405 and 1412 can scan freely over the substrate in directions of arrows, and therefore a region where a pattern is drawn can be set freely. Accordingly, a plurality of the same patterns can be drawn over one substrate.

In addition, the step of discharging the composition may be performed under reduced pressure. Also, the substrate may be heated when the composition is discharged. After the discharge of the composition, one of or both drying and baking steps are carried out. Both the drying and baking steps involve heat treatment but are different in purpose, temperature, and time period. Note that the drying and baking steps are performed under normal pressure or reduced pressure using laser irradiation, rapid thermal annealing, heating furnace, or the like. Further, there are no particular limitation on the timing of performing the heat treatment and the number of times of the heat treatment. The preferable temperatures of the drying and baking steps depend on the material of the substrate and the property of the composition.

Embodiment 10

In Embodiment 10, electronic appliances of the present invention each of which includes the light-emitting device described in Embodiment 8 are described. An electronic appliance according to an embodiment of the present invention includes the anthracene derivative of Embodiment 1 and therefore can have a display portion with excellent color reproducibility and high display quality.

Examples of electronic appliances each manufactured using the anthracene derivative of Embodiment 1 include cameras such as video cameras or digital cameras, goggle type displays, navigation systems, audio playback devices (e.g., car audio systems and other audio systems), computers, game machines, portable information terminals (e.g., mobile computers, cellular phones, portable game machines, and electronic books), image playback devices provided with recording media (devices that are capable of playing back recording media such as digital versatile discs (DVDs) and equipped with display devices that can display the image), and the like. Some specific examples thereof are shown in FIGS. 7A to 7D.

Figure 7A:
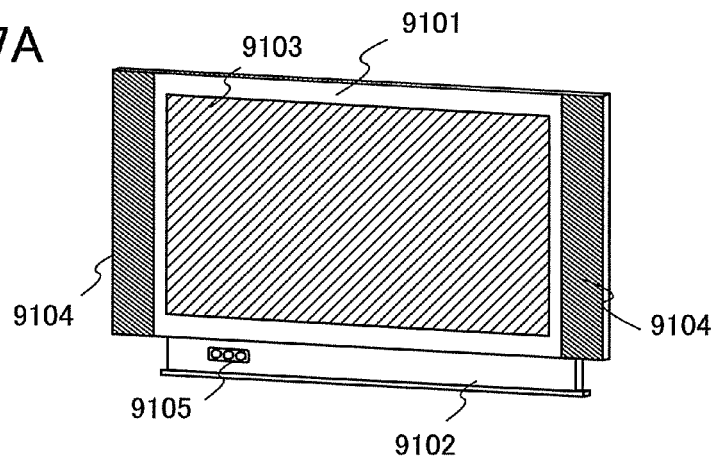
FIGS. 7A to 7D each illustrate an electronic appliance (Embodiment 16).

FIG. 7A illustrates a television device which includes a housing 9101, a supporting base 9102, a display portion 9103, speaker portions 9104, video input terminals 9105, and the like. In the display portion 9103 of this television device, light-emitting elements similar to those described in any of Embodiments 3 to 6 are arranged in matrix. The light-emitting elements are capable of emitting light of favorable colors. Accordingly, the television device having the display portion 9103 including the light-emitting elements can have excellent color reproducibility and high display quality.

Figure 7B:
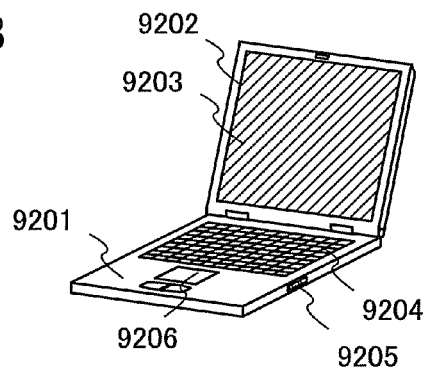

FIG. 7B illustrates a computer according to an embodiment of the present invention, which includes a main body 9201, a housing 9202, a display portion 9203, a keyboard 9204, an external connection port 9205, a pointing device 9206, and the like. In the display portion 9203 of this computer, light-emitting elements similar to those described in any of Embodiments 3 to 6 are arranged in matrix. The light-emitting elements are capable of emitting light of favorable colors. Accordingly, the computer having the display portion 9203 including the light-emitting elements can have excellent color reproducibility and high display quality.

Figure 7C:
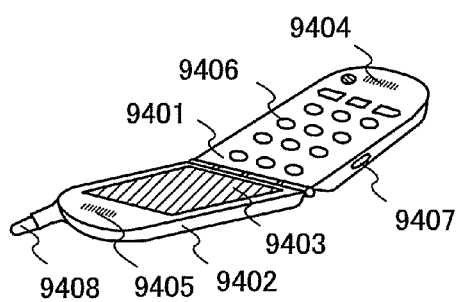

FIG. 7C illustrates a cellular phone according to an embodiment of the present invention, which includes a main body 9401, a housing 9402, a display portion 9403, an audio input portion 9404, an audio output portion 9405, operation keys 9406, an external connection port 9407, an antenna 9408, and the like. In the display portion 9403 of this cellular phone, light-emitting elements similar to those described in any of Embodiments 3 to 6 are arranged in matrix. The light-emitting elements are capable of emitting light of favorable colors. Accordingly, the cellular phone having the display portion 9403 including the light-emitting elements can have excellent color reproducibility and high display quality.

Figure 7D:
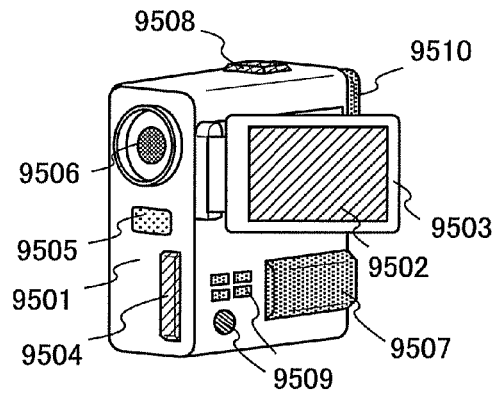

FIG. 7D illustrates a camera according to an embodiment of the present invention, which includes a main body 9501, a display portion 9502, a housing 9503, an external connection port 9504, a remote control receiving portion 9505, an image receiving portion 9506, a battery 9507, an audio input portion 9508, operation keys 9509, an eye piece portion 9510, and the like. In the display portion 9502 of this camera, light-emitting elements similar to those described in any of Embodiments 3 to 6 are arranged in matrix. The light-emitting elements are capable of emitting light of favorable colors. Accordingly, the camera having the display portion 9502 including the light-emitting elements can have excellent color reproducibility and high display quality.

As set forth above, the application range of the light-emitting device described in Embodiment 8 is so wide that the light-emitting device can be applied to electronic appliances of every field. By the use of the anthracene derivative of Embodiment 1, the electronic appliance having the display portion which can perform high-quality display with excellent color reproducibility can be obtained.

The light-emitting device of Embodiment 8 can also be used as a lighting apparatus. An example in which the light-emitting device of Embodiment 8 is used as a lighting apparatus is described with reference to FIG. 8.

Figure 8:
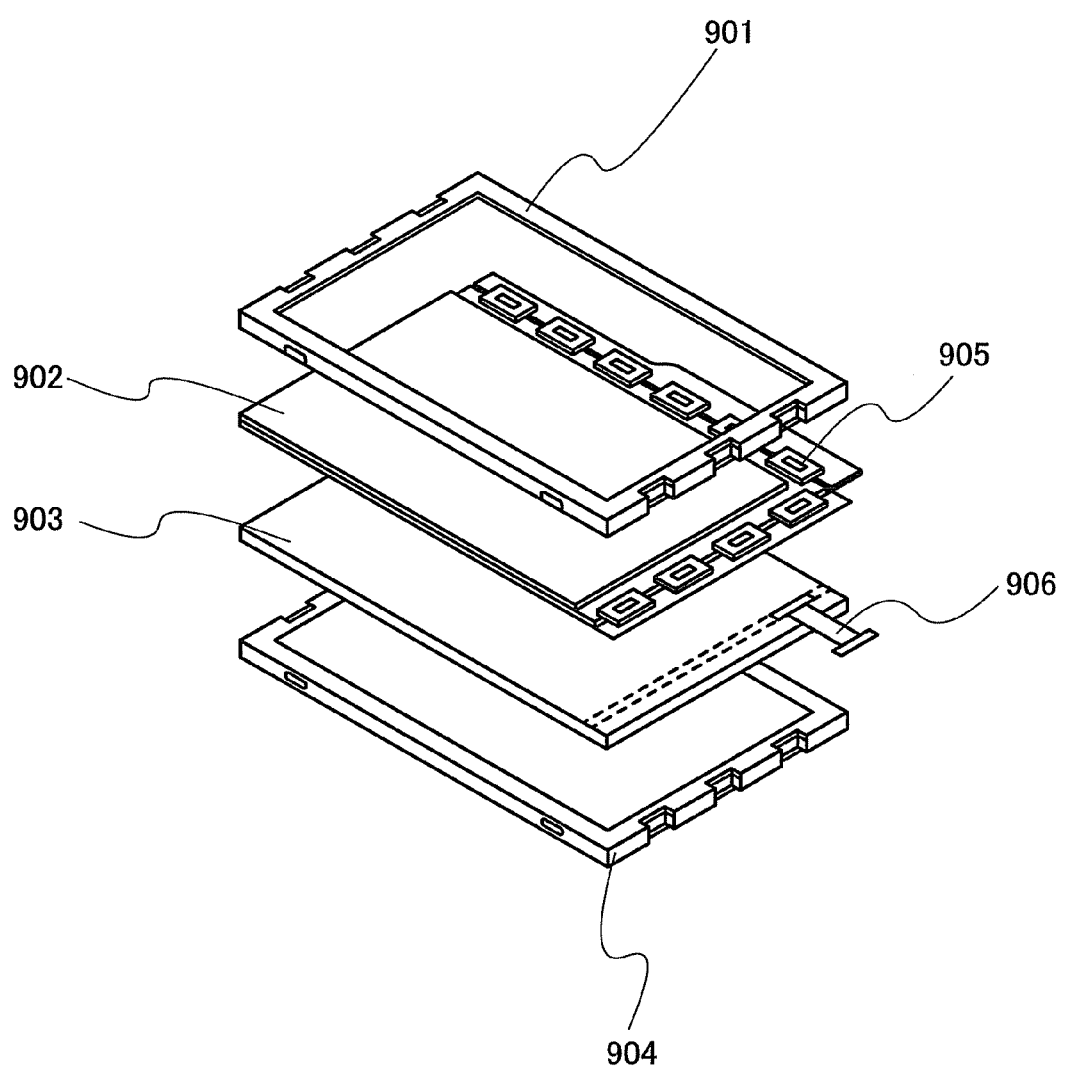
FIG. 8 illustrates an electronic appliance (Embodiment 17).

FIG. 8 illustrates an example of a liquid crystal display device using the light-emitting device of Embodiment 8 as a backlight. The liquid crystal display device illustrated in FIG. 8 includes a housing 901, a liquid crystal layer 902, a backlight unit 903, and a housing 904. The liquid crystal layer 902 is connected to a driver IC 905. The light-emitting device of Embodiment 8 is used as the backlight unit 903, to which current is supplied through a terminal 906.

By the use of the light-emitting device of Embodiment 8 as the backlight of the liquid crystal display device, the backlight consumes less electric power. Further, the light-emitting device of Embodiment 8 is a lighting apparatus with plane light emission and can have a large area. Therefore, the backlight can have a large area, and a liquid crystal display device having a large area can be obtained. Furthermore, since the light-emitting device of Embodiment 8 is thin, it becomes possible to reduce the thickness of a display device.

Figure 9:
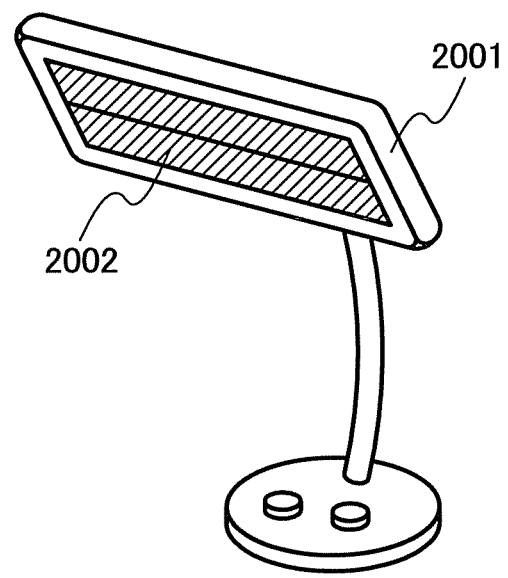
FIG. 9 illustrates a lighting apparatus (Embodiment 18).

FIG. 9 illustrates an example in which the light-emitting device of Embodiment 8 is used as a table lamp, which is a kind of lighting apparatus. The table lamp illustrated in FIG. 9 includes a housing 2001 and a light source 2002, and the light-emitting device of Embodiment 8 is used as the light source 2002.

Figure 10:
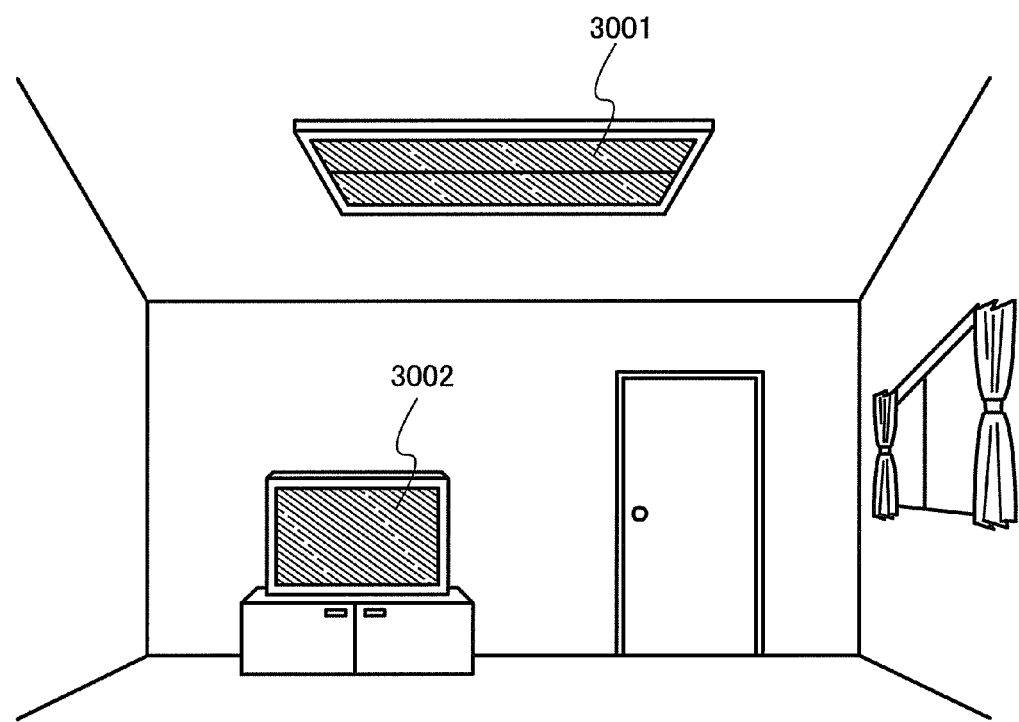
FIG. 10 illustrates a lighting apparatus (Embodiment 19).

FIG. 10 illustrates an example in which the light-emitting device of Embodiment 8 is used as an indoor lighting apparatus 3001. Since the light-emitting device of Embodiment 8 can have a large area, the light-emitting device can be used as a large-area lighting apparatus. Further, since the light-emitting device of Embodiment 8 is thin, the light-emitting device of Embodiment 8 can be used for a lighting apparatus having reduced thickness. In a room where the light-emitting device of Embodiment 8 is used as the indoor lighting apparatus 3001 in this manner, a television device 3002 according to an embodiment of the present invention, as the one illustrated in FIG. 7A, is placed so that public broadcasting and movies can be watched.

Example 1

Example 1 describes a synthesis method for forming 9-(9, 10-diphenyl-2-anthryl)-9H-carbazole (abbreviation: 2CzPA), which is the anthracene derivative represented by Structure Formula (1) in Embodiment 1.

First, a synthesis method for forming 2-bromo-9,10-diphenylanthracene, which is the material thereof, is described.

Step 1: Synthesis of 2-bromo-9,10-anthraquinone

First, 46 g (206 mmol) of Copper(II) bromide and 500 mL of acetonitryl were put into a 1 L three-neck flask, and 17.3 g (168 mmol) of tert-butyl nitrite was added thereto. While this mixture was heated at 65° C., 25 g (111 mmol) of 2-amino-9,10-anthraquinone was added to the mixture. This mixture was stirred for six hours at the same temperature. After the stirring, this reaction solution was poured into about 500 mL (3.0 mol/L) of hydrochloric acid and this mixture was stirred for 3 hours. After the stirring, the mixture including precipitate was filtered and the residue was washed with water and ethanol. After the washing, the residue was dissolved in toluene and this solution was subjected to suction filtration through Florisil (produced by Wako Pure Chemical Industries, Ltd., Catalog No. 540-00135), Celite (produced by Wako Pure Chemical Industries, Ltd., Catalog No. 531-16855), and alumina. The obtained filtrate was concentrated, so that a solid substance was obtained. The obtained solid substance was recrystallized with chloroform/hexane, so that 18.6 g of a light-yellow powdered solid substance, 2-bromo-9,10-anthraquinone, which was the object of the synthesis, was obtained in 58% yield. The synthesis scheme of Step 1 is shown by (a-1) below.

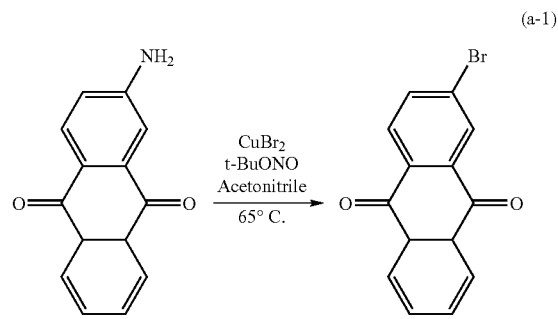 [SMILES: Nc1ccc2c(c1)C(=O)C1C=CC=CC1C2=O ; O=C1c2ccc(Br)cc2C(=O)C2C=CC=CC12]

(a-1)

Step 2: Synthesis of 2-bromo-9,10-diphenylantracene

First, 4.90 g (17.0 mmol) of 2-bromo-9,10-anthraquinone obtained in Step 1 was put into a 300 mL three-neck flask, the atmosphere in the flask was substituted by nitrogen, and then 100 mL of tetrahydrofuran (THF) was added thereto. Then, 17.8 mL (37.3 mmol) of phenyllithium was dropped into this solution. After the drop, this solution was stirred at room temperature for 15 hours. After the stirring, the solution was washed with water and an aqueous layer was extracted with ethyl acetate. The extracted solution and an organic layer were dried with magnesium sulfate. After the mixture was dried, the mixture was subjected to gravity filtration, and the filtrate was concentrated, so that 2-bromo-9,10-diphenylanthracene-9,10-diol was obtained. All of the obtained 2-bromo-9,10-diphenylanthracene-9,10-diol, 5.06 g (30.5 mmol) of potassium iodide, 9.70 g (91.5 mmol) of sodium phosphinate monohydrate, and 50 mL of glacial acetic acid were put into a 500 mL three-neck flask, and the mixture was stirred at 120° C. for 2 hours. After the stirring, 30 mL of 50% phosphinic acid was added to the mixture, and the mixture was further stirred for 1 hour at 120° C. After the stirring, the solution was washed with water, and an aqueous layer was extracted with ethyl acetate. The extracted solution and an organic layer were dried with magnesium sulfate, subjected by gravity filtration, and then the obtained filtrate was concentrated to obtain a light-yellow solid substance. The solid substance was dissolved in toluene, and the solution was subjected to suction filtration through Celite (produced by Wako Pure Chemical Industries, Ltd., Catalog No. 531-16855), Florisil (produced by Wako Pure Chemical Industries, Ltd., Catalog No. 540-00135), and alumina. The obtained filtrate was concentrated to obtain a solid substance and the solid substance was then recrystallized with chloroform/hexane; thus, 5.1 g of 2-bromo-9,10-diphenylantracene as a light-yellow powdered solid substance, which was the object of the synthesis, was obtained in 74% yield. The synthesis scheme of Step 2 is shown in (a-2).

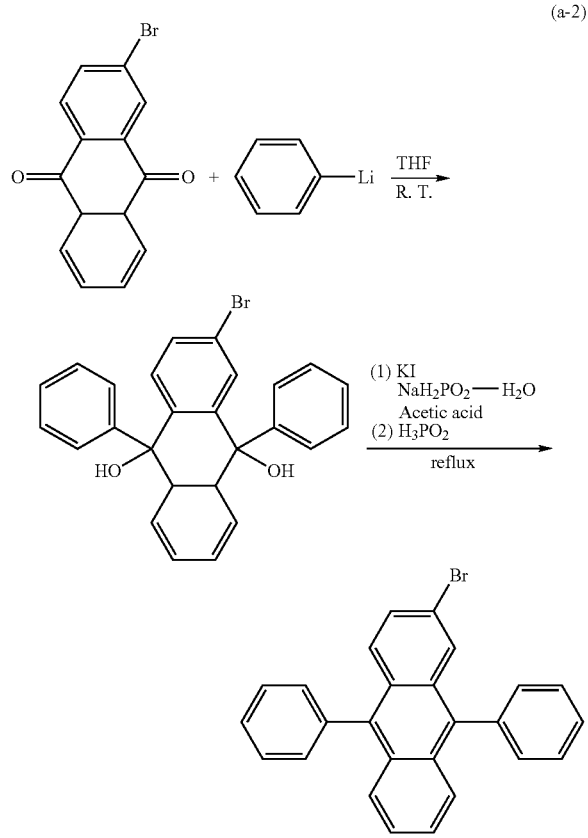

(a-2)

In this manner, 2-bromo-9,10-diphenylanthracene, which is the material, was obtained. Next, the synthesis method for forming 9-(9,10-diphenyl-2-anthryl)-9H-carbazole (abbreviation: 2CzPA), which is the anthracene derivative of Embodiment 1, is described.

Step 3: Synthesis of
9-(9,10-diphenyl-2-anthryl)-9H-carbazole
(abbreviation: 2CzPA)

First, 1.5 g (3.7 mmol) of 2-bromo-9,10-diphenylanthracene, which was obtained in Step 2, 610 mg (3.7 mmol) of 9H-carbazole, and 1.5 g (16 mmol) of sodium tert-butoxide were put into a 100 mL three-neck flask, and the atmosphere in the flask was substituted by nitrogen. Then, 20 mL of toluene and 0.10 mL of tri(tert-butyl)phosphine (10 wt % hexane solution) were added to this mixture. This mixture was deaerated while being stirred under reduced pressure, and after the deaeration, 58 mg (0.10 mmol) of bis(dibenzylideneacetone)palladium(0) was added. This mixture was refluxed at 110° C. for 5 hours. After the reflux, this mixture was cooled down to room temperature and approximately 20 mL of toluene was added to this mixture. The mixture was then filtered through alumina, Celite (produced by Wako Pure Chemical Industries, Ltd., Catalog No. 531-16855), and Florisil (produced by Wako Pure Chemical Industries, Ltd., Catalog No. 540-00135). The obtained filtrate was concentrated, so that a light-brown oily substance was obtained. This oily substance was purified by a silica gel column chromatography (a developing solvent was a mixed solvent of hexane: toluene=6:4) to obtain a light-yellow solid substance. The obtained light-yellow solid substance was recrystallized with ethanol, so that 1.7 g of a light-yellow powdered solid substance was obtained in 93% yield. At a pressure of 8.7 Pa and with an argon gas flowing with a flow rate of 3.0 mL/min, 1.6 g of the obtained light-yellow powdered solid substance was heated at 230° C. so as to be sublimated and purified (a train sublimation method). After the sublimation purification, 1.5 g of a light-yellow solid substance was obtained in 93% yield. The synthesis scheme of Step 3 is shown in (a-3).

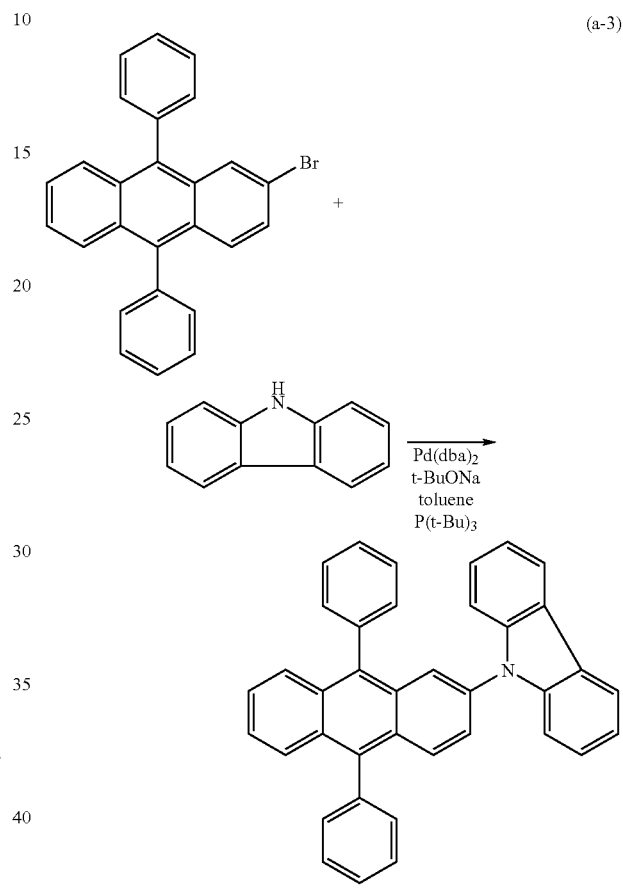

(a-3)

The obtained light-yellow powdered solid substance was analyzed by nuclear magnetic resonance measurements ($^1$H NMR). Then, it was confirmed that this light-yellow powdered solid substance was 9-(9,10-diphenyl-2-anthryl)-9H-carbazole (abbreviation: 2CzPA), which was the object of the synthesis. The measurement results are as follows.

$^1$H NMR (CDCl$_3$, 300 MHz): δ=7.37-7.44 (m, 8H), 7.51-7.66 (m, 11H), 7.73-7.76 (m, 2H), 7.88 (d, J=1.8 Hz, 1H), 7.91 (d, J=9.3 Hz, 1H), 8.11 (d, J=7.8 Hz, 2H).

Figure 12A:
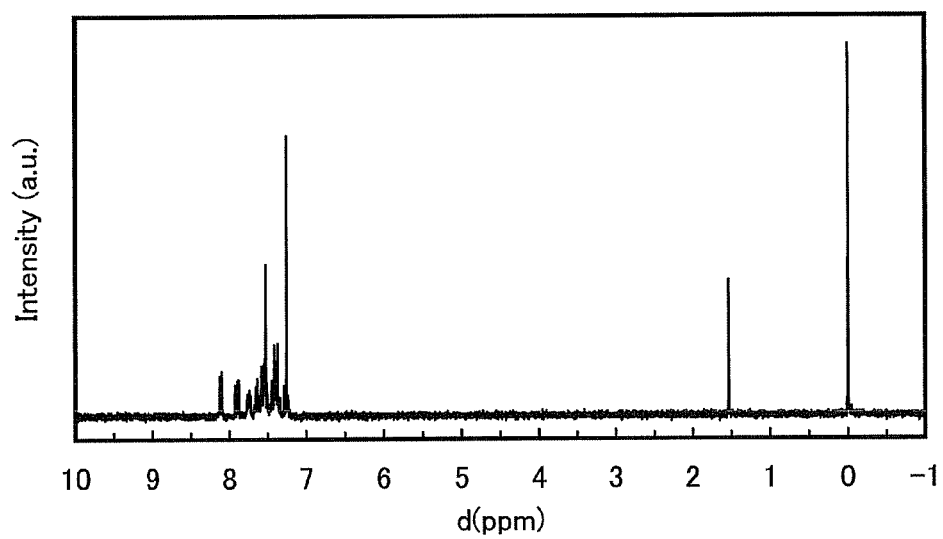
FIGS. 12A and 12B are each 1H-NMR chart of 2CzPA produced in Example 1.
Figure 12B:
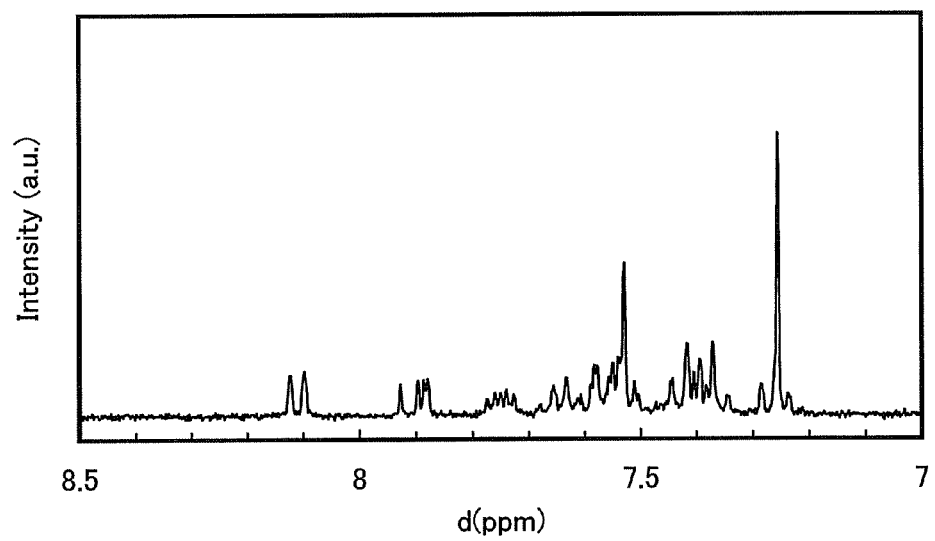

FIGS. 12A and 12B are the $^1$H NMR charts. Note that FIG. 12B is a chart showing an enlarged portion of FIG. 12A in the range of 7.0 ppm to 8.5 ppm.

Thermogravimetry-differential thermal analysis (TG-DTA) of the obtained 2CzPA was performed. The analysis was conducted using a high vacuum differential type differential thermal balance (manufactured by Bruker AXS K.K., TG/DTA 2410SA) under normal pressure, with a temperature-rising speed of 10° C./min, and under nitrogen stream (flow rate 200 mL/min). It was then found from the relationship between the weight and temperature (thermogravimetry) that the 5% weight loss temperature was 379° C.

Figure 13:
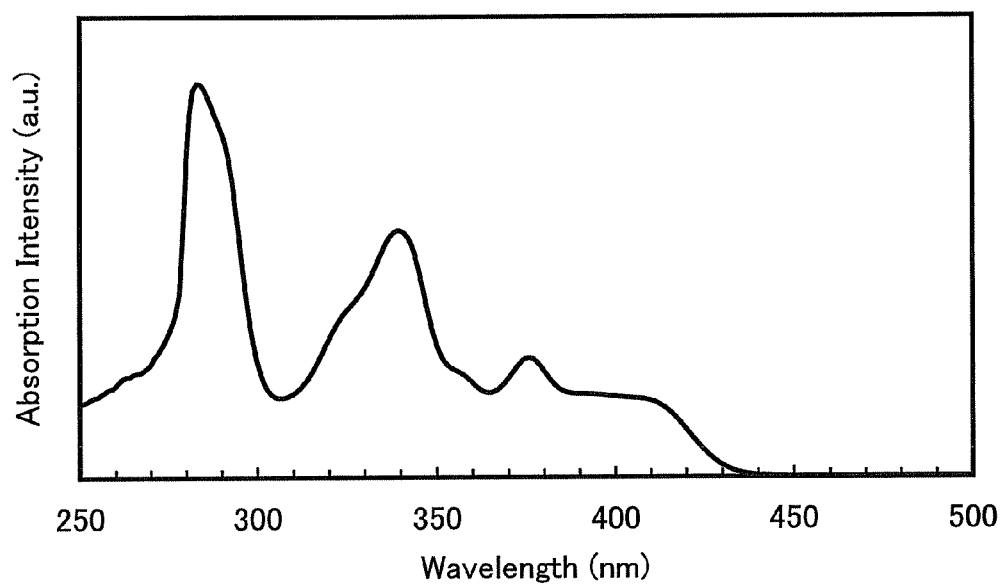
FIG. 13 shows an absorption spectrum of a toluene solution of 2CzPA produced in Example 1.
Figure 14:
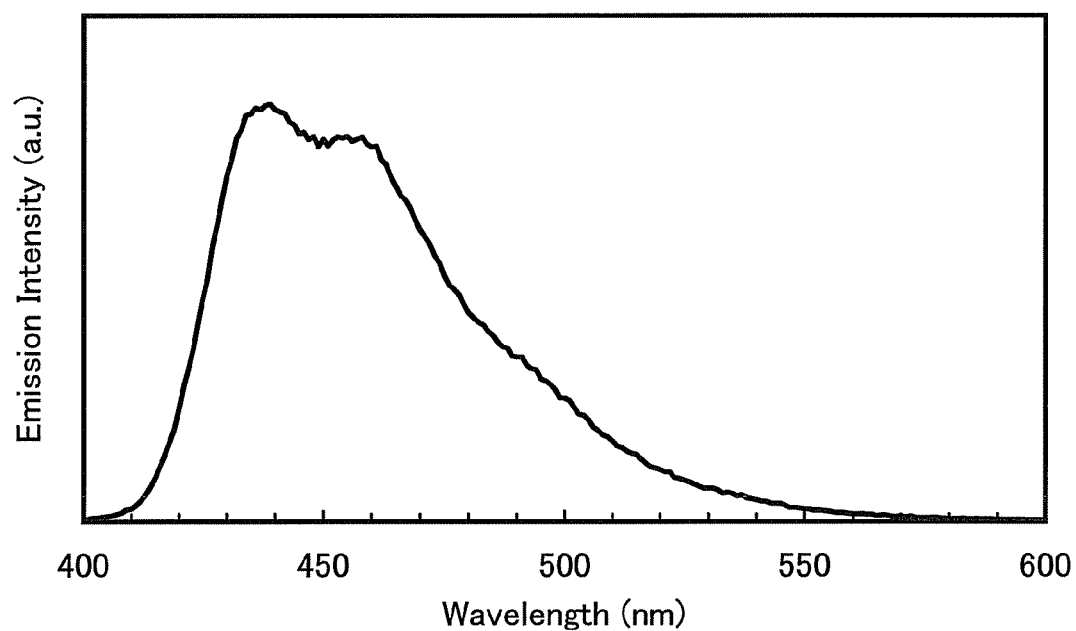
FIG. 14 shows an emission spectrum of a toluene solution of 2CzPA produced in Example 1.
Figure 15:
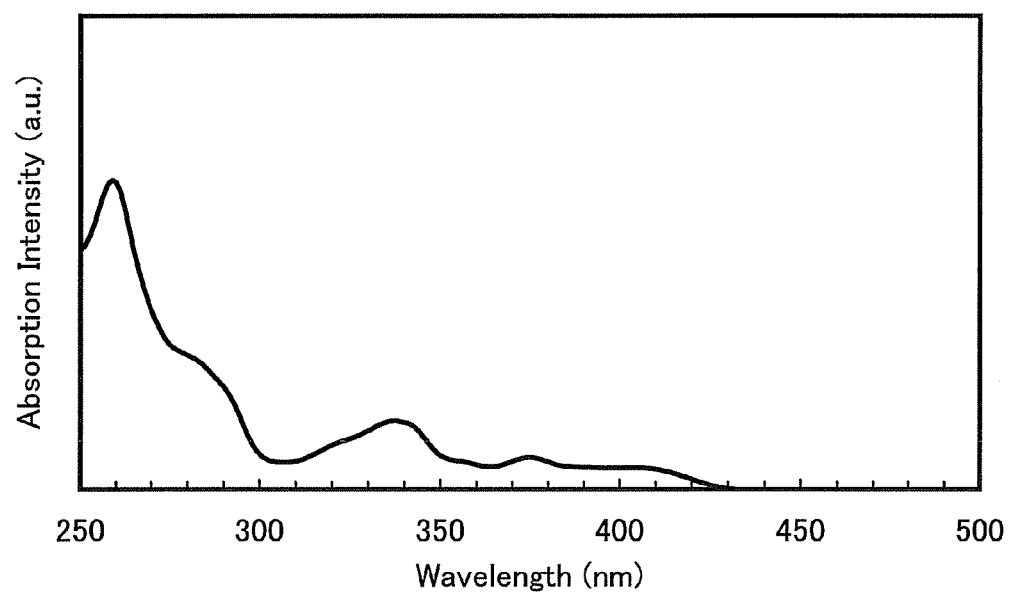
FIG. 15 shows an absorption spectrum of a dioxane solution of 2CzPA produced in Example 1.
Figure 16:
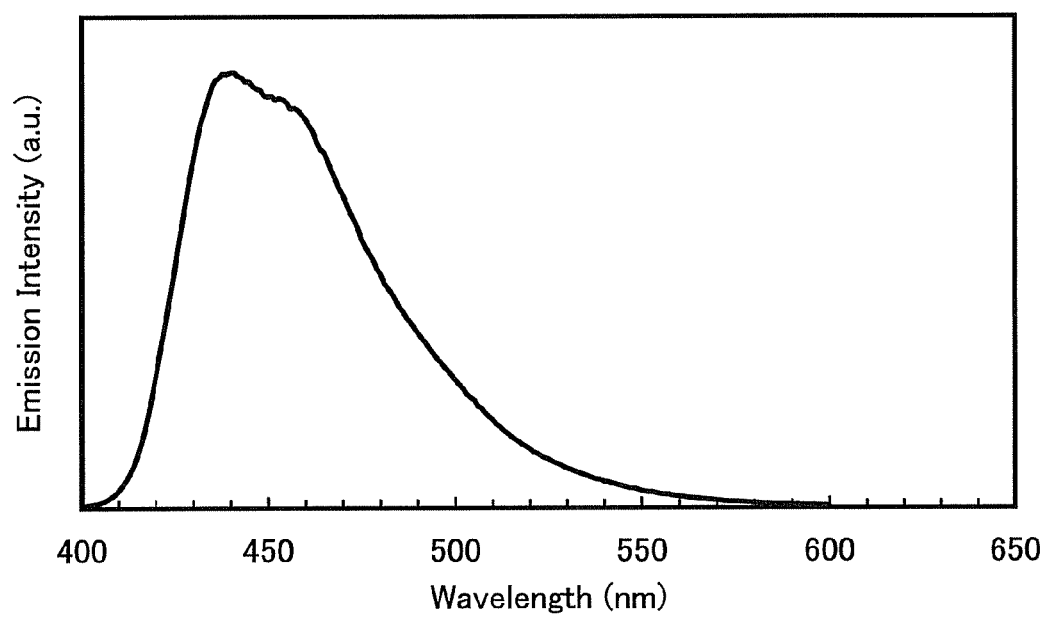
FIG. 16 shows an emission spectrum of a dioxane solution of 2CzPA produced in Example 1.

FIG. 13 shows an absorption spectrum of 2CzPA in a toluene solution and FIG. 14 shows an emission spectrum thereof. FIG. 15 shows an absorption spectrum of 2CzPA in a dioxane solution and FIG. 16 shows an emission spectrum thereof. An ultraviolet-visible spectrophotometer (V-550, manufactured by JASCO Corporation) was used for the measurement. Each solution was put in a quartz cell. The absorption spectrum of 2CzPA in the toluene solution shown in the figure was obtained by subtracting the absorption spectra of the quartz cell and toluene from the total absorption spectrum. The absorption spectrum of 2CzPA in the dioxane solution shown in the figure was obtained by subtracting the absorption spectra of the quartz cell and dioxane from the total absorption spectrum. In each of FIG. 13, FIG. 14, FIG. 15, and FIG. 16, the horizontal axis shows wavelength (nm) and the vertical axis shows intensity (arbitrary unit). In the case of the toluene solution, the absorption was observed at around 283 nm, around 339 nm, around 376 nm, and around 412 nm as shown in FIG. 13. In the case of the dioxane solution, the absorption was observed at around 212 nm, around 238 nm, around 259 nm, around 338 nm, and around 375 nm as shown in FIG. 15. In the case of the toluene solution, the maximum emission wavelength was 440 nm (excitation wavelength: 370 nm) as shown in FIG. 14. In the case of the dioxane solution, the maximum emission wavelength was 441 nm (excitation wavelength: 370 nm) as shown in FIG. 16. On the other hand, 9-10-diphenylanthracene-2,6-diyl-9,9'-bi(9H-carbazole) (Compound 1), which is described in Patent Document 1, in a dioxane solution has a maximum emission wavelength of 456 nm. Therefore, it is clear that 2CzPA according to an embodiment of the present invention emits light with a shorter wavelength than Compound (1) described in Patent Document 1. From the above, it is also clear that the light emission of a compound in which the 9-position of a carbazole derivative is bonded to only the 2-position of anthracene has a shorter wavelength and exhibits better blue color than that of a compound in which two of the same carbazole derivative skeletons are bonded to the 2-position and the 6-position of anthracene.

Figure 17:
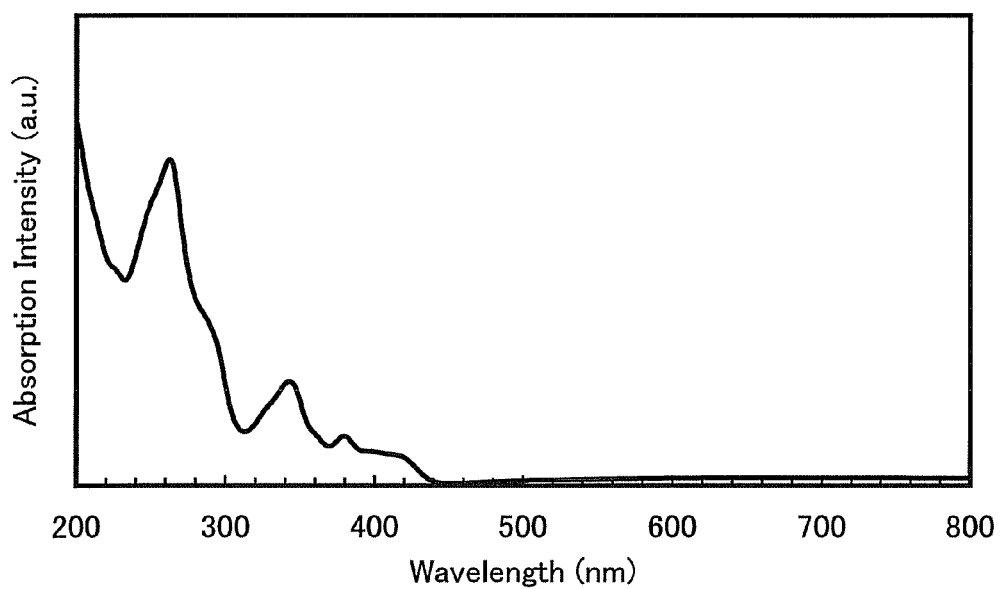
FIG. 17 shows an absorption spectrum of a thin film of 2CzPA produced in Example 1.
Figure 18:
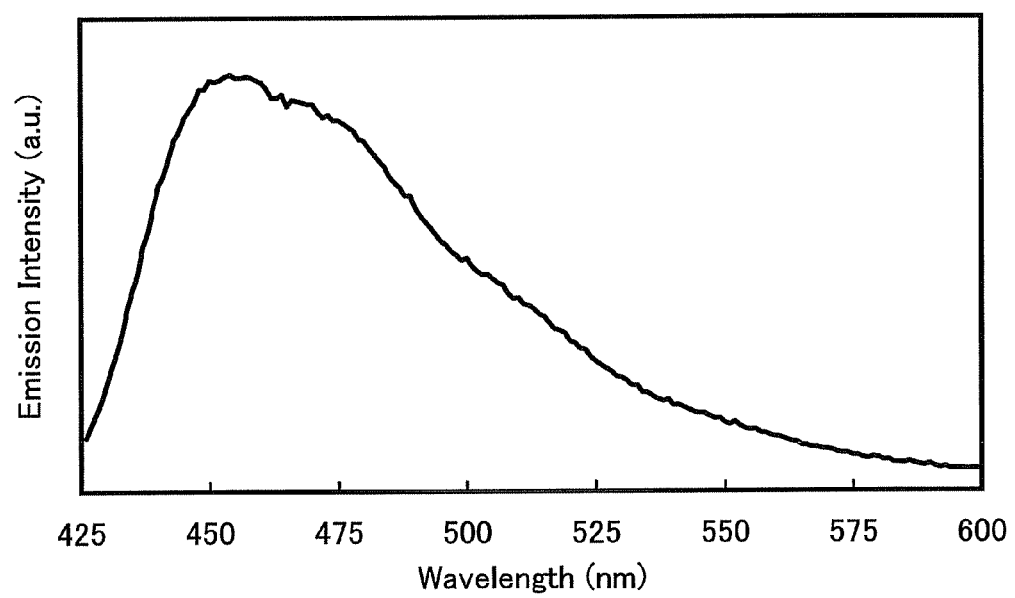
FIG. 18 shows an emission spectrum of the thin film of 2CzPA produced in Example 1.

FIG. 17 shows an absorption spectrum of a thin film of 2CzPA and FIG. 18 shows an emission spectrum thereof. An ultraviolet-visible spectrophotometer (V-550, manufactured by JASCO Corporation) was used for the measurement. A sample was manufactured by evaporation of the thin film on a quartz substrate, and the absorption spectrum thereof, from which the absorption spectrum of quartz is subtracted, is shown in the figure. In FIG. 17, the horizontal axis shows wavelength (nm) and the vertical axis shows absorption intensity (arbitrary unit). In FIG. 18, the horizontal axis shows wavelength (nm), and the vertical axis shows emission intensity (given unit). The absorption of the thin film of 2CzPA was observed at around 263 nm, around 343 nm, around 379 nm, and around 410 nm. In addition, in the case of the thin film, the maximum emission wavelength was 454 nm (excitation wavelength: 410 nm).

In this manner, it was found that either a solution or a thin film of 2CzPA, which is the anthracene derivative of Embodiment 1, emits excellent blue light with a sufficiently short wavelength.

Further, the oxidation reaction characteristic and reduction reaction characteristic of 2CzPA were measured. The oxidation reaction characteristic and reduction reaction characteristic were measured by cyclic voltammetry (CV). Note that an electrochemical analyzer (ALS model 600A, product of BAS Inc.) was used for the measurements.

The solution used for the CV measurements was prepared in such a manner that a supporting electrolyte of tetra-n-butylammonium perchlorate (n-$Bu_4NClO_4$) (product of Tokyo Chemical Industry Co., Ltd., catalog number: T0836) was dissolved in a solvent, which is dehydrated N,N-dimethylformamide (DMF) (product of Sigma-Aldrich Corp., 99.8%, catalog number: 22705-6), at a concentration of 100 mmol/L and the object to be measured was further dissolved therein at a concentration of 1 mmol/L. A platinum electrode (a PTE platinum electrode, product of BAS Inc.) was used as a working electrode. A platinum electrode (a VC-3 Pt counter electrode (5 cm), product of BAS Inc.) was used as a counter electrode. An Ag/$Ag^+$ electrode (an RE5 non-aqueous solvent type reference electrode, product of BAS Inc.) was used as a reference electrode. The measurements were carried out at room temperature. The scan speed at these CV measurements was set at 0.1 V/s.

The reduction reaction characteristic of 2CzPA was examined by 100 cycles of measurements; one cycle is a scan in which the potential of the working electrode with respect to the reference electrode is changed from −1.0 V to −2.5 V and then changed from −2.5 V to −1.0 V. The oxidation reaction characteristic of 2CzPA was examined in a similar manner by 100 cycles of measurements; one cycle is a scan in which the potential of the working electrode with respect to the reference electrode is changed from 0 V to 1.5 V and then changed from 1.5 V to 0 V.

Figure 19A:
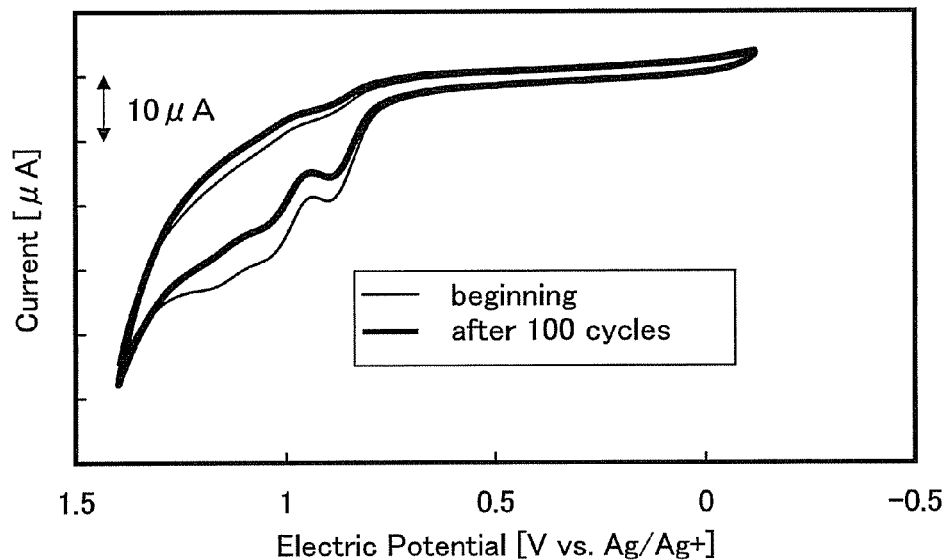
FIGS. 19A and 19B show cyclic voltammetry measurement results of 2CzPA produced in Example 1.
Figure 19B:
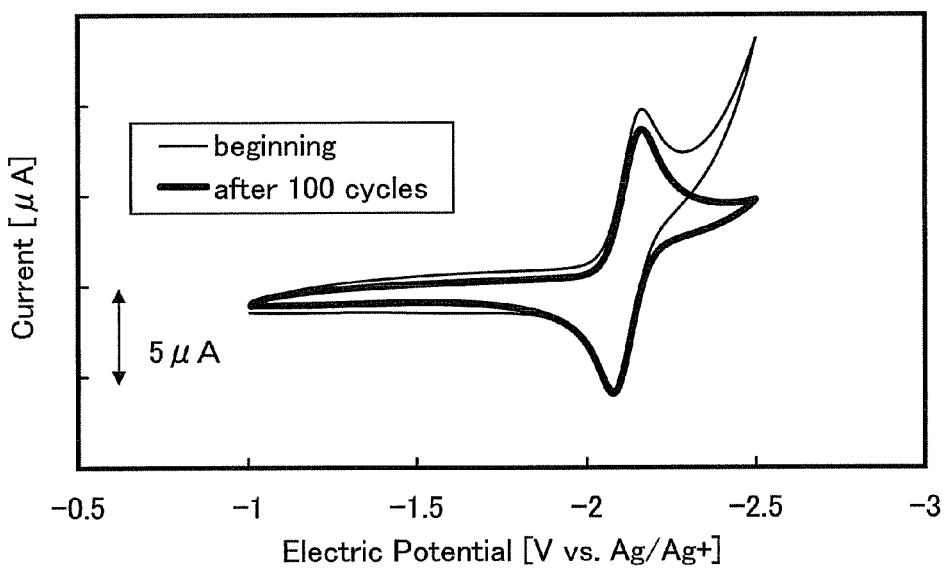

FIG. 19A shows CV measurement results on the oxidation reaction characteristic of 2CzPA and FIG. 19B shows CV measurement results on the reduction reaction characteristic of 2CzPA. In each of FIGS. 19A and 19B, the horizontal axis shows potential (V) of the working electrode with respect to the reference electrode, and the vertical axis shows a value (μA) of current flowing between the working electrode and a counter electrode.

The current indicating oxidation is observed at around 0.9 V (vs. Ag/Ag+) in FIG. 19A and the current indicating reduction is observed at around −2.16 V (vs. Ag/Ag+) in FIG. 19B.

Although the scan was repeated as many as 100 cycles, 2CzPA showed no significant change in the peak position and peak intensity of the CV curves representing the oxidation reaction and the reduction reaction. The peak intensity remained 81% of the initial state on the oxidation side and 89% of the initial state on the reduction side. Thus, it is understood that 2CzPA is stable even when an oxidation reaction from a neutral state to an oxidation state and a reduction reaction from the oxidation state to the neutral state are repeated and when a reduction reaction from a neutral state to a reduction state and an oxidation reaction from the reduction state to the neutral state are repeated.

The results of measuring the thin film of 2CzPA by photoelectron spectrometry (AC-2, product of Riken Keiki Co., Ltd.) in the atmosphere indicated that the HOMO level of 2CzPA was −5.68 eV. The Tauc plot of the absorption spectrum shown in FIG. 17 revealed that the absorption edge was 2.86 eV. Therefore, the energy gap of 2CzPA in the solid state is estimated to be 2.86 eV, which means that the LUMO level of 2CzPA is −2.82 eV. As thus described, it is understood that 2CzPA has a large energy gap of 2.86 eV even in the solid state.

Example 2

Example 2 describes a light-emitting element using the anthracene derivative of Embodiment 1 for a light emission center material.

Figure 11A:
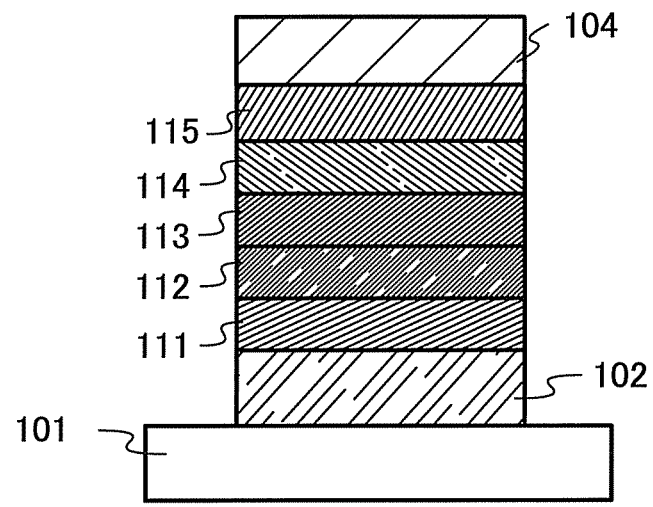
FIGS. 11A and 11B are conceptual diagrams of light-emitting elements fabricated in Example 2.

Molecular structures of organic compounds (except 2CzPA) used in Example 2 are represented by Structure Formulae (i), (ii), and (iii) below. An element structure of the light-emitting element is shown in FIG. 11A.

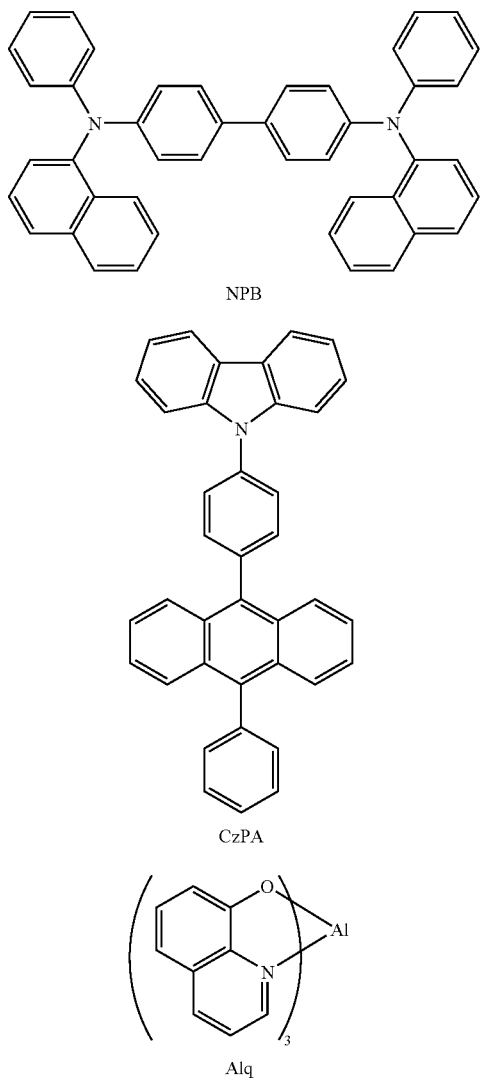

<<Fabrication of Light-Emitting Element 1>>

First, a glass substrate 101 over which indium tin oxide including silicon (ITSO) with a thickness of 110 nm has been formed as a first electrode 102 serving as an anode was prepared. The periphery of a surface of the ITSO was covered with a polyimide film so that the electrode area was 2 mm×2 mm. As pretreatment for forming the light-emitting element over the substrate 101, the surface of the substrate was washed with water and baked at 200° C. for 1 hour and then subjected to UV ozone treatment for 370 seconds. Then, the substrate 101 was transferred into a vacuum evaporation apparatus in which the pressure was reduced to about $10^{-4}$ Pa, and vacuum baking at 170° C. for 30 minutes was conducted in a heating chamber of the vacuum evaporation apparatus, and then the substrate 101 was cooled down for about 30 minutes.

Then, the substrate was fixed on a holder provided in the vacuum evaporation apparatus such that the surface of the substrate provided with ITSO faces downward.

After the pressure in the vacuum evaporation apparatus was reduced to $10^{-4}$ Pa, 4,4'-bis[N-(1-naphthyl)-N-phenylamino]biphenyl (abbreviation: NPB) represented by the above Structure Formula (i), and molybdenum(VI) oxide were co-evaporated with a mass ratio of NPB:molybdenum (VI) oxide=4:1, whereby a hole-injecting layer 111 was formed. The thickness of the hole-injecting layer 111 was 50 nm. Note that the co-evaporation is an evaporation method in which some different substances are evaporated from some different evaporation sources at the same time. Next, NPB was evaporated to a thickness of 10 nm as a hole-transporting layer 112.

Further, 9-[4-(10-phenyl-9-anthryl)phenyl]-9H-carbazole (abbreviation: CZPA) represented by the above Structure Formula (ii) and 9-(9,10-diphenyl-2-anthryl)-9H-carbazole (abbreviation: 2CzPA), which is the anthracene derivative of Embodiment 1, were co-evaporated over the hole-transporting layer 112 so that the mass ratio between CZPA and 2CzPA is 1:0.2; thus, a light-emitting layer 113 was formed. The thickness of the light-emitting layer 113 was 30 nm.

Next, tris(8-quinolinolato)aluminum(III) (abbreviation: Alq) represented by the above structure formula (iii) was evaporated to a thickness of 10 nm, whereby an electron-transporting layer 114 was formed. Further, over the electron-transporting layer 114, Alq and lithium fluoride were co-evaporated so that the mass ratio between Alq and lithium fluoride is 1:0.01, whereby an electron-injecting layer 115 was formed. The thickness of the electron-injecting layer 115 was 20 nm. Finally, aluminum was formed in 200 nm thick as a second electrode 104 serving as a cathode, whereby Light-Emitting Element 1 was completed. Note that all the above evaporation processes were performed by a resistance heating method.

<<Operating Characteristics of Light-Emitting Element 1>>

Light-Emitting Element 1 thus obtained was sealed in a glove box having a nitrogen atmosphere without being exposed to the air. Then, the operating characteristics of this light-emitting element were measured. The measurements were carried out at room temperature (in the atmosphere kept at 25° C.).

Figure 20:
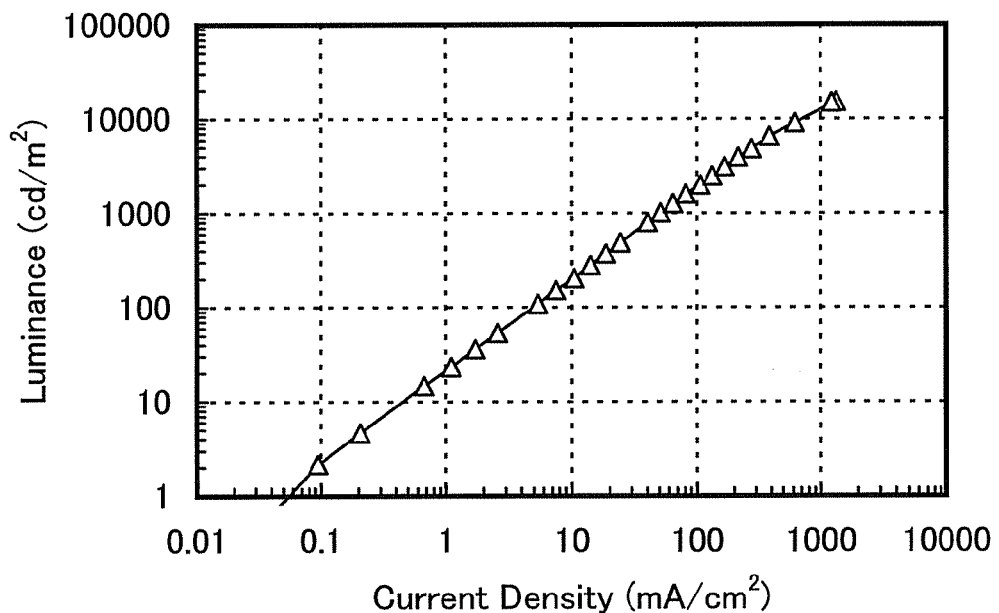
FIG. 20 shows a current density-luminance characteristic of a light-emitting element fabricated in Example 2.
Figure 21:
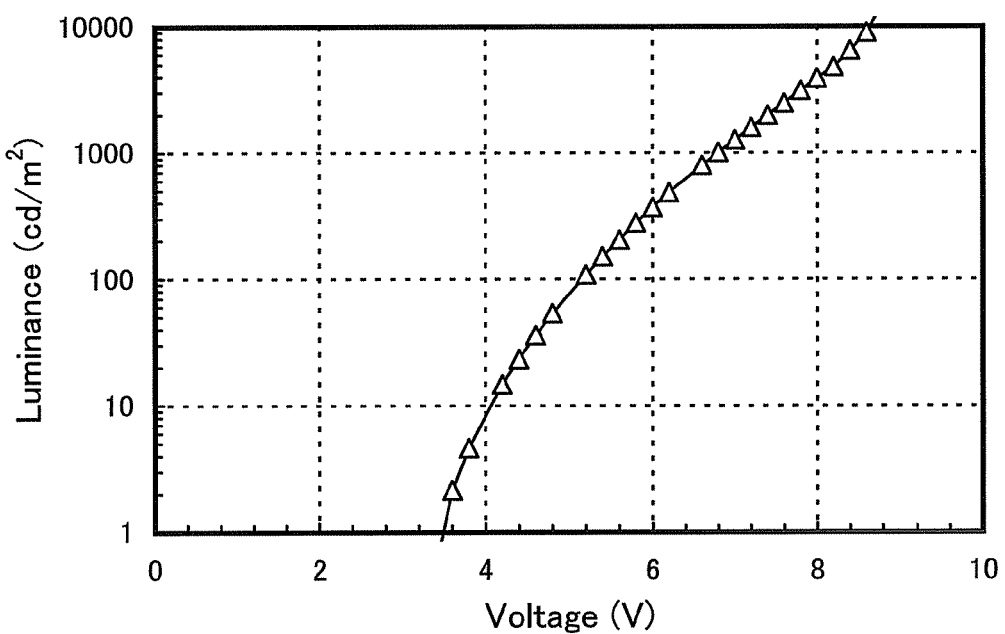
FIG. 21 shows a voltage-luminance characteristic of the light-emitting element fabricated in Example 2.
Figure 22:
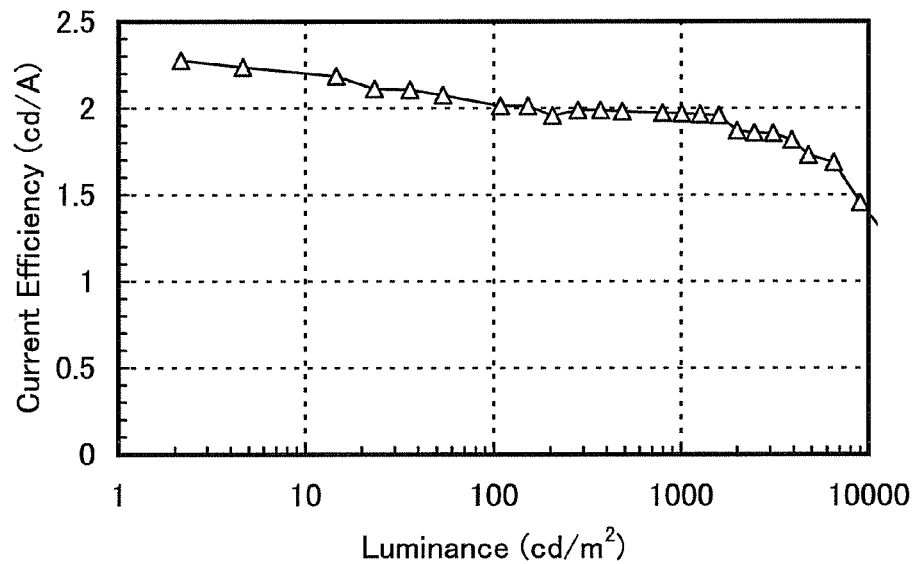
FIG. 22 shows a luminance-current efficiency characteristic of the light-emitting element fabricated in Example 2.

FIG. 20 shows the current density-luminance characteristic of the light-emitting element; FIG. 21 shows the voltage-luminance characteristic of the light-emitting element; and FIG. 22 shows the luminance-current efficiency characteristic of the light-emitting element.

In this manner, it is understood that 2CzPA, which is the anthracene derivative of Embodiment 1, operates without problems as the light-emitting material for Light-Emitting Element 1.

Figure 23:
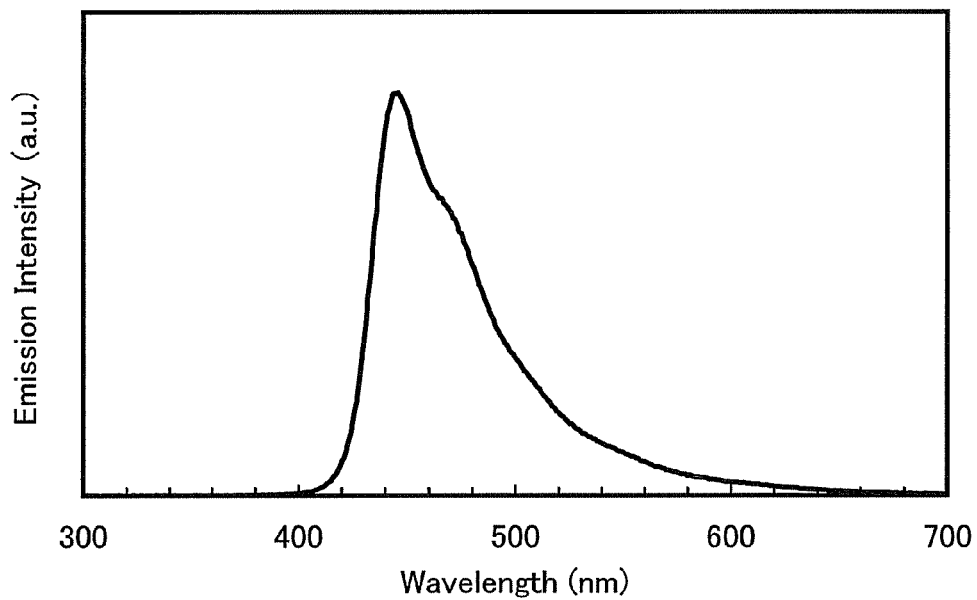
FIG. 23 shows an emission spectrum of the light-emitting element fabricated in Example 2.

FIG. 23 shows an emission spectrum when a current of 1 mA flows in the fabricated Light-Emitting Element 1. As can be seen from FIG. 23, 2CzPA, which is the anthracene derivative of Embodiment 1, has a large energy gap; therefore, the light-emitting element of Example 2, which uses 2CzPA for a light emission center material can, emit favorable blue light having a peak at 447 nm. Light-Emitting Element 1 exhibited excellent blue light emission where the CIE chromaticity coordinates were (x=0.16, y=0.13) when the luminance was 1010 cd/m². The current efficiency and external quantum efficiency of Light-Emitting Element 1 at a luminance of 1010 cd/m² were 2.0 cd/A and 1.8%, respectively. When the luminance was 1010 cd/m², the voltage was 6.8 V; the current density, 51.2 mA/cm²; and the power efficiency, 0.9 lm/W.

Figure 24:
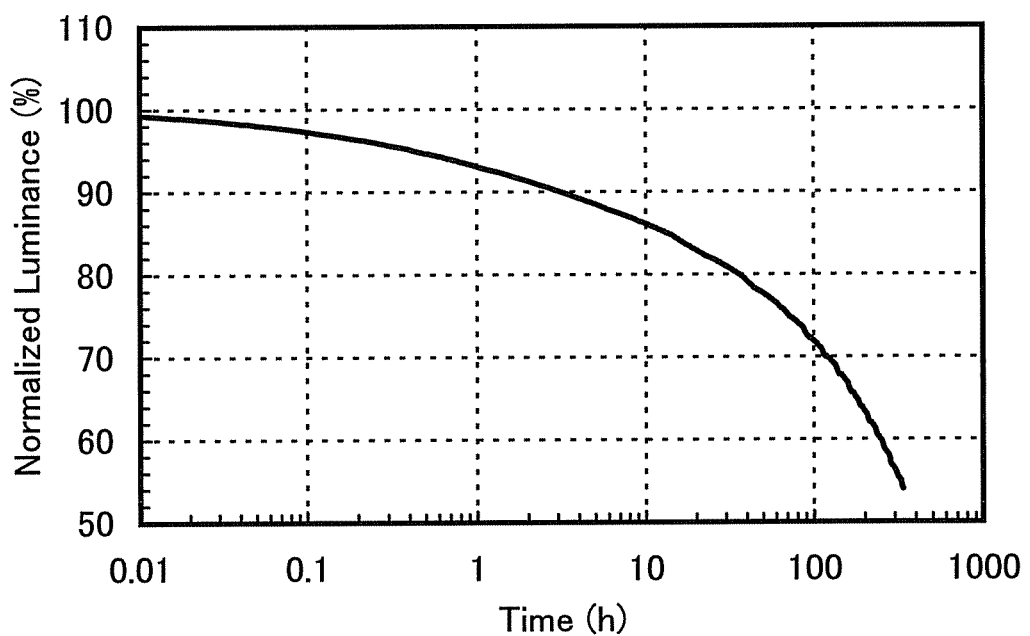
FIG. 24 shows a luminance degradation curve of the light-emitting element fabricated in Example 2.

Next, the initial luminance was set at 1000 cd/m² and this element was driven at constant current density. Then, the luminance degradation curve as seen in FIG. 24 was obtained. In FIG. 24, the horizontal axis shows time and the vertical axis shows relative luminance (%) when the initial luminance is 100.

Example 3

Example 3 describes a light-emitting element with a different structure from the light-emitting element described in Example 2, that is, Example 3 describes a light-emitting element which uses the anthracene derivative of Embodiment 1 as a host material in which a light emission center substance is dispersed.

A molecular structure of an organic compound used in Example 3 is represented by Structure Formula (Iv) below. Note that the structures of 2CzPA and the substances used in Example 1 are not described here. An element structure of the light-emitting element is shown in FIG. 11A.

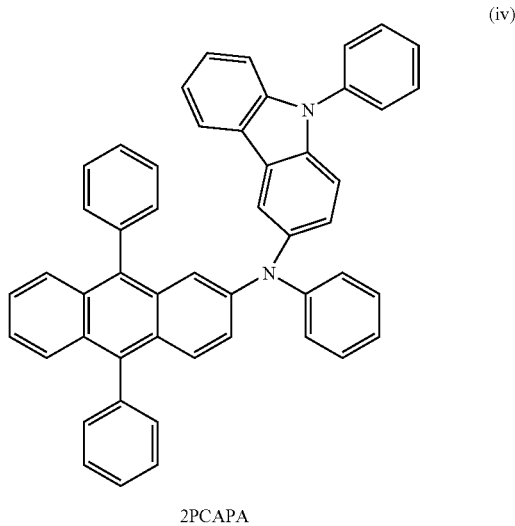 [SMILES: c1ccc(-c2c3ccccc3c(-c3ccccc3)c3cc(N(c4ccccc4)c4ccc5c(c4)c4ccccc4n5-c4ccccc4)ccc23)cc1]

(iv)

2PCAPA

<<Fabrication of Light-Emitting Element 2>>

The process up to the step of forming the hole-transporting layer 112 was performed in a manner similar to Example 2.

Subsequently, 2CzPA, which is the anthracene derivative of Embodiment 1, and N-(9,10-diphenyl-2-anthryl)-N-phenyl-9-phenyl-9H-carbazol-3-amine (abbreviation: 2PCAPA) represented by the above structure formula (Iv) were co-evaporated over the hole-transporting layer 112 so that the mass ratio between 2 CZPA and 2PCAPA is 1:0.05, whereby the light-emitting layer 113 was formed. The film thickness of the light-emitting layer 113 was 40 nm.

Next, Alq was evaporated to a thickness of 30 nm, whereby the electron-transporting layer 114 was formed. Further, lithium fluoride was evaporated to a thickness of 1 nm over the electron-transporting layer 114, whereby the electron-injecting layer 115 was formed. Finally, a film of aluminum was formed to a thickness of 200 nm as the second electrode 104 serving as a cathode, whereby Light-Emitting Element 2 was completed. Note that all the above evaporation processes were performed by a resistance heating method.

<<Operating Characteristics of Light-Emitting Element 2>>

Light-Emitting Element 2 thus obtained was sealed in a glove box having a nitrogen atmosphere without being exposed to the air. Then, the operating characteristics of the light-emitting element were measured. The measurements were carried out at room temperature (in the atmosphere kept at 25° C.).

Figure 25:
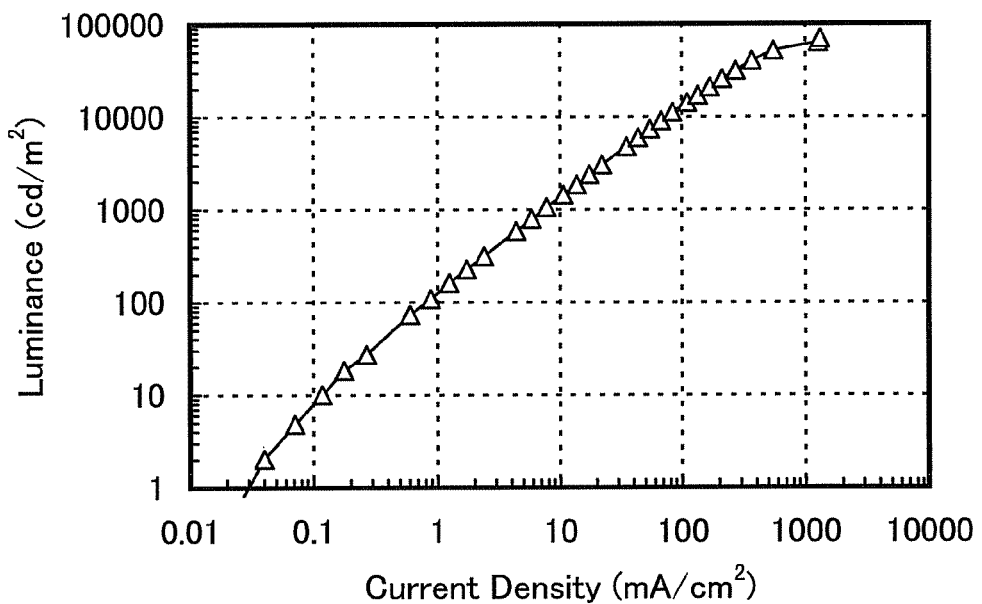
FIG. 25 shows a current density-luminance characteristic of a light-emitting element fabricated in Example 3.
Figure 26:
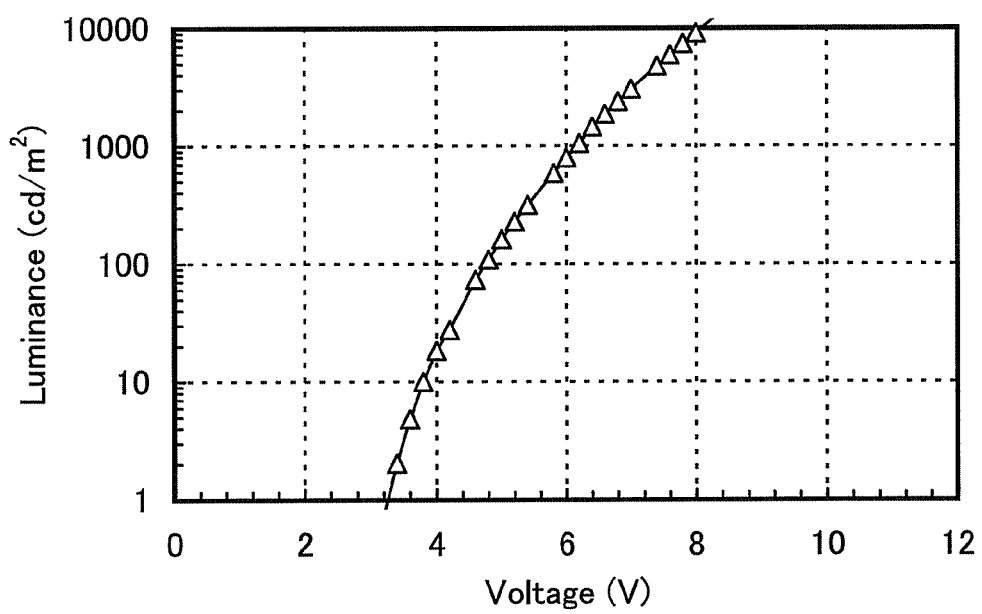
FIG. 26 shows a voltage-luminance characteristic of the light-emitting element fabricated in Example 3.
Figure 27:
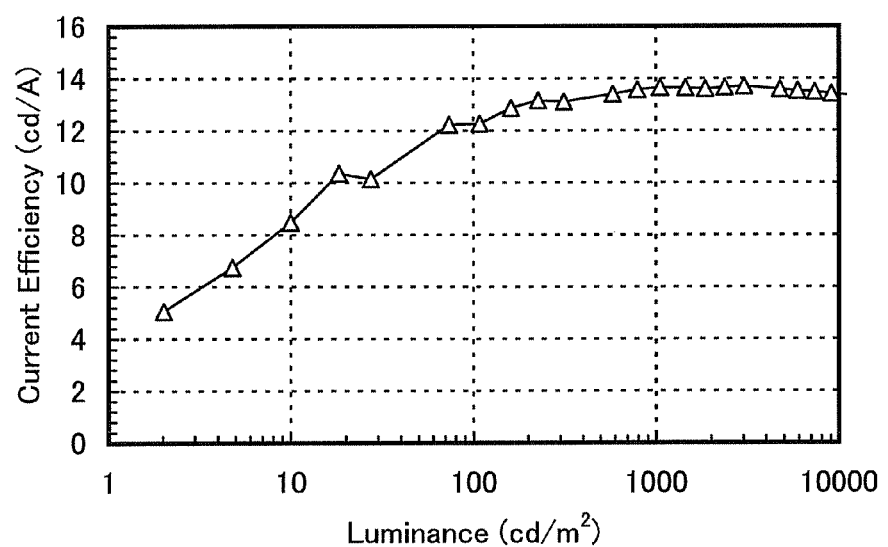
FIG. 27 shows a luminance-current efficiency characteristic of the light-emitting element fabricated in Example 3.

FIG. 25 shows the current density-luminance characteristic of the light-emitting element; FIG. 26 shows the voltage-luminance characteristic of the light-emitting element; and FIG. 27 shows the luminance-current efficiency characteristic of the light-emitting element.

In this manner, it is understood that 2CzPA, which is the anthracene derivative of Embodiment 1, operates without problems as the host material in which the light emission center material is dispersed in Light-Emitting Element 2.

Figure 28:
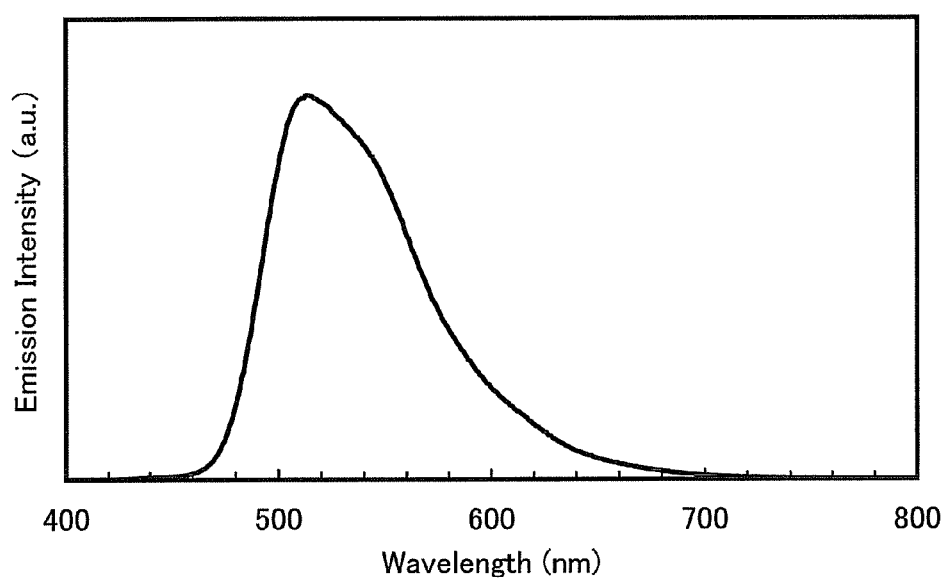
FIG. 28 shows an emission spectrum of the light-emitting element fabricated in Example 3.

FIG. 28 shows an emission spectrum when a current of 1 mA flows in the obtained light-emitting element. As can be seen from FIG. 28, 2CzPA, which is the anthracene derivative of Embodiment 1, has a large energy gap; therefore, 2PCAPA, which is the light emission center material, can be effectively excited, so that green light emission with a peak at 517 nm that is resulted from 2PCAPA is provided. The CIE chromaticity coordinates of Light-Emitting Element 2 at a luminance of 3030 cd/m$^2$ were (x=0.29, y=0.62), and the light emission thereof was favorable green. In addition, at a luminance of 3030 cd/m$^2$, the current efficiency was 13.7 cd/A, meaning that high efficiency was exhibited. When the luminance was 3030 cd/m$^2$, the voltage was 7.0 V; the current density, 22.1 mA/cm$^2$; and the power efficiency, 6.1 lm/W.

Figure 29:
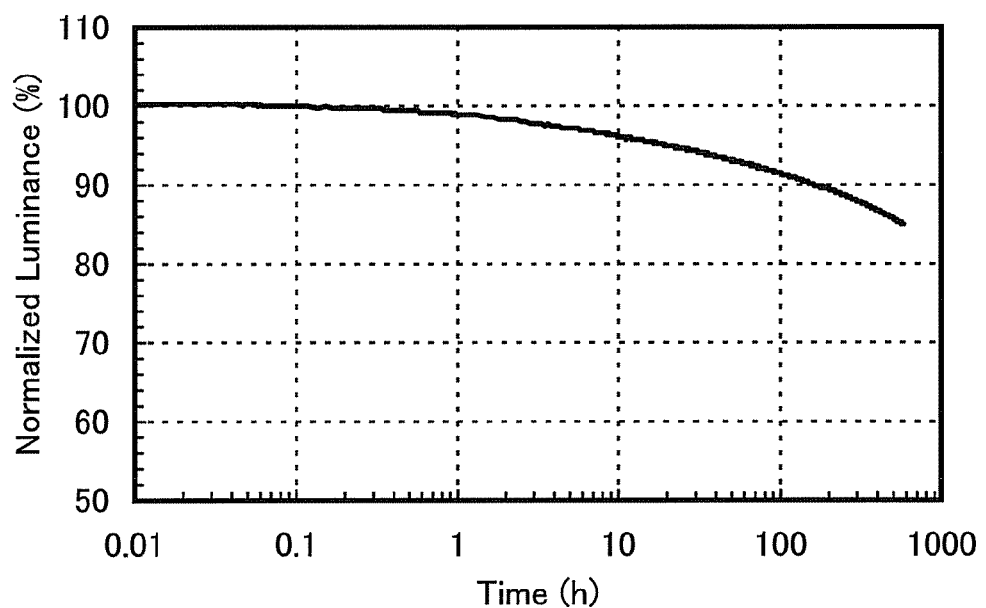
FIG. 29 shows a luminance degradation curve of the light-emitting element fabricated in Example 3.

Next, the initial luminance was set at 1000 cd/m$^2$, and this element was driven at the constant current density. At that time, the luminance degradation curve as seen in FIG. 29 was obtained. In FIG. 29, the horizontal axis shows time and the vertical axis shows relative luminance (%) when the initial luminance is 100.

It is understood from FIG. 29 that the luminance half-life period of the light-emitting element of Example 3 is estimated as about 10000 hours, and the light-emitting element of Example 3 has a long lifetime and deteriorates less with respect to drive time.

Example 4

Example 4 describes a light-emitting element with a different structure from those of the light-emitting elements described in Example 2 and Example 3. That is, Example 4 describes a light-emitting element which uses the anthracene derivative of Embodiment 1 as a host material, in which a light emission center material is to be dispersed, and has a layer 116 for suppressing transport of electron carriers between a light-emitting layer and an electron-transporting layer.

Figure 11B:
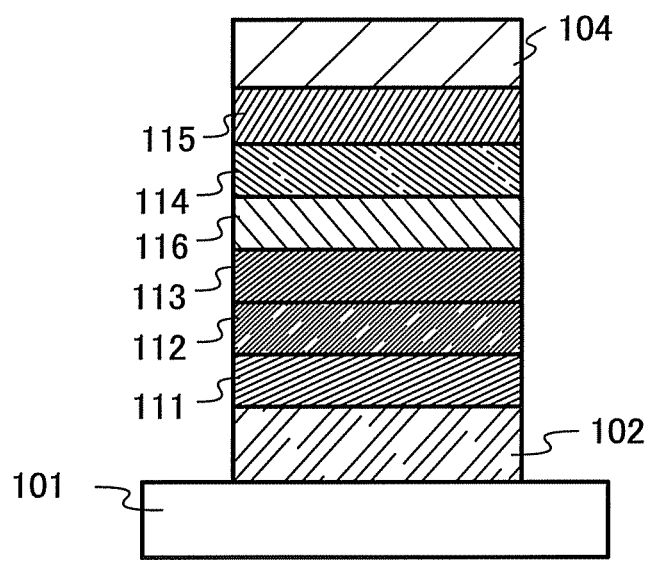

A molecular structure of an organic compound used in Example 4 is represented by Structure Formula (v) below. Note that the structures of 2CzPA and the substances used in Example 2 and Example 3 are not described here. An element structure of the light-emitting element is illustrated in FIG. 11B.

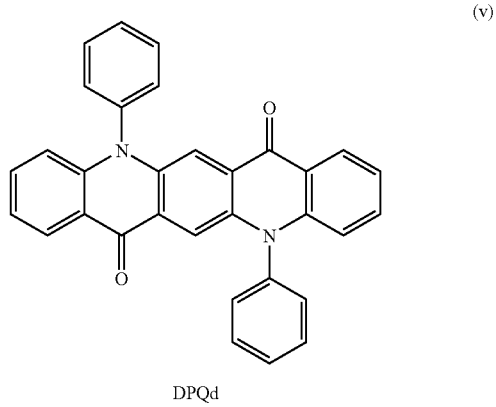 [SMILES: O=c1c2ccccc2n(-c2ccccc2)c2cc3c(=O)c4ccccc4n(-c4ccccc4)c3cc12]

(v)

DPQd

<<Fabrication of Light-Emitting Element 3>>

The process up to the step of forming the hole-transporting layer 112 was performed in a manner similar to Example 2.

Subsequently, 2CzPA, which is the anthracene derivative of Embodiment 1, and 2PCAPA were co-evaporated over the hole-transporting layer 112 so that the mass ratio between 2CzPA and 2PCAPA is 1:0.05, whereby the light-emitting layer 113 was formed. The thickness of the light-emitting layer 113 was 30 nm.

Next, Alq and N,N'-diphenylquinacridone (abbreviation: DPQd) which is represented by the above structure formula (v) were co-evaporated to a thickness of 10 nm as the layer 116 for suppressing transport of electron carriers so that the mass ratio between Alq and DPQd is 1:0.005; then, Alq was evaporated to a thickness of 30 nm as the electron-transporting layer 114. Further, lithium fluoride was evaporated to a thickness of 1 nm over the electron-transporting layer 114, whereby the electron-injecting layer 115 was formed. Then, a film of aluminum was formed to a thickness of 200 nm as the second electrode 104 serving as a cathode, whereby Light-Emitting element 3 was completed. Note that all the above evaporation processes were performed by a resistance heating method.

<<Operating Characteristics of Light-Emitting Element 3>>

Light-Emitting Element 3 thus obtained was sealed in a glove box having a nitrogen atmosphere without being exposed to the air. Then, the operating characteristics of the light-emitting element were measured. The measurements were carried out at room temperature (in the atmosphere kept at 25° C.).

Figure 30:
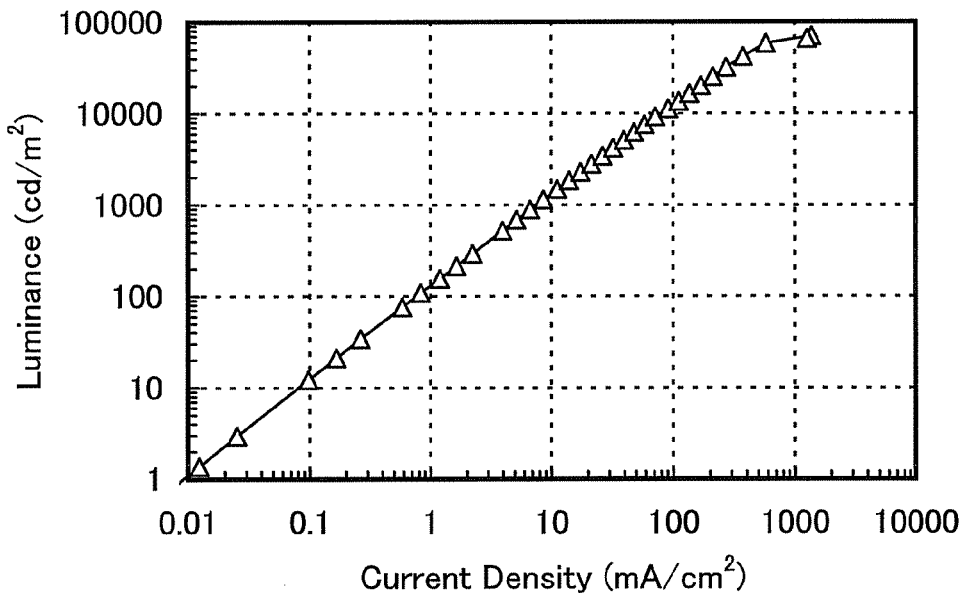
FIG. 30 shows a current density-luminance characteristic of a light-emitting element fabricated in Example 4.
Figure 31:
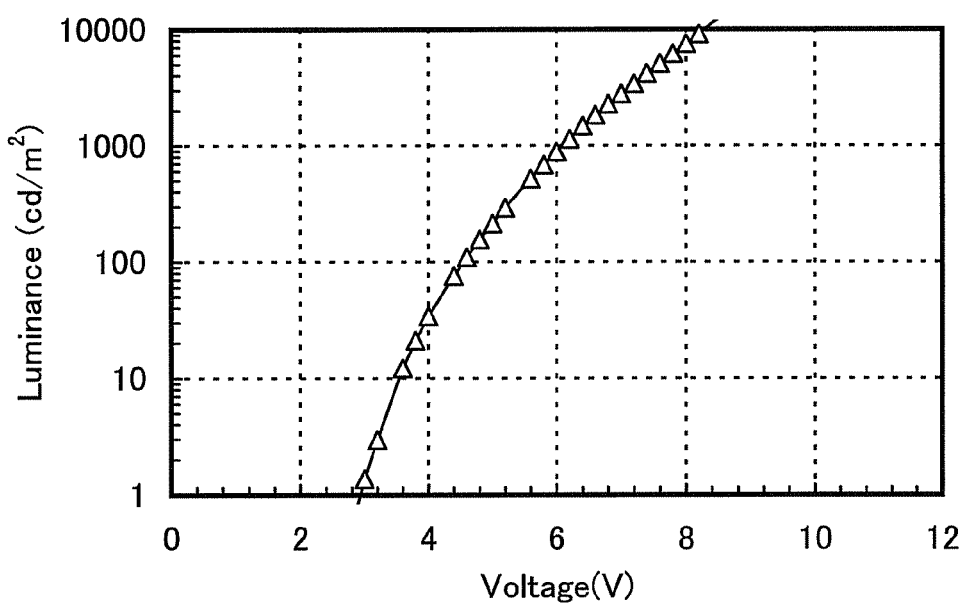
FIG. 31 shows a voltage-luminance characteristic of the light-emitting element fabricated in Example 4.
Figure 32:
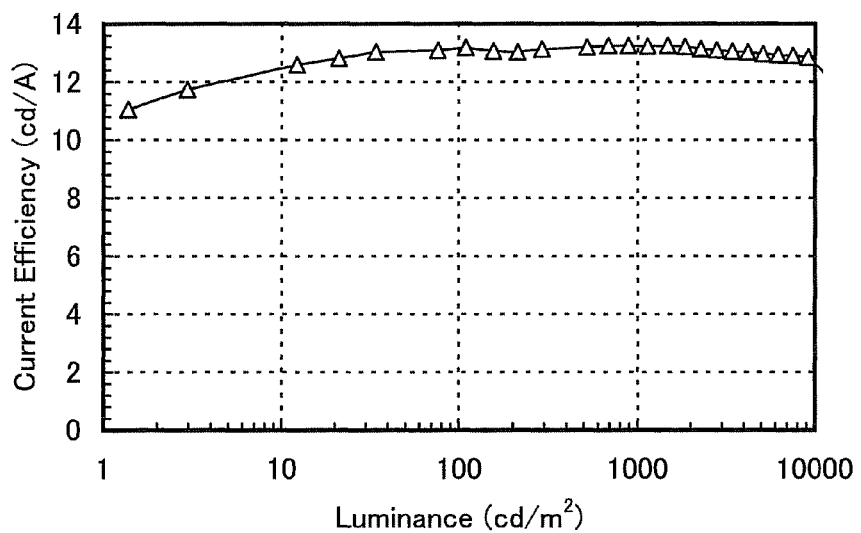
FIG. 32 shows a luminance-current efficiency characteristic of the light-emitting element fabricated in Example 4.
Figure 33:
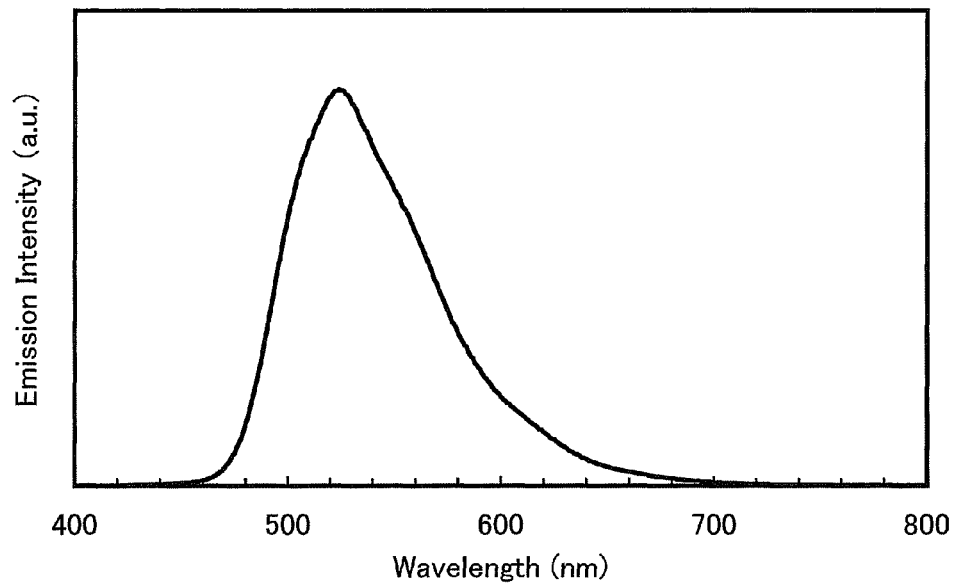
FIG. 33 shows an emission spectrum of the light-emitting element fabricated in Example 4.

FIG. 30 shows the current density-luminance characteristic of Light-Emitting Element 3; FIG. 31 shows the voltage-luminance characteristic thereof; FIG. 32 shows the luminance-current efficiency characteristic thereof; and FIG. 33 shows an emission spectrum thereof when a current of 1 mA flows.

In this manner, it is understood that 2CzPA, which is the anthracene derivative of Embodiment 1, operates without problems as the host material in which the light emission center material is dispersed in Light-Emitting Element 3 having the element structure as in Example 4. Further, 2CzPA, which is the anthracene derivative of Embodiment 1, has large energy gap. As a result, it is found that 2PCAPA, which is the material for green light emission, can be effectively excited to provide light emission. Note that Light-Emitting Element 3 of Example 4 had a light emission peak at 526 nm. The difference in spectrum from Light-Emitting Element 1 of Example 2 is thought to be due to light emission from DPQd included in the electron-transporting layer. Light-Emitting Element 3 had the CIE chromaticity coordinates (x=0.30, y=0.62) at a luminance of 2790 cd/m$^2$ and exhibited favorable green light emission. Moreover, when the luminance was 2790 cd/m$^2$, the current efficiency was 13.1 cd/A. Further, when the luminance was 2790 cd/m$^2$, the voltage was 7.0 V; the current density, 21.3 mA/cm$^2$; and the power efficiency, 5.9 lm/W.

Figure 34:
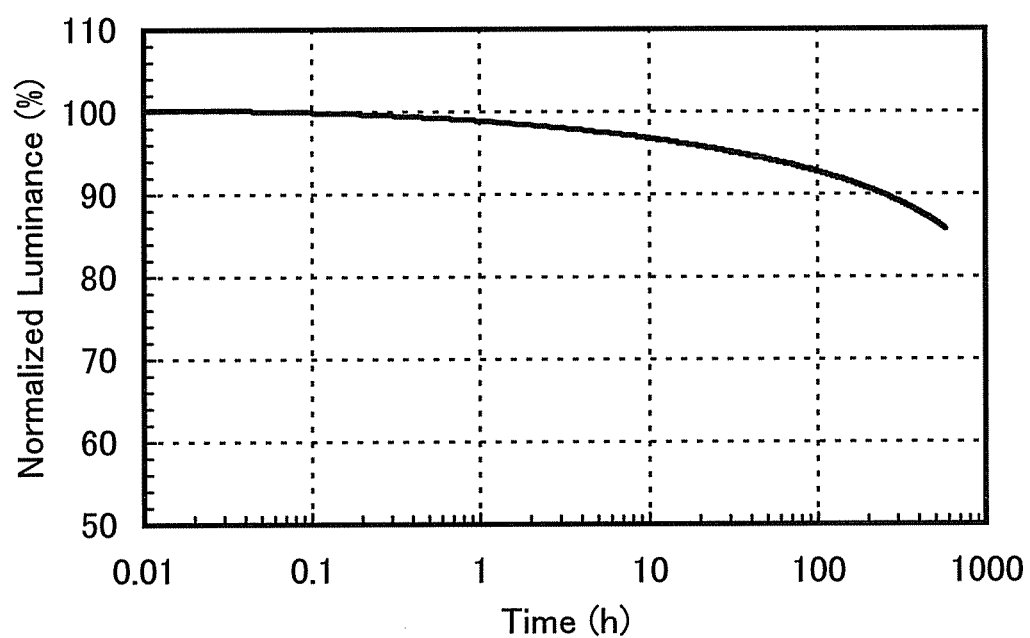
FIG. 34 shows a luminance degradation curve of the light-emitting element fabricated in Example 4.

Next, the initial luminance was set at 1000 cd/m$^2$, and this element was driven at the constant current density. At that time, the luminance degradation curve as seen in FIG. 34 was obtained. In FIG. 34, the horizontal axis shows time and the vertical axis shows relative luminance (%) when the initial luminance is 100.

It is understood from FIG. 34 that the luminance half-life period of the light-emitting element of Example 4 is estimated as about 10000 hours, and the light-emitting element of Example 4 has long lifetime and deteriorates less with respect to drive time.

Example 5

Example 5 describes a light-emitting element which is similar to the light-emitting element of Example 4; however, the elements are different in material for the electron-transporting layer. That is, a light-emitting element which uses the anthracene derivative of Embodiment 1 as a host material, in which a light emission center material is dispersed, and has a layer for controlling transport of electron carriers between a light-emitting layer and the electron-transporting layer is described in Example 5.

A molecular structure of an organic compound used in Example 5 is represented by Structure Formula (vi) below. Note that the structures of 2CzPA and the substances used in Example 2 to Example 4 are not described here. An element structure of the light-emitting element is shown in FIG. 11B.

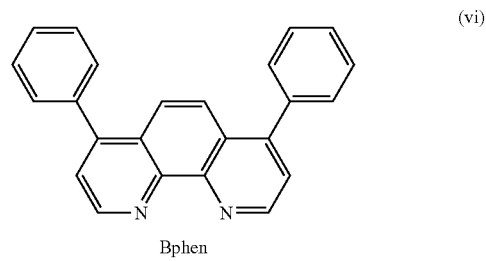 [SMILES: c1ccc(-c2ccnc3c2ccc2c(-c4ccccc4)ccnc23)cc1]

Bphen

<<Fabrication of Light-Emitting Element 4>>

The process up to the step of forming the light-emitting layer 113 was performed in a manner similar to Example 2.

Next, film of Alq and DPQd was co-evaporated so that the mass ratio between Alq and DPQd was 1:0.005, whereby the layer 116 for suppressing transport of electron carriers was formed to a thickness of 10 nm. Then, bathophenanthroline (abbreviation: Bphen) represented by the above Structure Formula (v) was evaporated to a thickness of 30 nm as the electron-transporting layer 114. Further, lithium fluoride was evaporated to a thickness of 1 nm over the electron-transporting layer 114, whereby the electron-injecting layer 115 was formed. Then, a film of aluminum was formed to a thickness of 200 nm as the second electrode 104 serving as a cathode, whereby Light-Emitting Element 4 was completed. Note that all the above evaporation processes were performed by a resistance heating method.

<<Operating Characteristics of Light-Emitting Element 4>>

Light-Emitting Element 4 thus obtained was sealed in a glove box having a nitrogen atmosphere without being exposed to the air. Then, the operating characteristics of the light-emitting element were measured. The measurements were carried out at room temperature (in the atmosphere kept at 25° C.).

Figure 35:
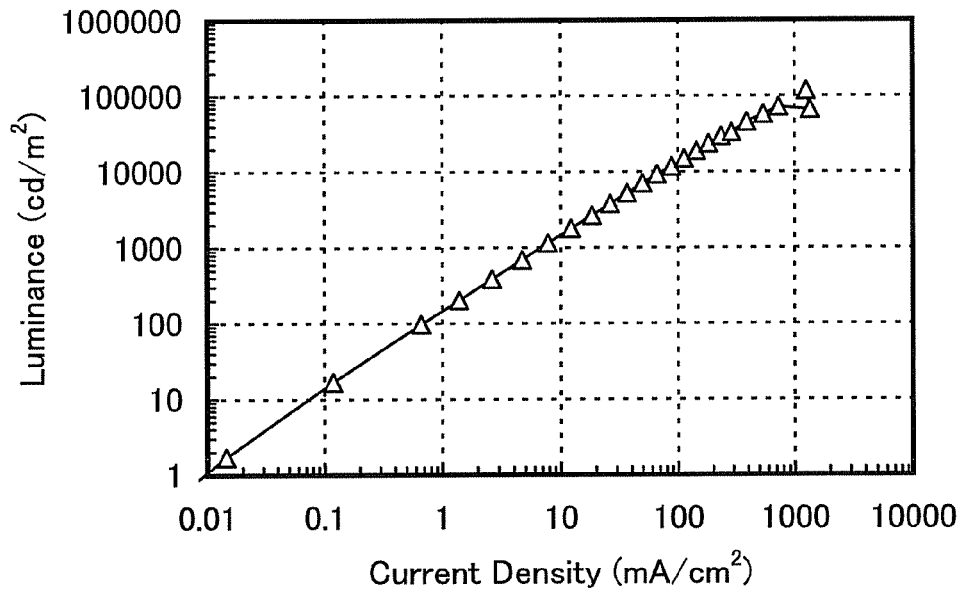
FIG. 35 shows a current density-luminance characteristic of a light-emitting element fabricated in Example 5.
Figure 36:
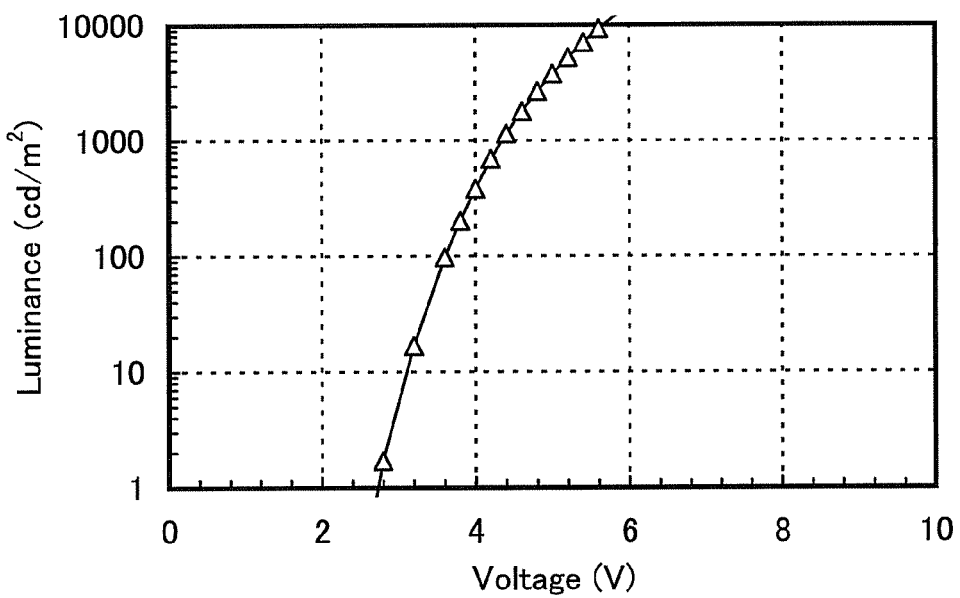
FIG. 36 shows a voltage-luminance characteristic of the light-emitting element fabricated in Example 5.
Figure 37:
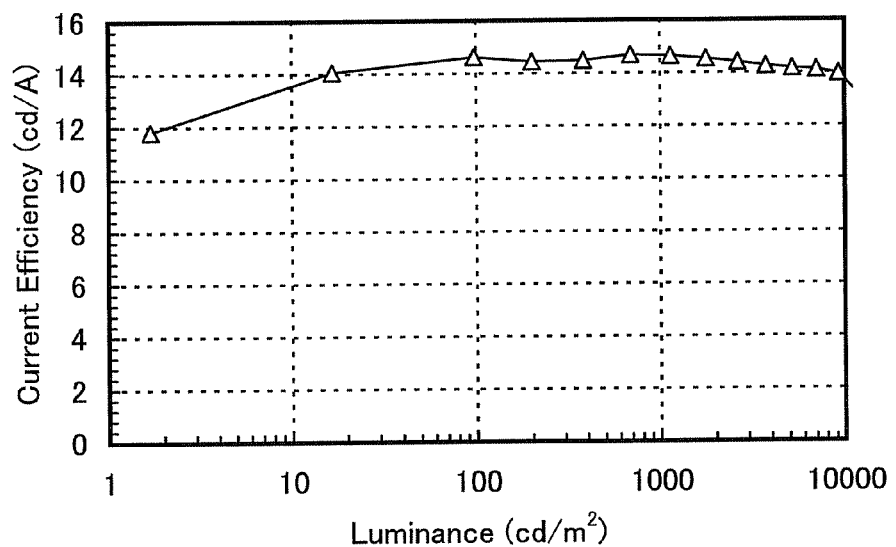
FIG. 37 shows a luminance-current efficiency characteristic of the light-emitting element fabricated in Embodiment 5.
Figure 38:
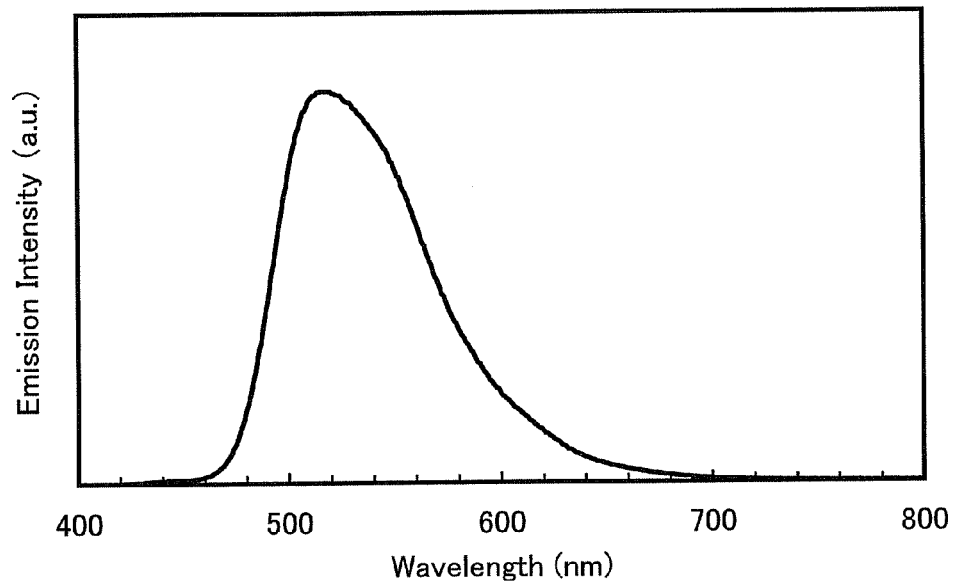
FIG. 38 shows an emission spectrum of the light-emitting element fabricated in Embodiment 5.

FIG. 35 shows the current density-luminance characteristic of Light-Emitting Element 4; FIG. 36 shows the voltage-luminance characteristic thereof; FIG. 37 shows the luminance-current efficiency characteristic thereof; and FIG. 38 shows an emission spectrum thereof when a current of 1 mA flows.

In this manner, it is understood that 2CzPA, which is the anthracene derivative of Embodiment 1, operates without problems as the host material in which the light emission center material is dispersed in Light-Emitting Element 4 having the element structure as in Example 5. Further, 2CzPA, which is the anthracene derivative of Embodiment 1, has large energy gap. As a result, it is found that 2PCAPA, which is the material for green light emission, can be effectively excited to provide light emission. Note that Light-Emitting Element 4 of Example 5 had a light emission peak at 518 nm. Light-Emitting Element 4 had CIE chromaticity coordinates (x=0.30, y=0.61) at a luminance of 2660 cd/m$^2$ and exhibited favorable green light emission. Moreover, when the luminance was 2660 cd/m$^2$, the current efficiency was 14.4 cd/A, which was high. Further, when the luminance was 2660 cd/m$^2$, the voltage was 4.8 V; the current density, 18.5 mA/cm$^2$; and the power efficiency, 9.4 lm/W which was high power efficiency with low drive voltage.

Figure 39:
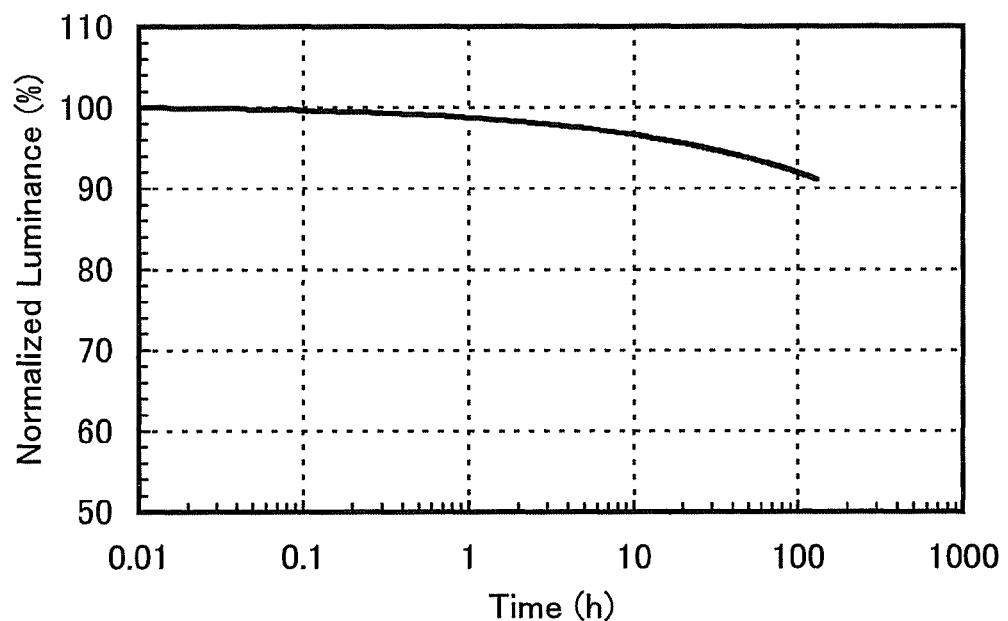
FIG. 39 shows a luminance degradation curve of the light-emitting element fabricated in Example 5.

Next, the initial luminance was set at 5000 cd/m$^2$, and this element was driven at the constant current density. Thus, the luminance degradation curve as seen in FIG. 39 was obtained. In FIG. 39, the horizontal axis shows time and the vertical axis shows relative luminance (%) when the initial luminance is 100.

It is understood from FIG. 39 that the luminance half-life period of the light-emitting element of Example 5 has long lifetime and deteriorates less with respect to drive time.

Example 6

In Example 6, a thin film of a composition including the anthracene derivative of Embodiment 1 and a solvent was formed by a wet process.

In Example 6, 9-(9,10-diphenyl-2-anthryl)-9H-carbazole (abbreviation: 2CzPA), which is the anthracene derivative represented by Structure Formula (1) in Embodiment 1, was used as the anthracene derivative and toluene was used as the solvent.

First, 150 mg of 2CzPA was mixed and dissolved into 15 ml of toluene, so that a composition with a solution concentration of 10 g/L was prepared. The composition was formed into a thin film over a glass substrate in such a manner that spin coating was performed at 1000 rpm for 60 seconds and baking is performed in the atmosphere at 100° C. for an hour. It was confirmed that the obtained film was transparent and uniform with no unevenness.

Comparative Example

In Comparative Example, 9,10-diphenylanthracene (abbreviation: DPAnth) was dissolved in a solvent toluene to form a composition and a thin film of the composition was formed by a wet process.

First, 150 mg of DPAnth was mixed and dissolved into 15 ml of toluene, so that a composition with a solution concentration of 10 g/L was prepared. The composition was formed into a thin film over a glass substrate in such a manner that spin coating was performed at 1000 rpm for 60 seconds and baking is performed in the atmosphere at 100° C. for an hour. The obtained film was white and opaque and not uniform.

In view of the above, it was confirmed that a uniform thin film with favorable film quality can be formed by a wet process using the composition including the anthracene derivative according to an embodiment of the present invention and a solvent.

Example 7

Figure 40:
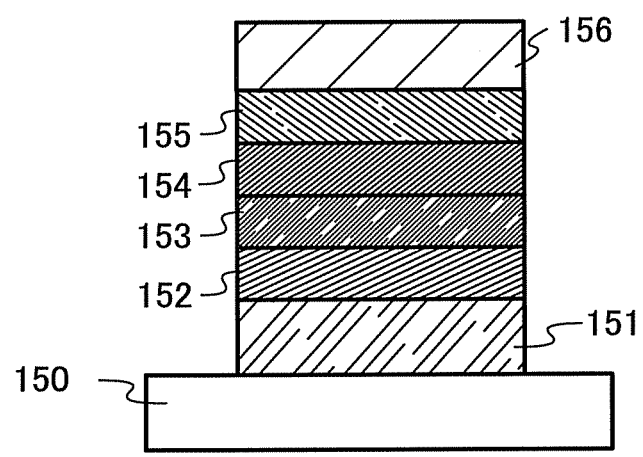
FIG. 40 illustrates an element structure of a light-emitting element fabricated in Example 6.

Example 7 describes a composition according to an embodiment of the present invention and fabrication of a light-emitting element using the composition. An element structure of the light-emitting element is shown in FIG. 40.

First, a method of forming a composition (Solution A) which is used for forming a hole-transporting layer of the light-emitting element of Example 7 is described. Into an undiluted solution of PEDOT:PSS (BAYTRON P AI4083 LVW 142), 2-methoxyethanol was mixed so that the volume ratio between PEDOT:PSS and 2-methoxyethanol was 3:2. The mixture was stirred to be uniformly blended, whereby Composition A was obtained.

<<Fabrication of Light-Emitting Element 5>>

First, a glass substrate 150 over which an indium tin silicon oxide (ITSO) film has been formed to a thickness of 110 nm was prepared. Note that the ITSO functions as an anode 151 of the light-emitting element. As pretreatment for forming the light-emitting element over this substrate, a mixed solution of water and 2-methoxyethanol mixed so that the volume ratio between water and 2-methoxyethanol was 3:2 was dripped onto the ITSO film, and the ITSO film was spin-coated with the mixed solution. The spin coating was carried out at a spinning rate of 300 rpm for 3 seconds and then at a spinning rate of 2000 rpm for 20 seconds.

Next, Solution A was dripped onto the ITSO film that has undergone the pretreatment, and the ITSO film was spin-coated with Solution A at a spinning rate of 300 rpm for 3 seconds, at a spinning rate of 2000 rpm for 60 seconds, and then at a spinning rate of 3000 rpm for 10 seconds. A film formed from Composition A by the spin coating on a terminal portion was removed using ethanol, and drying was performed by heating for an hour in a vacuum oven in which the temperature was set at 110° C. while the pressure was reduced with a rotary pump, whereby a PEDOT/PSS film with a thickness of 50 μm was formed as a first layer 152.

As a solution used for forming a second layer 153 which is to serve as a layer containing a material with a light-emitting property, 0.15 g of 2CzPA and 0.031 g of 2PCAPA were put into a sample bottle. Into this bottle, 15 mL of dehydrated toluene (product of Kanto Chemical Co., Inc.) was added in an environment of low moisture concentration (less than 0.1 ppm) and low oxygen concentration (to 10 ppm), and the sample bottle was stirred for 15 hours with the lid closed, whereby Composition E was prepared.

Composition E was dripped onto the substrate over which the first layer 152 has been formed, in an environment of low moisture concentration (less than 0.1 ppm) and low oxygen concentration (to 10 ppm). The substrate was spin-coated with Composition E at a spinning rate of 300 rpm for 3 seconds, at a spinning rate of 1000 rpm for 60 seconds, and then at a spinning rate of 2500 rpm for 10 seconds. A film formed from Composition E by the spin coating on a terminal portion was removed using toluene, and drying was performed by heating for one hour in a vacuum oven in which the temperature was set at 110° C. while the pressure was reduced with a rotary pump, whereby the second layer 153 was formed. After that, the substrate was disposed in a vacuum evaporation apparatus with a pressure reduced to 10$^{-4}$ Pa so that the surface provided with the films faced downward. Then, a tris(8-quinolinolato)aluminum (abbreviation: Alq) film was formed to a thickness of 10 nm and a bathophenanthroline (abbreviation: BPhen) film was formed to a thickness of 20 nm, whereby an electron-transporting layer 154 was formed. Further, a lithium fluoride film was formed to a thickness of 1 nm, whereby an electron-injecting layer 155 was formed. Then, an aluminum film was formed to a thickness of 200 nm as a cathode 156. Thus, Light-Emitting element 5 was completed.

Light-Emitting Element 5 thus obtained was sealed in a glove box having a nitrogen atmosphere without being exposed to the air. Then, the operating characteristics of the light-emitting element were measured. The measurements were carried out at room temperature (in the atmosphere kept at 25° C.).

Figure 41:
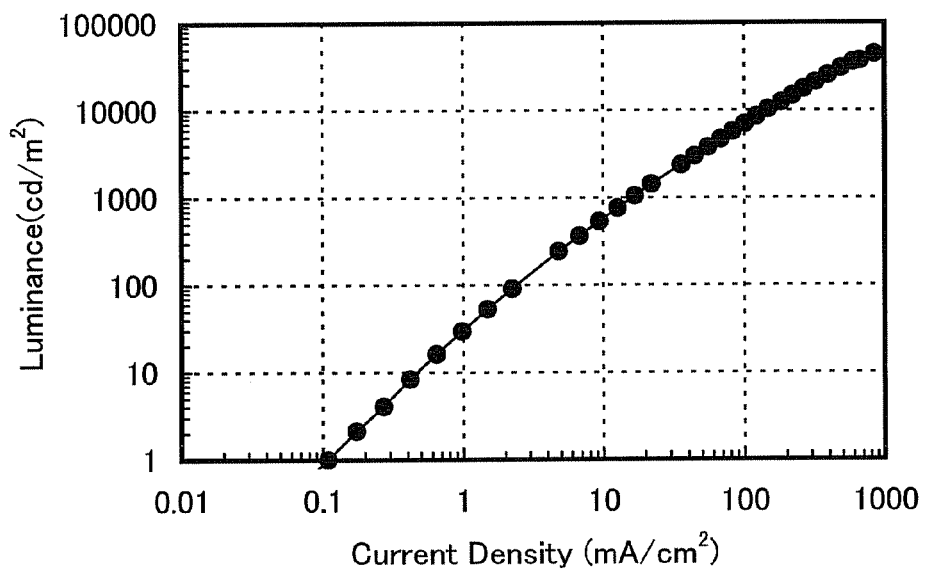
FIG. 41 shows a current density-luminance characteristic of the light-emitting element fabricated in Example 6.
Figure 42:
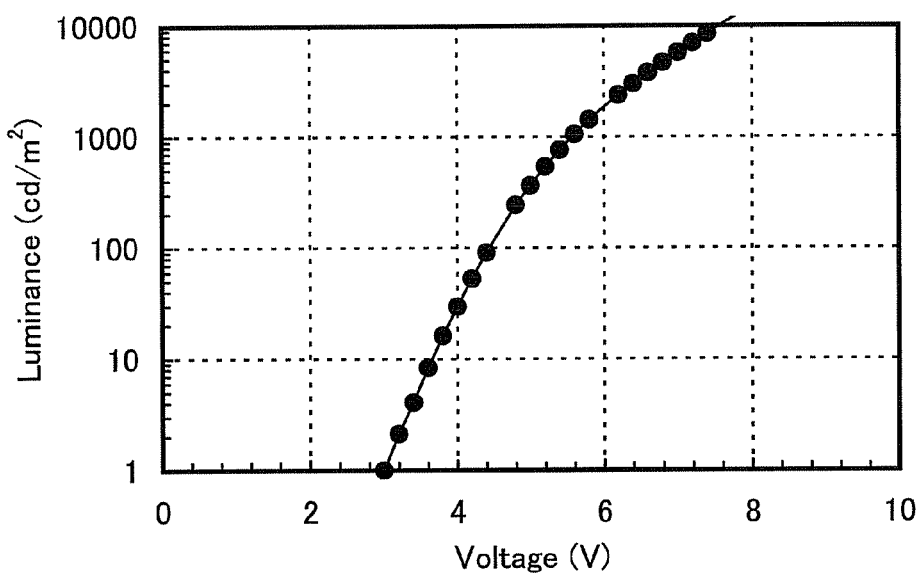
FIG. 42 shows a voltage-luminance characteristic of the light-emitting element fabricated in Example 6.
Figure 43:
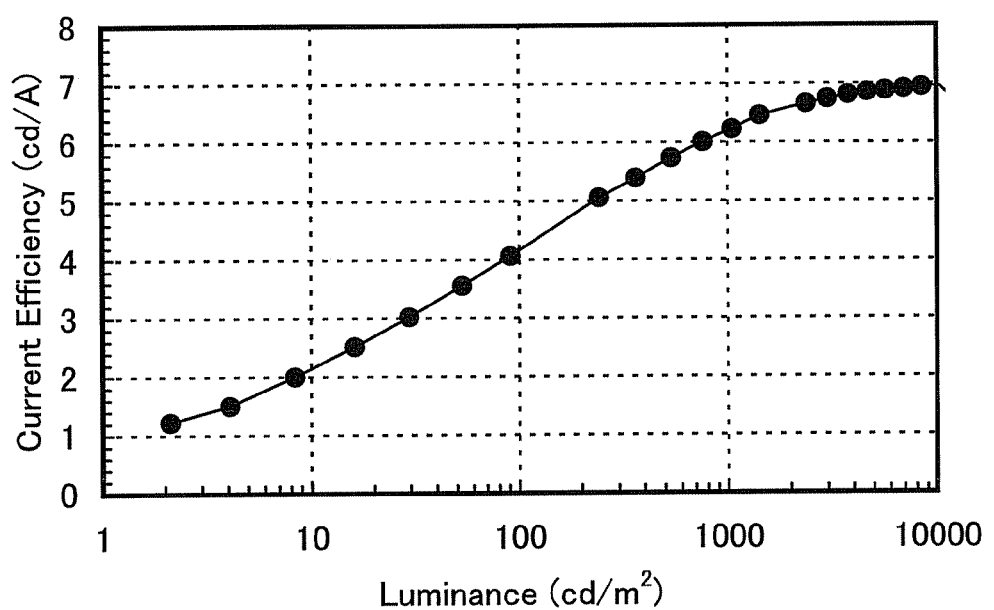
FIG. 43 shows a luminance-current efficiency characteristic of the light-emitting element fabricated in Example 6.

FIG. 41 shows the current density-luminance characteristic of Light-Emitting Element 5; FIG. 42 shows the voltage-luminance characteristic thereof; and FIG. 43 shows the luminance-current efficiency characteristic thereof.

In this manner, it is understood that 2CzPA, which is the anthracene derivative of Embodiment 1, operates without problems in Light-Emitting Element 5 manufactured by a wet process.

Figure 44:
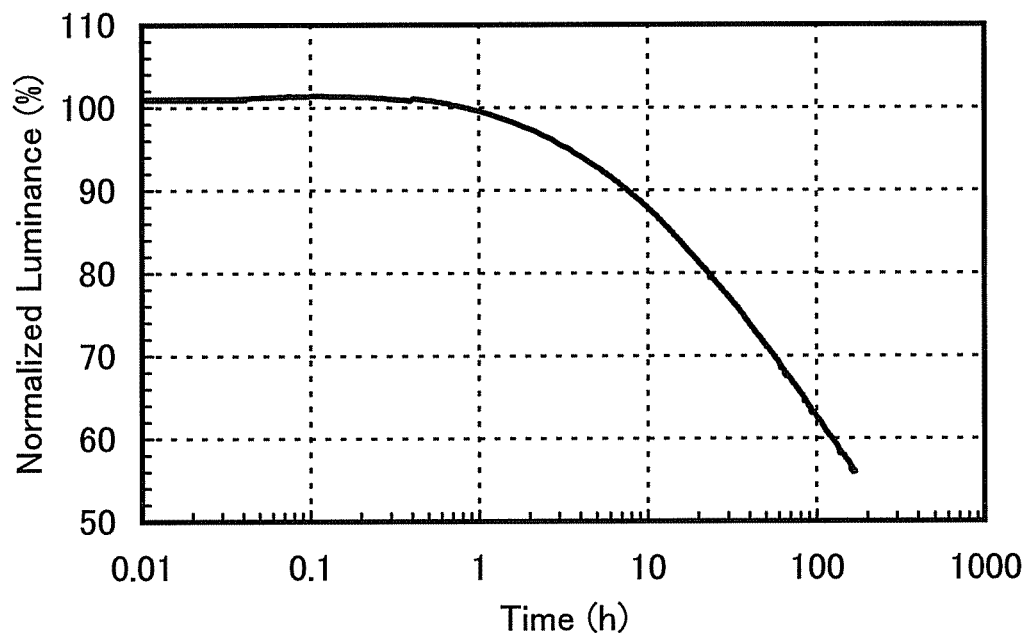
FIG. 44 shows a luminance degradation curve of the light-emitting element fabricated in Example 6.

Next, the initial luminance was set at 1000 cd/m$^2$, and this element was driven at the constant current density. At that time, the luminance degradation curve as seen in FIG. 44 was obtained. In FIG. 44, the horizontal axis shows time and the vertical axis shows relative luminance (%) when the initial luminance is 100.

It is understood from FIG. 44 that Light-Emitting Element 5 of Example 7 has long lifetime as compared with other light-emitting elements manufactured by a wet process.

Example 8

Example 8 describes a synthesis method for forming 9-[9,10-bis(2-biphenyl)-2-anthryl]-9H-carbazole (abbreviation: 2CzBPhA) represented by Structure Formula (6) of Embodiment 1.

[Step 1] Synthesis of 9-[9,10-bis(2-biphenyl)-2-anthryl]-9H-carbazole (abbreviation: 2CzBPhA)

A synthesis scheme of 2CzBPhA is shown in (H-1).

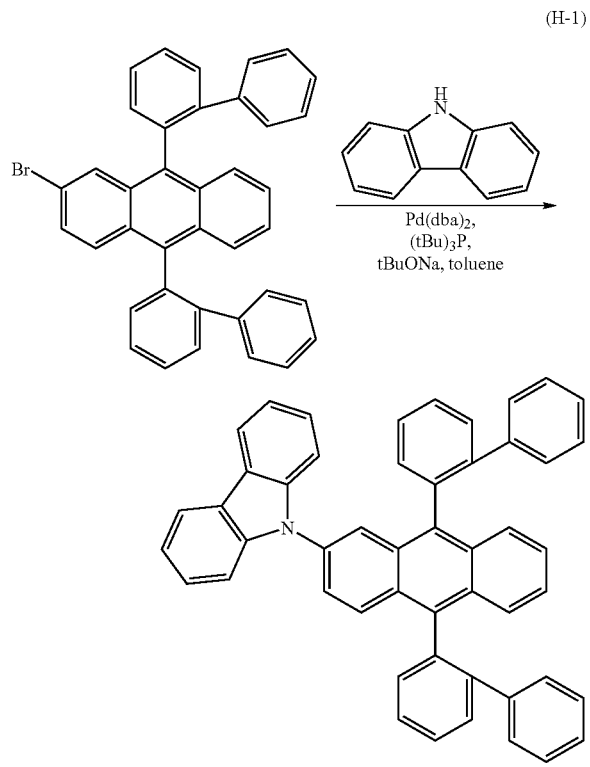

(H-1)

First, 2-bromo-9,10-bis(2-biphenyl)anthracene of 2.0 g (3.5 mmol), which was synthesized in accordance with PCT International Publication No. 2007/125934, 0.60 g (3.5 mmol) of 9H-carbazole, and 2.0 g (21 mmol) of sodium tert-butoxide were put into a 100 mL three-neck flask, and the atmosphere in the flask was substituted by nitrogen. To this mixture, 30 mL of toluene and 0.1 mL of tri(tert-butyl)phosphine (10% hexane solution) were added. The mixture was stirred while the pressure was reduced, so that the mixture was deaerated. After the deaeration, 20 mg (0.035 mmol) of bis(dibenzylideneacetone)palladium(0) was added. Then, this mixture was stirred at 100° C. for three hours. After the stirring, the precipitated solid substance was collected by suction filtration. The obtained solid substance was dissolved in toluene and this solution was washed with water and a saturated saline solution in that order. Then, an organic layer was dried with magnesium sulfate. The mixture was subjected to gravity filtration and the obtained filtrate was concentrated to give a solid substance. The solid substance was dissolved in toluene, and the solution was subjected to suction filtration through Florisil (product of Wako Pure Chemical Industries, Ltd., Catalog No. 540-00135), Celite (product of Wako Pure Chemical Industries, Ltd., Catalog No. 531-16855), and alumina. The obtained filtrate was then concentrated to give a solid substance. The obtained solid substance was recrystallized with dichloromethane/hexane, whereby 2.0 g of a light-yellow powdered solid substance which was the object of the synthesis was obtained in 83% yield.

Then, 500 mg of 2CzBPhA was sublimated and purified by a train sublimation method. In the sublimation and purification, the pressure was 200 Pa, an argon gas was supplied with a flow rate of 15.0 mL/min, and the material was heated at 350° C. After the sublimation and purification, 450 mg of 2CzBPhA was collected in 90% yield.

In addition, the thermophysical property of 2CzBPhA was measured using a differential scanning calorimeter (DSC, product of PerkinElmer, Inc., Pyris 1). As a result, the crystallization temperature (Tg) proved to be 102° C.

Figure 45:
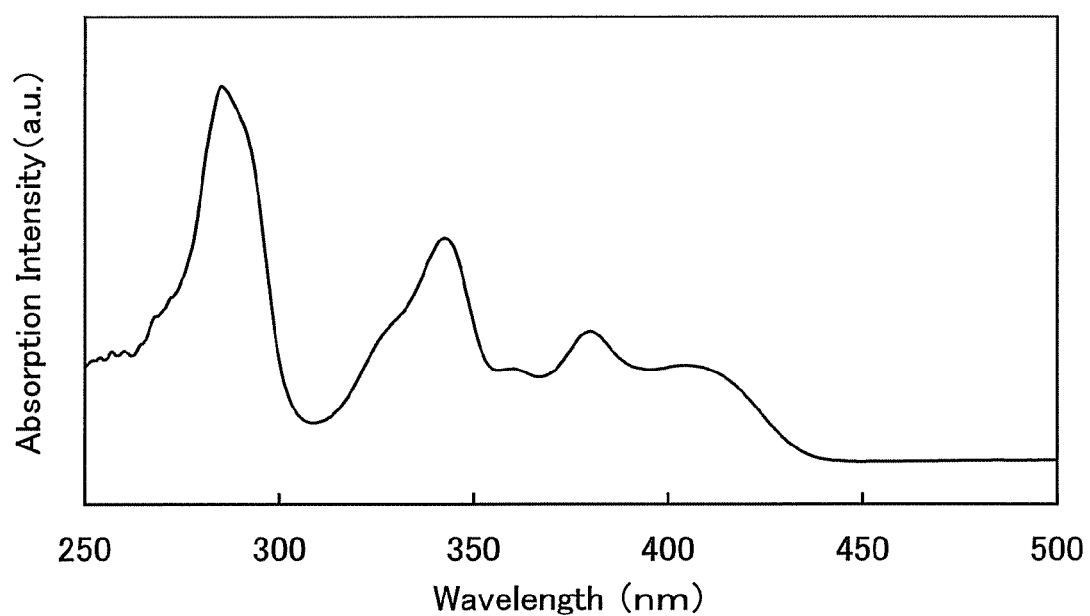
FIG. 45 shows an absorption spectrum of a toluene solution of 9-[9,10-bis(2-biphenyl)-2-anthryl]-9H-carbazole (abbreviation: 2CzBPhA).
Figure 46:
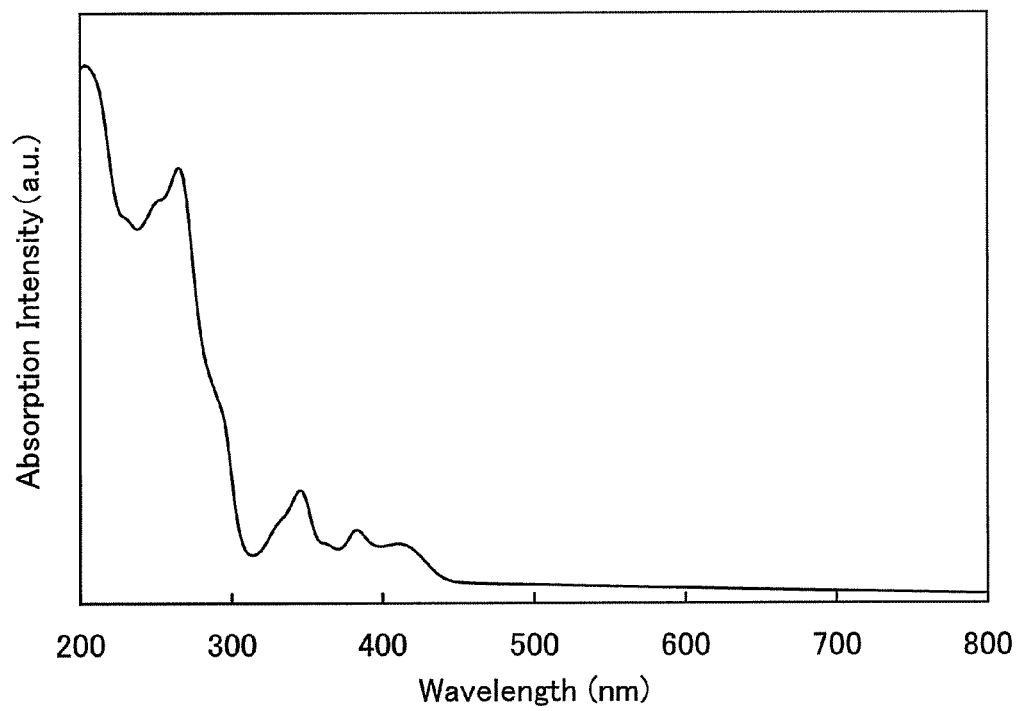
FIG. 46 shows an absorption spectrum of a thin film of 9-[9,10-bis(2-biphenyl)-2-anthryl]-9H-carbazole (abbreviation: 2CzBPhA).
Figure 47:
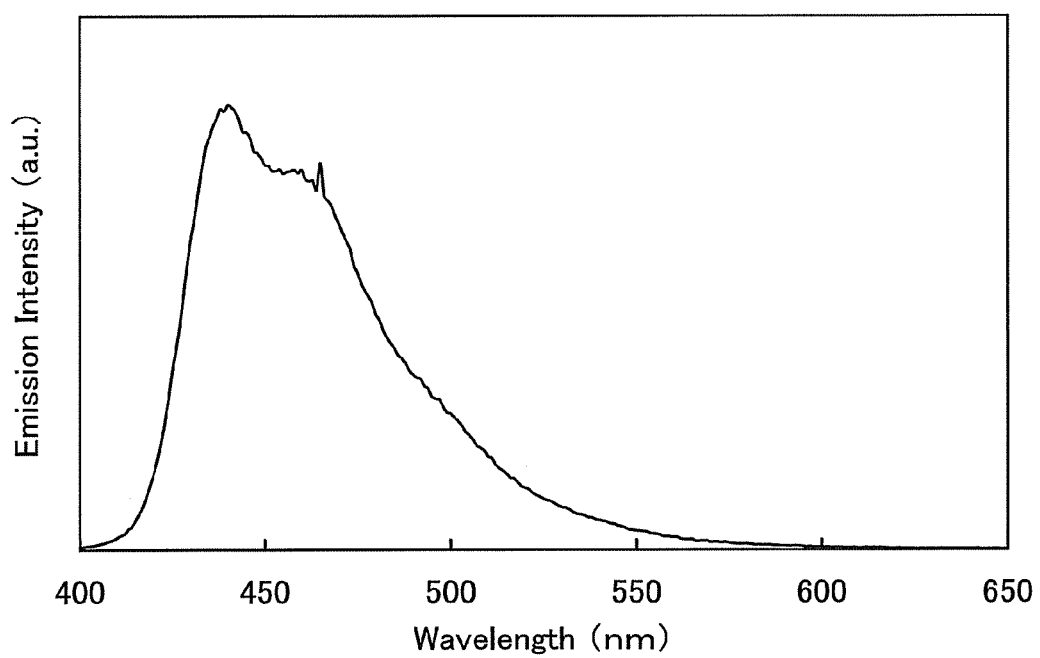
FIG. 47 shows an emission spectrum of a toluene solution of 9-[9,10-bis(2-biphenyl)-2-anthryl]-9H-carbazole (abbreviation: 2CzBPhA).
Figure 48:
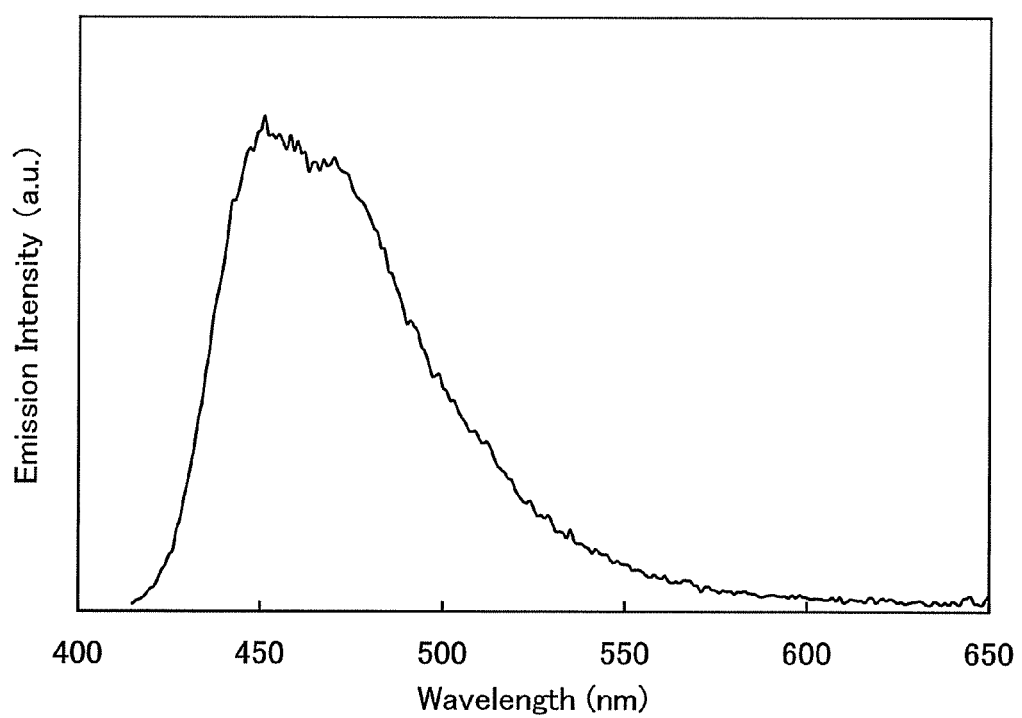
FIG. 48 shows an emission spectrum of the thin film of 9-[9,10-bis(2-biphenyl)-2-anthryl]-9H-carbazole (abbreviation: 2CzBPhA).

FIG. 45 shows an absorption spectrum of 2CzBPhA. FIG. 46 shows an absorption spectrum of a thin film of 2CzBPhA. An ultraviolet-visible spectrophotometer (V-550, manufactured by JASCO Corporation) was used for the measurement. The solution was put in a quartz cell. The thin film was formed by evaporation over a quartz substrate to form a sample. As for the spectrum of the solution, the absorption spectrum in FIG. 45 was obtained by subtracting the absorption spectrum of the quartz cell including only toluene. As for the spectrum of the thin film, the absorption spectrum in FIG. 46 was obtained by subtracting the absorption spectrum of the quartz cell. In each of FIG. 45 and FIG. 46, the horizontal axis shows wavelength (nm), and the vertical axis shows absorption intensity (given unit). In the case of the toluene solution, the absorption was observed at around 341 nm, around 379 nm, and around 406 nm. In the case of the thin film, the absorption was observed at around 411 nm. Moreover, FIG. 47 shows an emission spectrum of a toluene solution of 2CzBPhA (excitation wavelength: 330 nm). FIG. 48 shows an emission spectrum of a thin film of 2CzBPhA (excitation wavelength: 411 nm). In each of FIG. 47 and FIG. 48, the horizontal axis shows wavelength (nm), and the vertical axis shows emission intensity (given unit). In the case of the toluene solution, the maximum emission wavelengths were 441 nm and 460 nm (excitation wavelength: 330 nm), and in the case of the thin film, the maximum emission wavelength was 451 nm (excitation wavelength: 411 nm).

The measurement results on the thin film of 2CzBPhA using a photoelectron spectrometer (AC-2, product of Riken Keiki Co., Ltd.) in the atmosphere indicated that the HOMO level thereof was −5.57 eV. Moreover, the absorption edge was obtained from Tauc plot, with an assumption of direct transition, using data on the absorption spectrum of the thin film of 2CzBPhA in FIG. 46. Using the energy of that absorption edge as an optical energy gap, the energy gap of 2CzBPhA was found to be 2.82 eV. The LUMO level, which was estimated from the HOMO level and the energy gap, was −2.75 eV.

Further, the oxidation-reduction reaction characteristics of 2CzBPhA were analyzed by CV (cyclic voltammetry) measurement. Note that an electrochemical analyzer (ALS model 600A, product of BAS Inc.) was used for the measurement.

The solution used for the CV measurement was prepared in such a manner that a supporting electrolyte of tetra-n-butylammonium perchlorate (n-Bu$_4$NClO$_4$) (product of Tokyo Chemical Industry Co., Ltd., catalog number: T0836) was dissolved in a solvent, which is dehydrated dimethylformamide (DMF) (product of Sigma-Aldrich Corp., 99.8%, catalog number: 22705-6), at a concentration of 100 mmol/L and the target to be measured was further dissolved therein at a concentration of 1 mmol/L. A platinum electrode (a PTE platinum electrode, product of BAS Inc.) was used as a working electrode. A platinum electrode (a VC-3 Pt counter electrode (5 cm), product of BAS Inc.) was used as a counter electrode. An Ag/Ag$^+$ electrode (an RE5 non-aqueous solvent type reference electrode, product of BAS Inc.) was used as a reference electrode. The measurement was carried out at room temperature.

The oxidation reaction characteristic of 2CzBPhA was examined by 100 cycles of measurements; one cycle is a scan in which the potential of the working electrode with respect to the reference electrode is changed from −0.03 V to 1.20 V and then changed from 1.20 V to −0.03 V. Note that the scan speed at these CV measurements was set at 0.1 V/s.

The reduction reaction characteristic of 2CzBPhA was examined by 100 cycles of measurements; one cycle is a scan in which the potential of the working electrode with respect to the reference electrode is changed from −0.41 V to −2.30 V and then changed from −2.30 V to −0.41 V. Note that the scanning speed of the CV measurement was set at 0.1 V/s.

Figure 49:
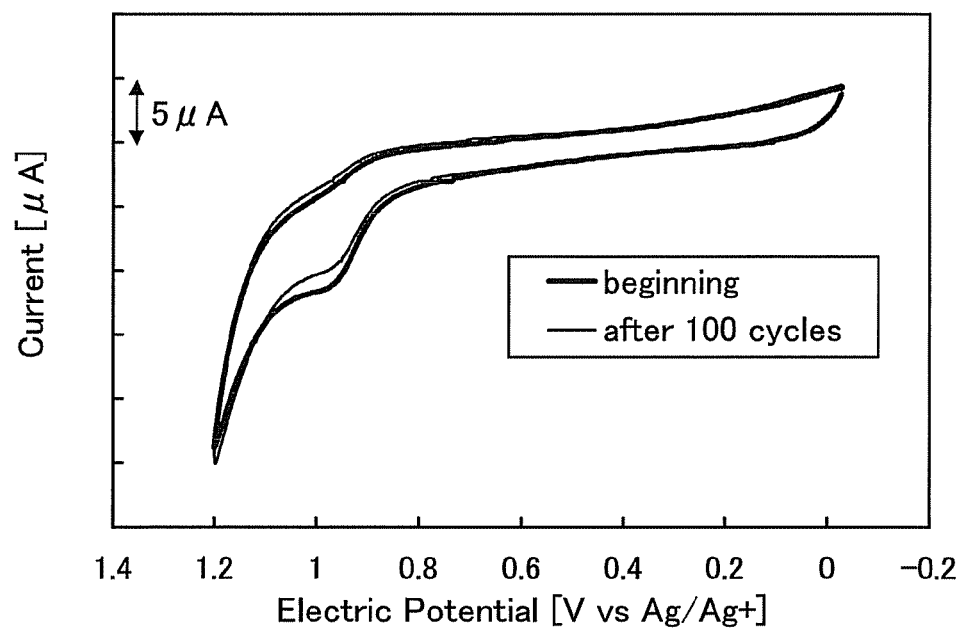
FIG. 49 shows CV measurement results of 9-[9,10-bis(2-biphenyl)-2-anthryl]-9H-carbazole (abbreviation: 2CzBPhA).
Figure 50:
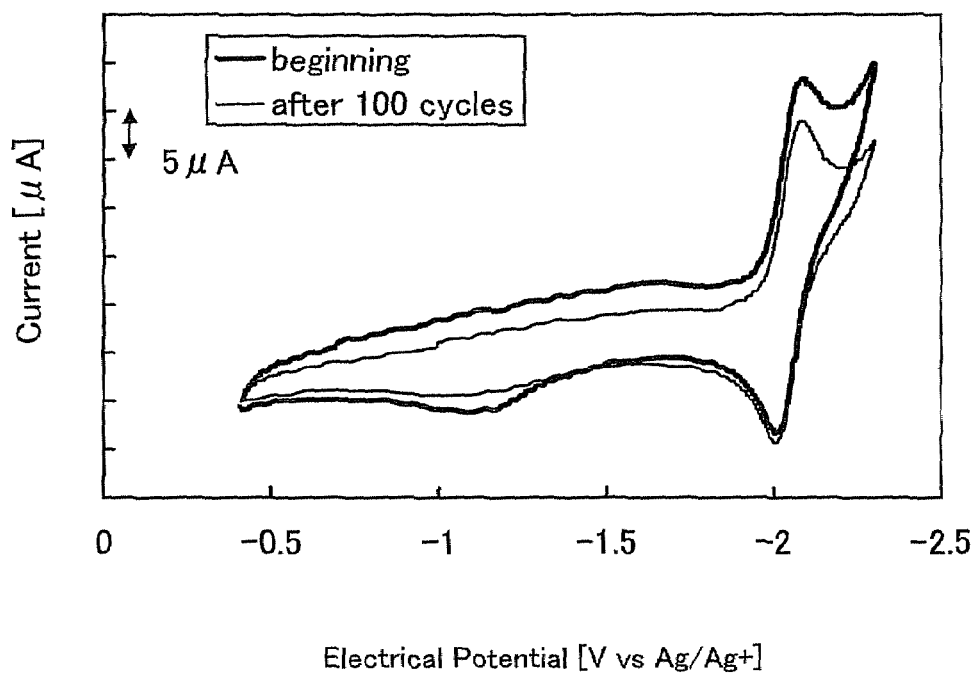
FIG. 50 shows CV measurement results of 9-[9,10-bis(2-biphenyl)-2-anthryl]-9H-carbazole (abbreviation: 2CzBPhA).

FIG. 49 shows CV measurement results on the oxidation reaction characteristic of 2CzBPhA and FIG. 50 shows CV measurement results on the reduction reaction characteristic of 2CzBPhA. In each of FIG. 49 and FIG. 50, the horizontal axis shows potential (V) of the work electrode with respect to the reference electrode, while the vertical axis shows a value (µA) of current flowing between the work electrode and the auxiliary electrode. According to FIG. 49, a current indicating oxidation was observed at around +0.96 V (vs. Ag/Ag$^+$ electrode). According to FIG. 50, a current indicating reduction was observed at around −2.08 V (vs. Ag/Ag$^+$ electrode).

This application is based on Japanese Patent Application serial no. 2008-095796 filed with Japan Patent Office on Apr. 2, 2008 and Japanese Patent Application serial no. 2008-129410 filed with Japan Patent Office on May 16, 2008, the entire contents of which are hereby incorporated by reference.

What is claimed is:

1. An anthracene derivative represented by Formula (G1),

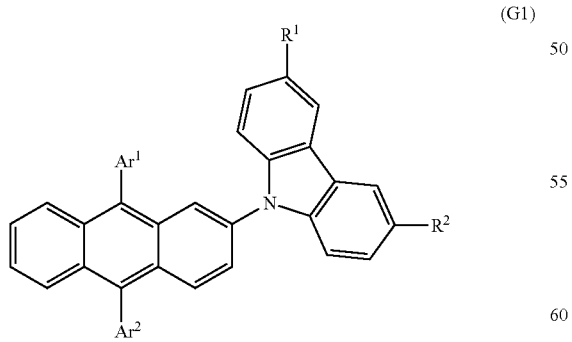

(G1)

wherein Ar$^1$ and Ar$^2$ independently represent any of substituents represented by Structure Formulae (1-1) to (1-15), and
wherein R$^1$ and R$^2$ independently represent any of substituents represented by Structure Formulae (2-1) to (2-25);

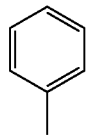

(1-1)

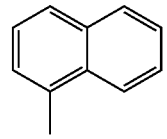

(1-2)

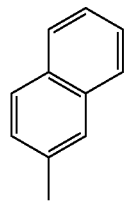

(1-3)

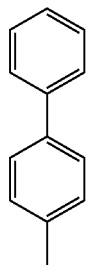

(1-4)

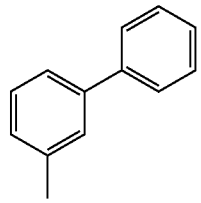

(1-5)

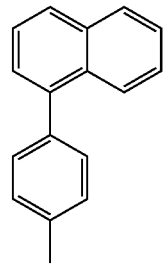

(1-6)

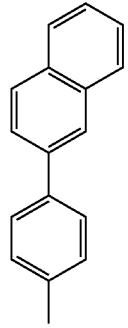

(1-7)

(1-8) 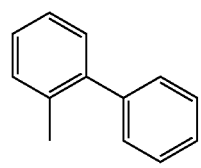
(1-9) 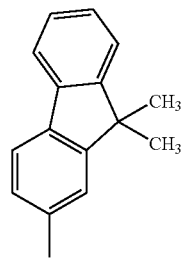
(1-10) 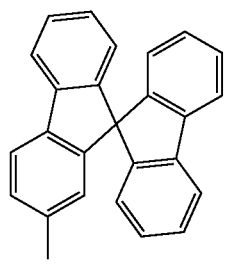
(1-11) 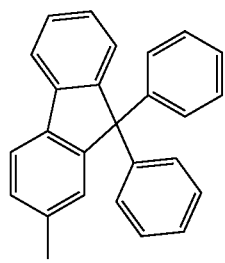
(1-12) 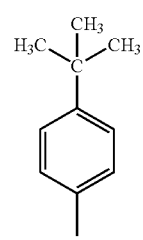
(1-13) 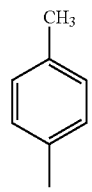
(1-14) 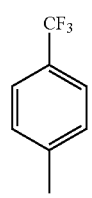
(1-15) 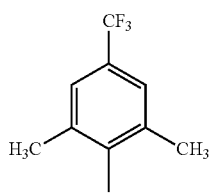
(2-1) 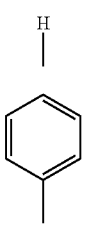
(2-2) 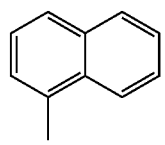
(2-3) 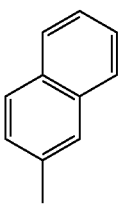
(2-4) 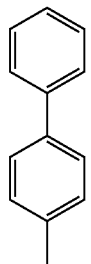
(2-5) 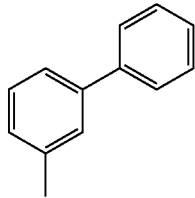
(2-6) 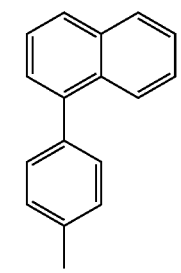
(2-7)

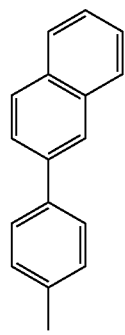 (2-8)
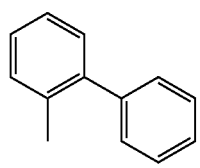 (2-9)
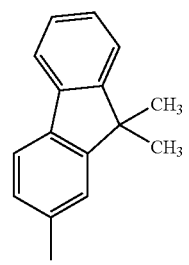 (2-10)
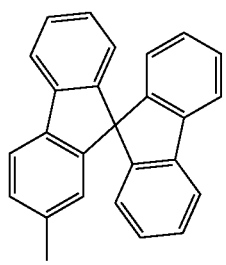 (2-11)
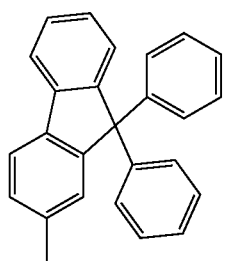 (2-12)
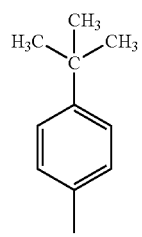 (2-13)
 (2-14)
 (2-15)
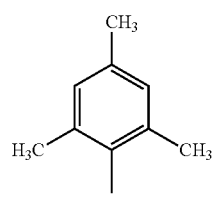 (2-16)
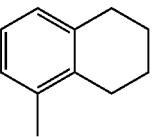 (2-17)
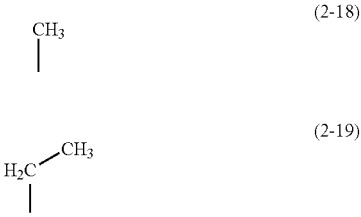 (2-18)
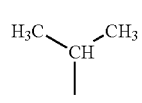 (2-19)
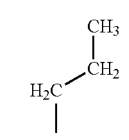 (2-20)
(2-21)

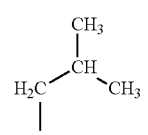 (2-22)

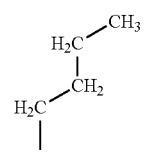 (2-23)

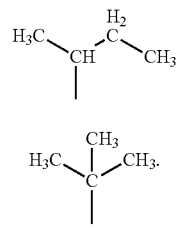 (2-24)

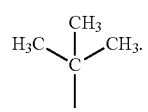 (2-25)

2. The anthracene derivative according to claim 1, wherein either $Ar^1$ or $Ar^2$ has a substituent.

3. The anthracene derivative according to claim 2, wherein $Ar^1$ or $Ar^2$ is bonded to the substituent to form a ring.

4. An light-emitting device comprising the anthracene derivative according to claim 1.

5. An electronic appliance comprising the anthracene derivative according to claim 1.

6. A lighting apparatus comprising the anthracene derivative according to claim 1.

7. An anthracene derivative represented by Structure Formula (1) or Structure Formula (6).

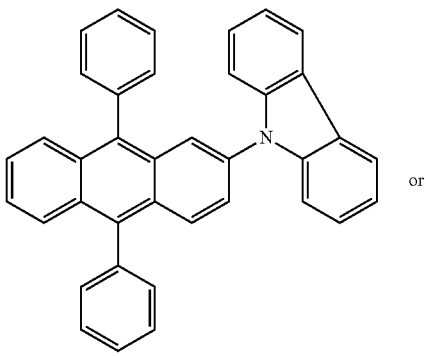 (1) or

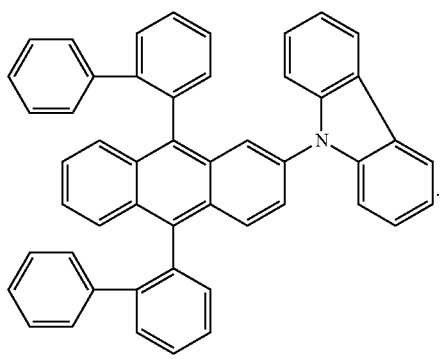 (6)

8. A light-emitting device comprising the anthracene derivative according to claim 7.

9. An electronic appliance comprising the anthracene derivative according to claim 7.

10. A lighting apparatus comprising the anthracene derivative according to claim 7.

* * * * *

UNITED STATES PATENT AND TRADEMARK OFFICE
CERTIFICATE OF CORRECTION

PATENT NO.         : 8,722,904 B2
APPLICATION NO.    : 12/414801
DATED              : May 13, 2014
INVENTOR(S)        : Sachiko Kawakami et al.

It is certified that error appears in the above-identified patent and that said Letters Patent is hereby corrected as shown below:

In the Specification:

Column 33, Line 29; Change "Get)" to --(jet)--.

Column 36, Line 15; Change "CZPA" to --CzPA--.

Column 36, Line 48; Change "phenyl-N-phenylamino" to --phenyl-$N'$-phenylamino--.

Column 36, Line 50; Change ")-N,N-bis(phenyl)benzidine" to --)-N,$N'$-bis(phenyl)benzidine--.

Column 56, Line 10; Change "CZPA)" to --CzPA)--.

Column 56, Line 13; Change "CZPA" to --CzPA--.

Column 57, Line 6; Change "(Iv)" to --(iv)--.

Column 57, Line 40; Change "(Iv)" to --(iv)--.

Column 57, Line 42; Change "CZPA" to --CzPA--.

Column 62, Line 26; Change "μm" to --nm--.

In the Claims:

Column 71, Line 39, Claim 7; Change "Structure Formula (6)." to --Structure Formula (6);--.

Signed and Sealed this
Ninth Day of September, 2014

Michelle K. Lee
*Deputy Director of the United States Patent and Trademark Office*